(12) United States Patent
Wu et al.

(10) Patent No.: US 12,300,699 B2
(45) Date of Patent: May 13, 2025

(54) INTEGRATED CIRCUIT

(71) Applicant: TAIWAN SEMICONDUCTOR MANUFACTURING CO., LTD., Hsinchu (TW)

(72) Inventors: Guo-Huei Wu, Tainan (TW); Chi-Yu Lu, New Taipei (TW); Ting-Yu Chen, Hsinchu (TW); Li-Chun Tien, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 184 days.

(21) Appl. No.: 17/875,257

(22) Filed: Jul. 27, 2022

(65) Prior Publication Data

US 2022/0367519 A1    Nov. 17, 2022

Related U.S. Application Data

(62) Division of application No. 17/025,983, filed on Sep. 18, 2020, now Pat. No. 11,710,743.

(51) Int. Cl.
*H01L 27/118*    (2006.01)
*H01L 27/02*    (2006.01)

(52) U.S. Cl.
CPC .... *H01L 27/11807* (2013.01); *H01L 27/0207* (2013.01); *H01L 2027/11812* (2013.01); *H01L 2027/11861* (2013.01); *H01L 2027/11866* (2013.01); *H01L 2027/11875* (2013.01); *H01L 2027/11881* (2013.01); *H01L 2027/11887* (2013.01)

(58) Field of Classification Search
CPC . H01L 2027/11848; H01L 2027/11829; H01L 2027/11831; H01L 27/0207; H01L 27/11807
See application file for complete search history.

(56) References Cited

U.S. PATENT DOCUMENTS 7,679,106 B2 *   3/2010   Hamada ............. H01L 27/0207
                                                    257/210
7,808,017 B2 *  10/2010   Hamada ............. H01L 27/0207
                                                    257/210
(Continued)

FOREIGN PATENT DOCUMENTS

DE    10 2016 103 820 A1    9/2016
DE    10 2018 123 548 A1    3/2019
(Continued)

*Primary Examiner* — Mounir S Amer
*Assistant Examiner* — Alexander Belousov
(74) *Attorney, Agent, or Firm* — Maschoff Brennan

(57) ABSTRACT

A method is provided, and including operations as below: forming multiple active areas extending in a first direction; forming multiple conductive patterns extending in a second direction different from the first direction and arranged in a first layer above the active areas; forming multiple gates extending parallel to the conductive patterns; and forming a first set of conductive lines extending in the first direction and arranged in three first metal tracks that are in a second layer above the first layer, wherein one of the first set of conductive lines is arranged in a middle track of the three first metal tracks, coupled to one of the gates and overlap a first shallow trench region between two of the active areas.

20 Claims, 29 Drawing Sheets

(56) References Cited

U.S. PATENT DOCUMENTS

| | | | |
|---|---|---|---|
| 2008/0283871 A1* | 11/2008 | Hamada | H01L 27/0207 |
| | | | 257/202 |
| 2010/0133625 A1* | 6/2010 | Hamada | H01L 27/092 |
| | | | 257/369 |
| 2011/0049575 A1 | 3/2011 | Tanaka | |
| 2013/0207199 A1 | 8/2013 | Becker et al. | |
| 2015/0347659 A1 | 12/2015 | Chiang et al. | |
| 2016/0268243 A1 | 9/2016 | Lee et al. | |
| 2017/0317100 A1 | 11/2017 | Kang et al. | |
| 2017/0346490 A1* | 11/2017 | Sue | H01L 29/0649 |
| 2018/0342462 A1* | 11/2018 | Kuchanuri | G06F 30/398 |
| 2019/0051542 A1 | 2/2019 | Liu et al. | |
| 2019/0096811 A1* | 3/2019 | Wang | G06F 30/39 |
| 2019/0155984 A1 | 5/2019 | Chen et al. | |
| 2023/0060387 A1* | 3/2023 | Wang | G06F 30/392 |

FOREIGN PATENT DOCUMENTS

| | | |
|---|---|---|
| KR | 20150136568 A | 12/2015 |
| KR | 20180128803 A | 12/2018 |

* cited by examiner

100

INTEGRATED CIRCUIT

CROSS REFERENCE

The present application is a divisional application of U.S. application Ser. No. 17/025,983, filed Sep. 18, 2020, the full disclosures of which are incorporated herein by reference.

BACKGROUND

Integrated circuits have been widely used for various kinds of application, and obtaining faster processing speed and lower power consumption within limited area is demanded. Thus, optimization metal routing of the integrated circuit layout design, is achieved by several approaches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
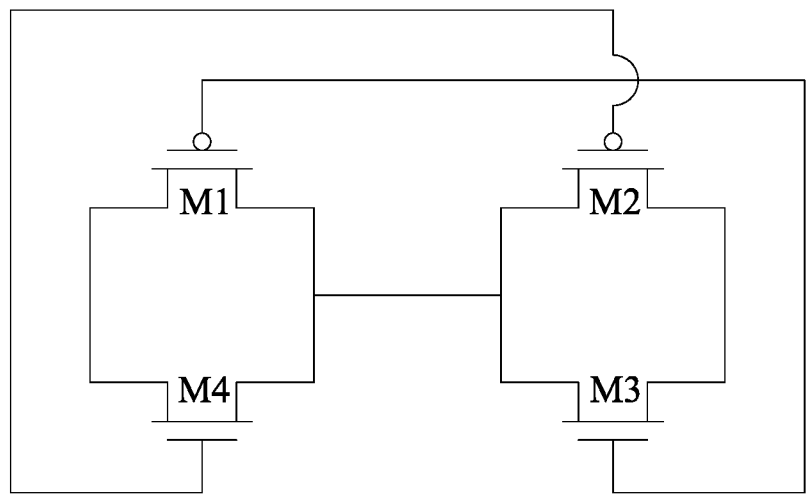
FIG. 1 is an equivalent circuit of part of an integrated circuit, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is an equivalent circuit of part of an integrated circuit 100, in accordance with various embodiments. For illustration, the integrated circuit 100 includes transistors M1-M4. A gate of the transistor M1 is coupled to a gate of the transistor M3. A gate of the transistor M2 is coupled to a gate of the transistor M4. A drain/source of the transistor M1 is coupled to a drain/source of the transistor M4. A source/drain of the transistor M1 is coupled to a drain/source of the transistor M2, a source/drain of the transistor M3, a source/drain of the transistor M4. A source/drain of the transistor M2 is coupled to a drain/source of the transistor M3. In some embodiments, the integrated circuit 100 is a transmission gate circuit. The above implementation of the integrated circuit 100 is given for illustrative purposes. Various implementations of the integrated circuit 100 are within the contemplated scope of the present disclosure. For example, in some embodiments, the integrated circuit 100 is a logic gate circuit including AND, OR, NAND, MUX, Flip-flop, Latch, BUFF, inverter, or any other types of logic circuit.

In some embodiments, the transistors M1-M2 are of a first conductivity type FET (e.g., P-type), and the transistors M3-M4 are of a second conductivity type FET (e.g., N-type) different from the first conductivity type. The above implementation of the integrated circuit 100 is given for illustrative purposes. Various implementations of the integrated circuit 100 are within the contemplated scope of the present disclosure. For example, the transistors M1-M2 are of the second conductivity type, and the transistors M3-M4 are of the first conductivity type.

Reference is now made to FIG. 2. FIG. 2A is a layout diagram in a plan view of part of the integrated circuit 100 corresponding to part of FIG. 1, in accordance with various embodiments. For illustration, the integrated circuit 100 includes active areas 110-120, conductive patterns (i.e., metal-like defined MD) 201-209, gates 301-306, conductive lines (i.e., metal-zero M0) 401-402, 403a-403b, 404a-404b, 405a-405b, conductive segments (i.e., metal-one MD 501-504, conductive traces (i.e., metal-one M2) 601-602, and vias VD1-VD8, VG1-VG6, VM1-VM4, and VN1-VN4. In some embodiments, the active areas 110-120 are arranged in a first layer. The conductive patterns 201-205 and the gates 301-304 and are arranged over the active areas 110. The conductive patterns 203, 206-207, and 208-209 and the gates 302-303, 305-306, are arranged over the active areas 120. The conductive lines 401-402, 403a-403b, 404a-404b, 405a-405b are arranged in a second layer above the conductive patterns 201-209 and the gates 301-306. The conductive segments 501-504 are arranged in a third layer above the second layer. The conductive traces 601-602 are arranged in a fourth layer above the third layer.

Figure 2A:
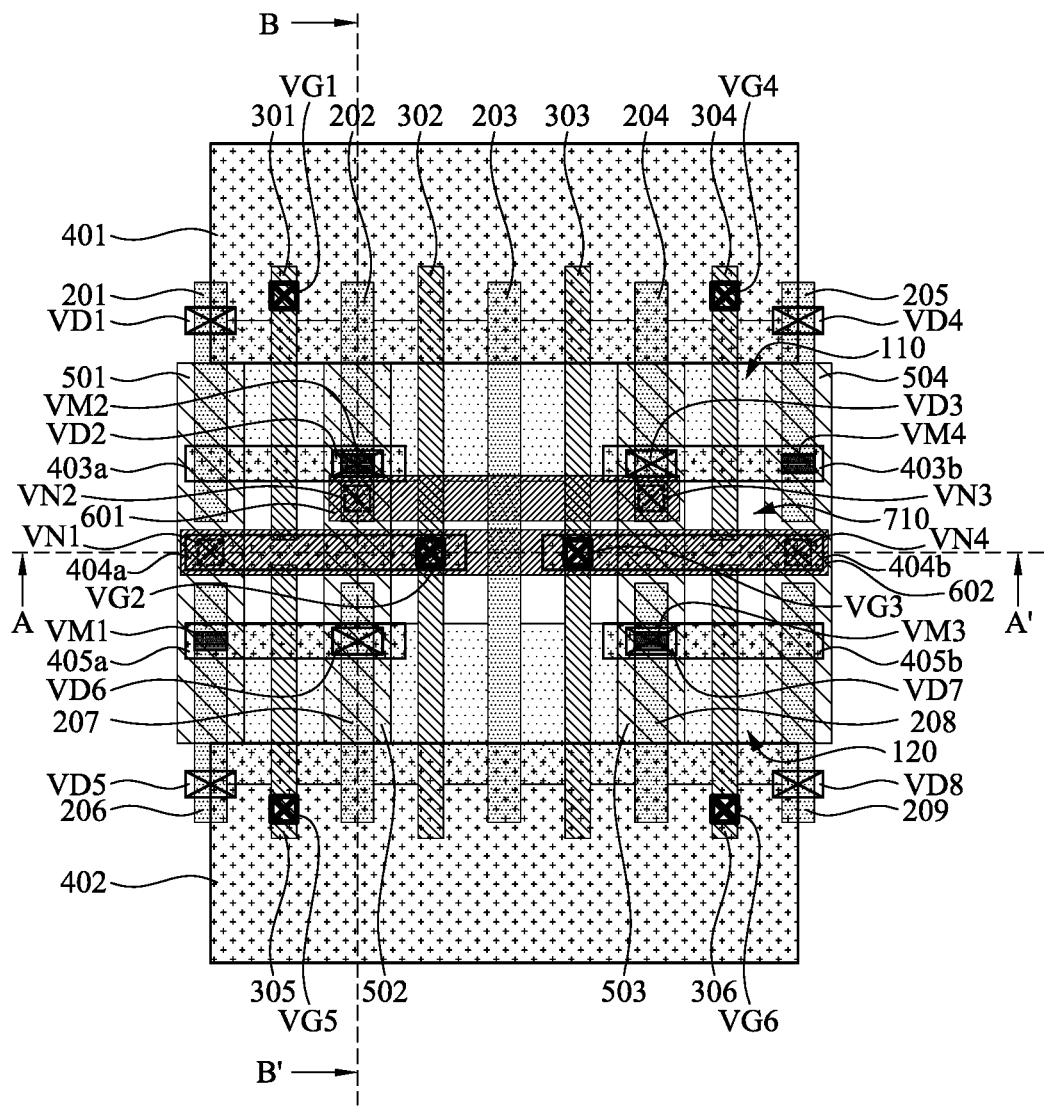
FIG. 2A is a layout diagram in a plan view of part of the integrated circuit corresponding to part of FIG. 1, in accordance with various embodiments.
Figure 2A:
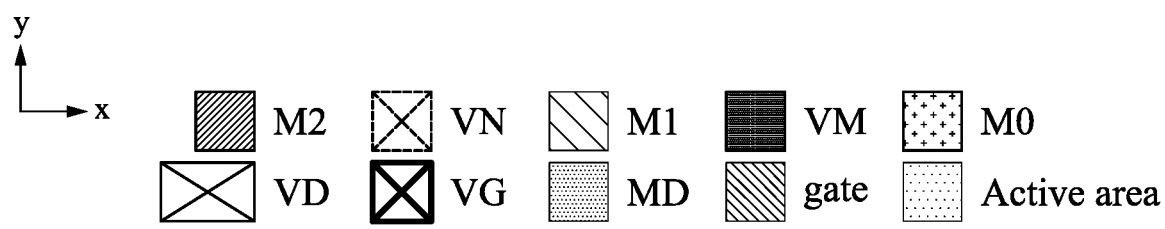

With reference to FIGS. 1 and 2A, the active area 110 is configured for the formation of the transistors M1-M2, and the active area 120 is configured for the formation of the transistors M3-M4. The conductive pattern 202 corresponds to the drain/source of the transistor M1. The conductive pattern 203 corresponds to the sources/drains of the transistors M1, M3 and M4, and the drain/source of the transistor M2. The conductive pattern 204 corresponds to the source/drain of the transistor M2. The conductive pattern 207 corresponds to the drain/source of the transistor M3. The conductive pattern 208 corresponds to the drain/source of the transistor M4. In some embodiments, the conductive patterns 201, 205, 206, and 209 are referred to as metal routing structures of the integrated circuit 100. The gate 302 corresponds to the gates of the transistors M1 and M3. The gate 303 corresponds to the gates of the transistors M2 and M4. Alternatively stated, the gate 302 is shared by the transistors M1 and M3, and the gate 303 is shared by the transistors M2 and M4. The gates 301, 304, 305, and 306 are referred as dummy gates, in which in some embodiments, the "dummy" gate is referred to as being not electrically connected as the gate for MOS device, having no function in the circuit. In some various embodiments, the gates 301, 304, 305, and 306 are included in transistors operating as switch to input supply voltages to the integrated circuit 100.

As shown in FIG. 2A, for illustration, the active areas 110-120 extend in x direction and are separate from each other in y direction different from x direction. In some embodiments, the active areas 110-120 are disposed on a substrate (not shown). The substrate includes materials including, for example, silicon and/or is doped with phosphorus, arsenic, germanium, gallium, Indium arsenide or a combination thereof. In various embodiments, the active area 110 is doped with p-type dopants including, such as boron, indium, aluminum, gallium, or a combination thereof, and the active area 120 is doped with n-type dopants, including, such as phosphorus, arsenic, or a combination thereof.

The conductive patterns 201-209 extend in y direction and are separate from each other in x direction. For illustration, in y direction, the conductive patterns 201 and 206 are separate from each other, the conductive patterns 202 and 207 are separate from each other, the conductive patterns 204 and 208 are separate from each other, and the conductive patterns 205 and 209 are separate from each other.

The gates 301-306 extend in y direction and are separate from each other in x direction. For illustration, in y direction, the gates 301 and 305 are separate from each other, and the gates 304 and 306 are separate from each other. The gates 302-303 are arranged at the opposite sides of the conductive pattern 203. The gates 301-306 are made of polysilicon in some embodiments, and accordingly, the gates 301-306 are also referred to as a Poly portion in some embodiments. The gates 301-306 are made of other material in some other embodiments, and thus the above material for the gates 301-306 are given for illustrative purposes only.

The conductive lines 401-402, 403a-403b, 404a-404b, 405a-405b extend in x direction and are separate from each other in y direction. For illustration, in a layout view, the conductive line 401 overlaps the active area 110, the conductive patterns 201-205, and the gates 301-304, and the conductive line 402 overlaps the active area 120, the conductive patterns 206-207, 203, and 208-209, and the gates 302-303, and 305-306. The conductive lines 403a-403b, 404a-404b, 405a-405b are arranged between the conductive lines 401-402. The conductive line 403a crosses the conductive patterns 201-202 and the gate 301. The conductive line 403b crosses the conductive patterns 204-205 and the gate 304. The conductive line 404a crosses the gate 302, and the conductive line 404b crosses the gate 303. The conductive line 405a crosses the conductive patterns 206-207 and the gate 305. The conductive line 405b crosses the conductive patterns 208-209 and the gate 306. Alternatively stated, the conductive lines 403a-403b, 404a-404b, 405a-405b are arranged in three tracks between the conductive lines 401-402.

In some embodiments, the spaces between the conductive lines 403a and 403b, the conductive lines 404a and 404b, or the conductive lines 405a and 405b are provided by implementing a cut layer (not shown) for smaller widths of the spaces, compared with widths of the spaces provided without additional cut layer. Alternatively stated, in various embodiments, the conductive lines 403a and 403b, the conductive lines 404a and 404b, or the conductive lines 405a and 405b are formed without using a pattern mask.

For illustration, the conductive segments 501-504 extend in y direction and are separate from each other in x direction. The conductive segment 501 overlaps the conductive patterns 201 and 206, and crossed the conductive lines 403a, 404a, and 405a. The conductive segment 502 overlaps the conductive patterns 202 and 207, and crosses the conductive lines 403a, 404a, and 405a. The conductive segment 503 overlaps the conductive patterns 204 and 208, and crossed the conductive lines 403b, 404b, and 405b. The conductive segment 504 overlaps the conductive patterns 205 and 209, and crossed the conductive lines 403b, 404b, and 405b.

The conductive traces 601-602 extend in x direction and are separate from each other in x direction. As shown in FIG. 2A, the conductive trace 601 crosses the conductive segments 502 and 503, and the conductive trace 602 crosses the conductive segments 501-504. In some embodiments, the conductive trace 602 overlaps the conductive lines 404a-404b.

As shown in FIG. 2A, the vias VD1 and VD4 couple the conductive patterns 201 and 205 to the conductive line 401. In some embodiments, the conductive line 401 outputs a supply voltage VDD to the conductive patterns 201 and 205. The vias VD5 and VD8 couple the conductive patterns 206 and 209 to the conductive line 402. In some embodiments, the conductive line 402 receives a supply voltage VSS, in which in some embodiments the supply voltage VSS is smaller than the supply voltage VDD, for the conductive patterns 206 and 209.

Moreover, the structures illustrated in FIG. 2A are configured to be included in a first cell. In some embodiments, the conductive lines 401-402 of FIG. 2A are shared by adjacent two cells, for example, the first cell and a second cell, of the integrated circuit 100 to output and/or receive the supply voltages, in which the conductive lines 401-402 are referred as, for example, a power-in-bound structure. The details of the power-in-bound structure are discussed in the following paragraphs.

With continued reference to FIG. 2A, the via VD2 couples the conductive pattern 202 to the conductive line 403a, and the via VM2 couples the conductive line 403a to the conductive segment 502. The via VN2 couples the conductive segment 502 to the conductive trace 601. The via VN3 couples the conductive trace 601 to the conductive segment 503. The via VM3 couples the conductive segment 503 to the conductive line 405b. The via VD7 couples the conductive line 405b to the conductive pattern 208. Accordingly, through the discussions as above, the conductive pattern 202, referred as the drain/source of the transistor M1, is coupled to the conductive pattern 208, referred as the drain/source of the transistor M4.

Similarly, the via VD3 couples the conductive pattern 204 to the conductive line 403b, and the via VM4 couples the conductive line 403b to the conductive segment 504. The via VN4 couples the conductive segment 504 to the conductive trace 602. The via VN1 couples the conductive trace 602 to the conductive segment 501. The via VM1 couples the conductive segment 501 to the conductive line 405a. The via VD6 couples the conductive line 405a to the conductive pattern 207. Accordingly, through the discussions as above, the conductive pattern 204, referred as the source/drain of the transistor M2, is coupled to the conductive pattern 207, referred as the drain/source of the transistor M3.

For illustration, the vias VG1 and VG4 couple the gates 301 and 304 to the conductive line 401, and the vias VG5 and VG6 couple the gates 305 and 306 to the conductive line 402. The via VG2 couples the gate 302 to the conductive line 404a, and the via VG3 couples the gate 303 to the conductive line 404b. In some embodiments, the conductive lines 404a-404b are further coupled to some signals for operating the transistors M1-M4 through the gates 302-303.

As shown in FIG. 2A, the integrated circuit 100 further includes a shallow trench isolation (STI) region 710 between the active areas 110-120. For illustration, the shallow trench isolation region extends in x direction. With such embodiments, the vias VG2-VG3 are arranged overlapped the STI 710 in the layout view.

In some approaches, between power rails (i.e., the conductive lines 401-402) at least four tracks of conductive lines, corresponding to the conductive lines 403a-403b, 404a-404b, and 405a-405b, are implemented for the metal routing of the integrated circuit 100. Compared with some approaches, with the configurations of FIG. 2A, three tracks of conductive lines in the layout view, for example, the conductive lines 403a-403b, 404a-404b, and 405a-405b, are sufficient to implement the integrated circuit 100.

Figure 2B:
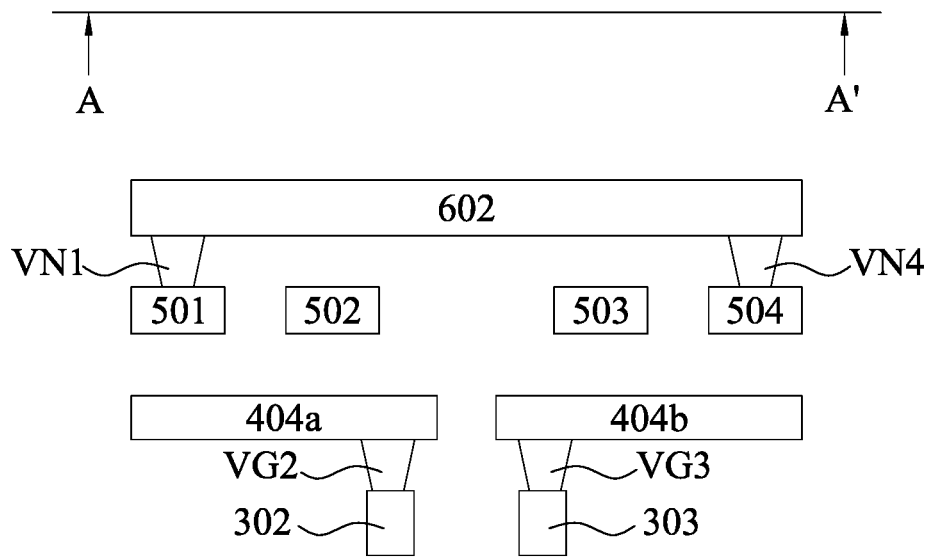
FIGS. 2B-2C are cross-sectional diagrams of the integrated circuit corresponding to part of FIG. 2A, in accordance with various embodiments.

Reference is now to FIG. 2B. FIG. 2B is cross-sectional diagram of the integrated circuit 100 corresponding to part of FIG. 2A along line AA', in accordance with various embodiments. As shown in FIG. 2B, the conductive lines 404a-404b are arranged in the layer above the gates 302-303 and coupled to the gate 302-303 through the vias VG2-VG3. The conductive segments 501-504 are arranged in the layer above the conductive lines 404a-404b. The conductive trace 602 is arranged above the conductive segments 501-504 and coupled to the conductive segments 501 and 504 through the vias VN1 and VN4.

Figure 2C:
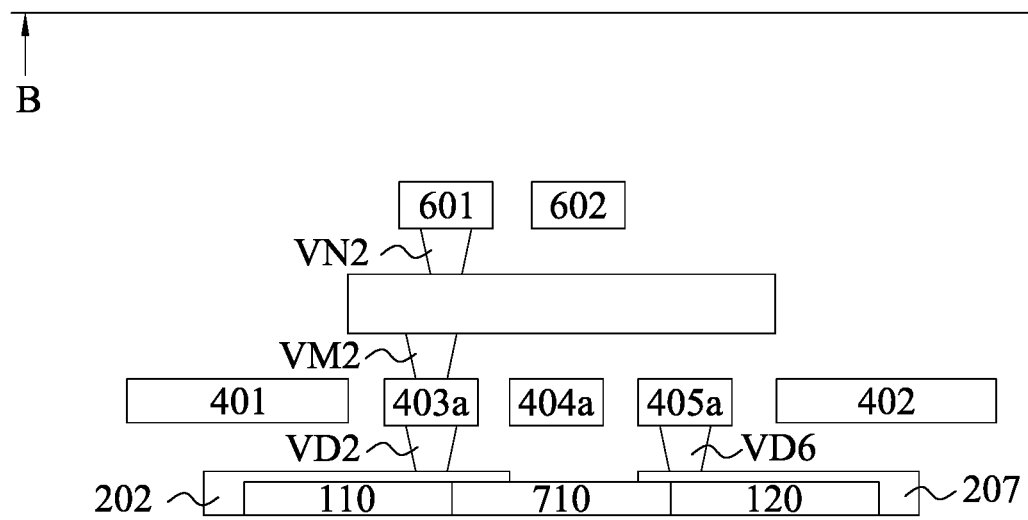

Reference is now to FIG. 2C. FIG. 2C is cross-sectional diagram of the integrated circuit 100 corresponding to part of FIG. 2A along line BB', in accordance with various embodiments. As shown in FIG. 2C, the STI 710 is interposed between the active areas 110-120. The conductive patterns 202 and 207 overlap the active areas 110-120 respectively. The conductive lines 401-402, 403a, 404a, and 405a are arranged in the layer above the conductive patterns 202 and 207, the active areas 110-120, and the STI 710. The conductive lines 403a and 405a are coupled to the conductive patterns 202 and 207 through the vias VD2 and VD6 respectively. The conductive segment 502 is arranged in the layer above the conductive lines 401-402, 403a, 404a, and 405a and coupled to the conductive line 403a through the via VM2. The conductive traces 601-602 are arranged above the conductive segment 502 and coupled to the conductive segment 502 through the via VN2.

The configurations of FIGS. 2A-2C are given for illustrative purposes. Various implementations of FIGS. 2A-2C are within the contemplated scope of the present disclosure. For example, in some embodiments, the integrated circuit 100 includes more than one transistor to implement the transistors M1, M2, M3, or M4, and further includes corresponding structures. In various embodiments, the vias VG1 and VG4 are arranged overlapped the active area 110, and the vias VG5 and VG6 are arranged overlapped the active area 120.

Figure 3:
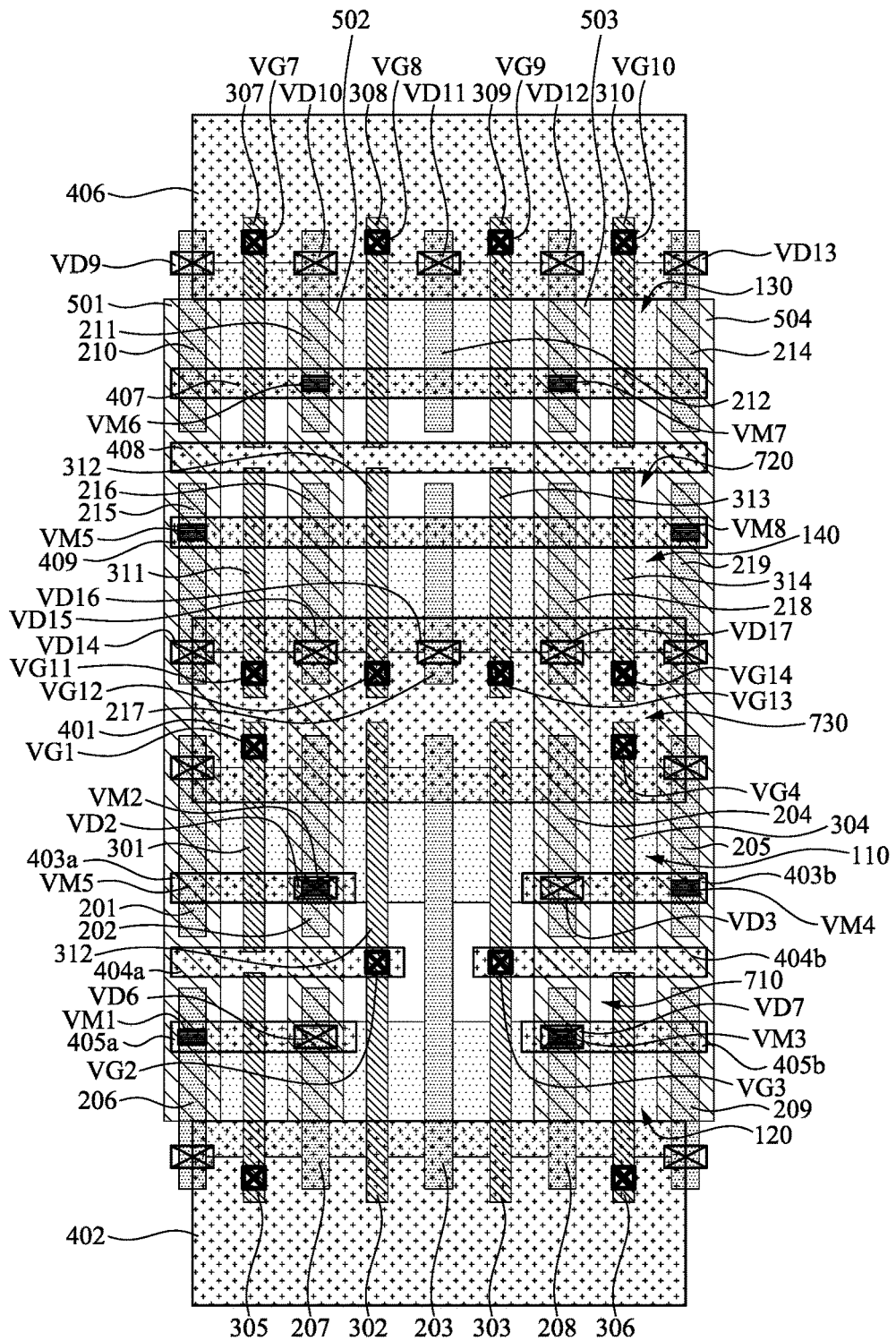
FIG. 3 is an another layout diagram in the plan view of part of the integrated circuit corresponding to part of FIG. 1, in accordance with various embodiments.

Reference is now made to FIG. 3. FIG. 3 is an another layout diagram in the plan view of part of the integrated circuit 100 corresponding to part of FIG. 1, in accordance with various embodiments. With respect to the embodiments of FIG. 2A, like elements in FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3.

Compared with the embodiments of FIG. 2A, instead of coupling the conductive pattern 202 to the conductive pattern 208 through the conductive trace 601 and coupling the conductive pattern 204 to the conductive pattern 207 through the conductive trace 602, the integrated circuit 100 of FIG. 3 further includes a second cell having corresponding structures referred as metal routing between the conductive patterns 202, 204, 207-208. In some embodiments, the first and second cells are referred to as the first and second regions. Specifically, rather than having the conductive traces 601-602 and the vias VN1-VN4, the integrated circuit 100 further includes active areas 130-140, conductive patterns 210-219, gates 307-314, conductive lines 406-409, and vias VD9-VD18, VG7-VG14, VM5-VM8 in the second cell. In some embodiments, the active areas 130 and 140 are configured with respect to the active areas 120 and 110 respectively. The conductive patterns 210-214 are configured with respect to, for example, the conductive pattern 206, and the conductive patterns 215-219 are configured with respect to, for example, the conductive pattern 201. The gates 307-310 are configured with respect to, for example, the gate 305, and the gates 311-314 are configured with respect to, for example, the gate 301. The conductive line 406 is configured with respect to, for example, the conductive line 402, and the conductive lines 407-409 are configured with respect to, for example, the conductive lines 403a-403b, 404a-404b, and/or 405a-405b. The vias VD9-VD18 are configured with respect to, for example, the via VD1. The vias VG7-VG14 are configured with respect to, for example, the via VG1. The vias VM5-VM8 are configured with respect to, for example, the via VM1.

For illustration, the active areas 130-140 extend in x direction and are separate from each other in y direction. In some embodiments, the active area 130 is doped with n-type dopants, and the active area 140 is doped with p-type dopants.

The conductive patterns 210-219 extend in y direction and are separate from each other in both x and y directions. The conductive patterns 210-214 cross the active area 130, and the conductive patterns 215-219 cross the active area 140. In some embodiments, as shown in FIG. 3, the conductive patterns 210-219 align with the conductive patterns 201-209 separately.

The gates 307-314 extend in y direction and are separate from each other in both x and y directions. The gate 307-310 cross the active area 130, and the gate 311-314 cross the active area 140. In some embodiments, as shown in FIG. 3, the gates 307-314 align with the gates 310-306 separately.

The conductive lines 406-409 extend in x direction and are separate from each other in y direction. For illustration, the conductive lines 407-409 are arranged between the conductive lines 401 and 406. The conductive line 407 crosses the conductive patterns 210-214 and the gates 307-310. The conductive line 408 overlaps the gates 307-314. The conductive line 409 crosses the conductive patterns 215-219 and the gates 311-314. Alternatively stated, the conductive lines 407-409 are arranged in three tracks between the conductive lines 401 and 406.

Moreover, compared with the configurations of FIG. 2A, the conductive segments 501-504 extend in y direction from the first cell to the second cell. Specifically, the conductive segments 501-504 further cross the active areas 130-140, and the conductive lines 401, 407-409. For illustration, the conductive segment 501 further overlaps the conductive patterns 210 and 215, the conductive segment 502 further overlaps the conductive patterns 211 and 216, the conductive segment 503 further overlaps the conductive patterns 213 and 218, and the conductive segment 504 further overlaps the conductive patterns 214 and 219.

The via VD9-VD13 couple the conductive patterns 210-214 to the conductive line 406. In some embodiments, the conductive line 406 receives the supply voltage VSS for the conductive patterns 210-214. The via VD14-VD18 couple the conductive patterns 215-219 to the conductive line 401. In some embodiments, the conductive line 401 outputs the supply voltage VDD to the conductive patterns 215-219.

In some embodiments, the vias VG7-VG10 couple the gates 307-310 to the conductive line 406. The via VG11-VG14 couple the gates 311-314 to the conductive line 401.

The integrated circuit 100 further includes shallow trench isolation regions 720-730. In some embodiments, the STIs 720-730 are configured with respect to, for example, the STI 710. The STI 720 is arranged between the active areas 130 and 140, and the STI 730 is arranged between the active areas 110 and 140. With such embodiments, the vias VG11-VG14 are arranged overlapped the STI 730 in the layout view.

For illustration, the conductive segments 502 and 503 further couple to the conductive line 407 through the vias VM6 and VM7 respectively. In such arrangements, the conductive pattern 202 is coupled to the conductive line 408 through the via VD2, the conductive line 403a, the via VM2, the conductive segment 502, the via VM6, the conductive line 407, the via VM7, the conductive segment 503, the via VM3, the conductive line 405b, and the via VD7.

Similarly, the conductive segments 501 and 504 further couple to the conductive line 409 through the vias VM5 and VM8 respectively. In such arrangements, the conductive pattern 204 is coupled to the conductive line 407 through the via VD3, the conductive line 403b, the via VM4, the conductive segment 504, the via VM9, the conductive line 409, the via VM5, the conductive segment 501, the via VM1, the conductive line 405a, and the via VD6.

Compared with the configurations of FIG. 2A, the embodiments of FIG. 3 further save the routing resources of metal layers in the third layer by not implementing the conductive traces 601-602.

The configurations of FIG. 3 are given for illustrative purposes. Various implementations of FIG. 3 are within the contemplated scope of the present disclosure. For example, in some embodiments, the conductive line 408 is not included.

Figure 4:
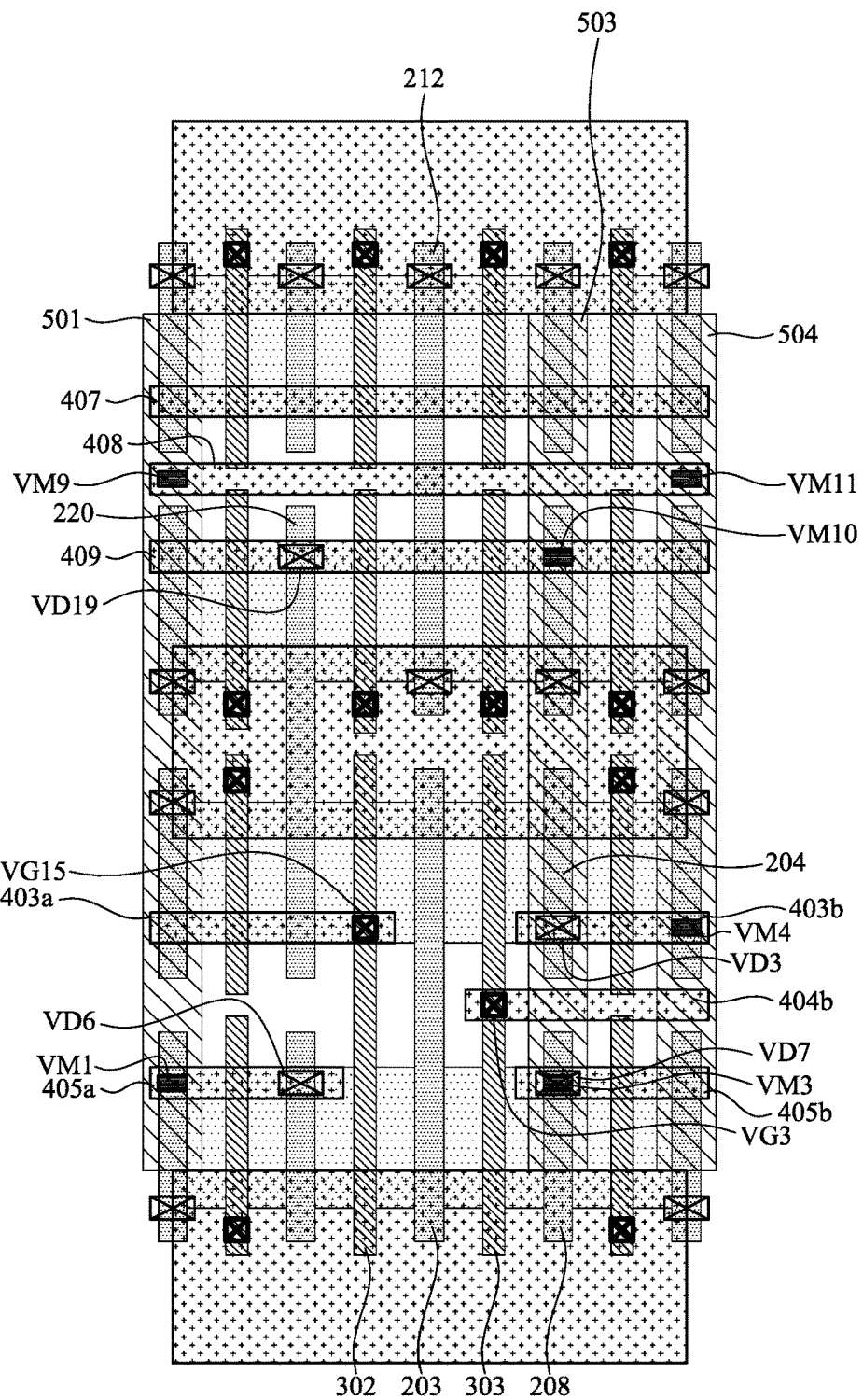
FIG. 4 is an another layout diagram in the plan view of part of the integrated circuit corresponding to part of FIG. 1, in accordance with various embodiments.

Reference is now made to FIG. 4. FIG. 4 is an another layout diagram in the plan view of part of the integrated circuit 100 corresponding to part of FIG. 1, in accordance with various embodiments. With respect to the embodiments of FIGS. 2A-3, like elements in FIG. 4 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

Compared with the embodiments of FIG. 3, instead of coupling the conductive pattern 202 to the conductive pattern 208 through the conductive segment 502 and having the corresponding structures, for example, including the conductive patterns 202 and 216, the conductive line 404a, and the vias VD2, VD15, VG2, VM2, VM5-VM8, the integrated circuit 100 further includes a conductive pattern 220 and vias VD19, VG15, VM9-VM11. In some embodiments, the conductive patterns 202 and 216 of FIG. 3 are referred to as two portions of the conductive pattern 220. The via VD19 is configured with respect to, for example, the via VD2 of FIG. 3. The via VG15 is configured with respect to, for example, the via VG2 of FIG. 3. The vias VM9-VM11 are configured with respect to, for example, the vias VM5, VM7-VM8 of FIG. 3.

In addition, compared with the embodiments of FIG. 3, the conductive line 403a extends and further crosses the gate 302 in the layout view.

For illustration, the conductive pattern 220 extends in y direction and crosses the active areas 110 and 140, and the conductive line 401 in the layout view.

The via VG15 couples the gate 302 to the conductive line 403a. In some embodiments, the via VG 15 is arranged overlapped the active area 110.

As shown in FIG. 3, the via VD19 couples the conductive pattern 220 to the conductive line 409. The via VM10 couples the conductive line 409 to the conductive segment 503. Accordingly, the conductive pattern 220 is coupled to the conductive pattern 208 through the via VD19, the conductive line 409, the via VM10, the conductive segment 503, the via VM3, the conductive line 405b, and the via VD7.

The vias VM9 and VM11 couple the conductive line 408 to the conductive segments 501 and 504 respectively. Accordingly, the conductive pattern 204 is coupled to the conductive pattern 207 through the via VD3, the conductive line 403b, the via VM4, the conductive segment 504, the via VM11, the conductive line 408, the via VM9, the conductive segment 501, the via VM1, the conductive line 405a, and the via VD6.

Compared with the configurations of FIG. 3, the embodiments of FIG. 4 further save the routing resources of metal layers in the second layer by not implementing the conductive segment 502.

The configurations of FIG. 4 are given for illustrative purposes. Various implementations of FIG. 4 are within the contemplated scope of the present disclosure. For example, in some embodiments, the conductive line 404a of FIG. 3 is included.

Figure 5:
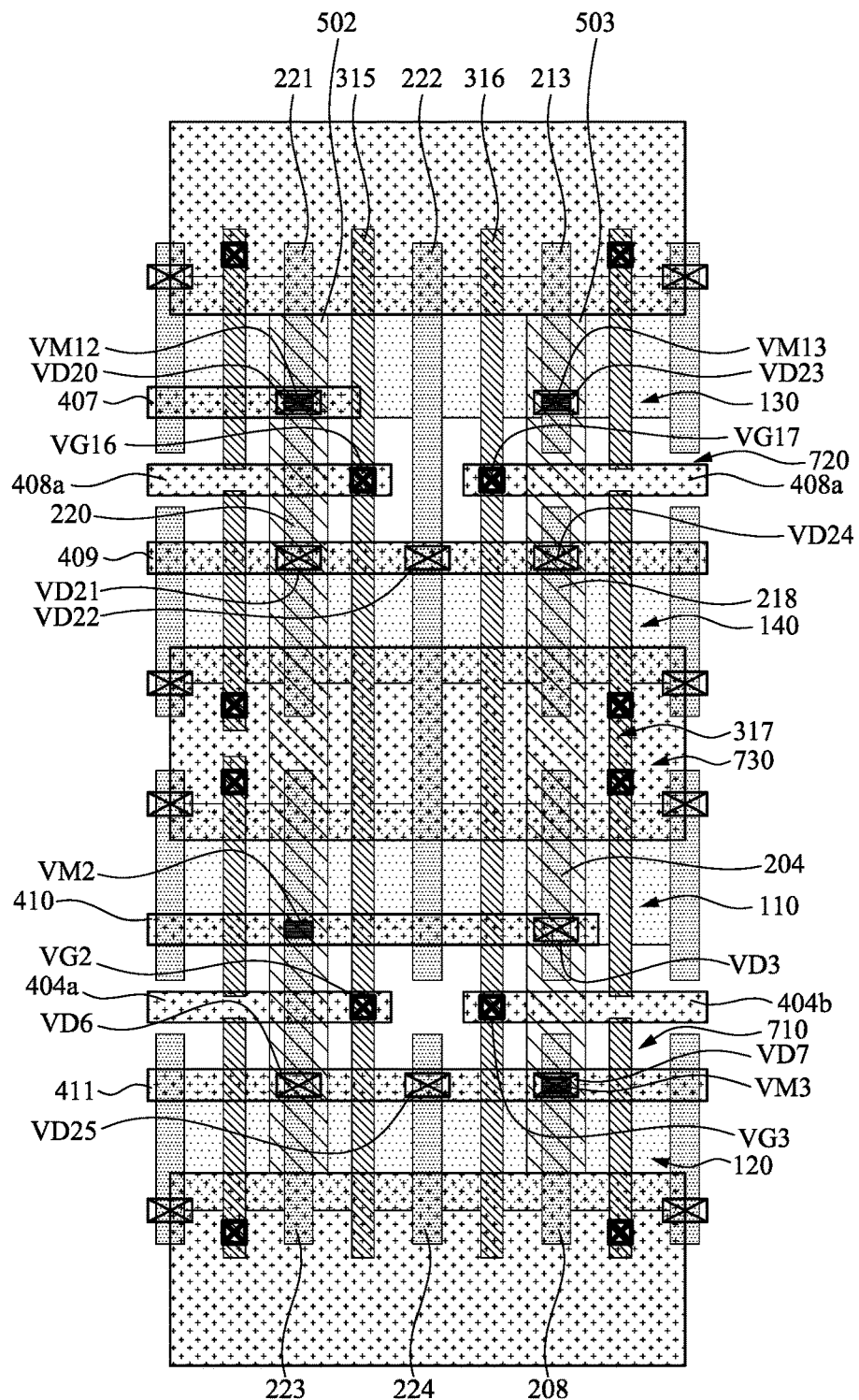
FIG. 5 is an another layout diagram in the plan view of part of the integrated circuit corresponding to part of FIG. 1, in accordance with various embodiments.

Reference is now made to FIG. 5. FIG. 5 is an another layout diagram in the plan view of part of the integrated circuit 100 corresponding to part of FIG. 1, in accordance with various embodiments. With respect to the embodiments of FIGS. 2A-4, like elements in FIG. 5 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5.

Compared with the embodiments of FIG. 3, instead of having the conductive patterns 202-203, 207, 211-212, 216-217, the gates 302-304, 308-309, 312-314, the conductive lines 403a-403b, 408, the conductive segments 501 and 504, the vias VD2, VD10-VD12, VD15-VD17, VM1, VM4-VM9, VG8-VG9, and VG12-VG13, the integrated circuit 100 further includes conductive patterns 221-224, gates 315-317, conductive lines 408a-408b, 410-411, vias VD20-VD25, VM12-VM13, and VG16-17. In some embodiments, the conductive patterns 221 and 216 of FIG. 3 are referred to as two portions of the conductive pattern 221. The conductive pattern 222 is configured with respect to, for example, the conductive pattern 203 of FIG. 3. The gates 315 and 316 are configured with respect to, for example, the gates 302 and 303 of FIG. 3 respectively. The gates 304 and 314 of FIG. 3 are referred to as two portions of the gate 317. The conductive lines 408a-408b are configured with respect to, for example, the conductive line 408 of FIG. 3. The conductive line 410 is configured with respect to, for example, the conductive lines 403a-403b. The conductive line 411 is configured with respect to, for example, the conductive lines 405a-405b. The vias VD20-VD25 is configured with respect to, for example, the via VD2. The vias VG16-VG17 are configured with respect to, for example, the vias VG2-VG3 respectively. The vias VM12-VM13 are configured with respect to, for example, the vias VM6-VM7 of FIG. 3.

In some embodiments, the conductive pattern 221 corresponds to the drain/source of the transistor M3. The conductive pattern 222 corresponds to the drain/source of the transistor M2 and the sources/drains of the transistors M1, M3-M4. The conductive pattern 213 corresponds to the drain/source of the transistor M4. The conductive pattern 223 corresponds to the drain/source of the transistor M1. The conductive pattern 204 corresponds to the source/drain of the transistor M2. The gate 315 corresponds to the gates of the transistors M1 and M3, and the gate 316 corresponds to the gates of the transistors M2 and M4. In some embodiments, portions of the gates 315-316 over the active areas 120 and 140 are configured as dummy gates.

For illustration, the conductive pattern 221-224 extend in y direction and are separate from each other in both x and y directions. The conductive pattern 221 crosses the active areas 130-140. The conductive pattern 222 crosses the active areas 110, and 130-140. The conductive pattern 223 crosses the active areas 110-120.

The gates 315-317 extend in y direction and are separate from each other in x direction. For illustration, the gates 315-316 cross the active areas 110-140. The gate 317 crosses the active areas 110 and 140.

The conductive line 407 is shorten and crosses the conductive patterns 210, 221 and the gates 307. The conductive lines 408a-408b, 410-411 extend in x direction and are separate from each other in y direction. The conductive lines 408a-408b are separate from each other in x direction, and cross the gates 315-316 respectively. Furthermore, in the layout view, the conductive line 401 crosses the gates 315-316, the conductive line 410 crosses the gates 301, 315-316, the conductive patterns 204, and 222-223, and the conductive line 411 crosses the gates 305-306, 315-316, the conductive patterns 206, 208-209, and 223-224.

The vias VG16-VG17 couple the gates 315-316 to the conductive lines 408a-408b respectively. In some embodiments, the vias VG16-VG17 are arranged overlapped the shallow trench isolation region 720.

For illustration, the via VD7, VD6, and VD25 couple the conductive patterns 208, 223, and 224 to the conductive line 411 through separately. The via VM3 couples the conductive line 411 to the conductive segment 503. The via VM13 couples the conductive segment 503 to the via VD23 and further to the conductive pattern 213. Accordingly. The conductive pattern 223 is coupled to the conductive pattern 213.

Similarly, the via VD3 coupled the conductive pattern 204 to the conductive line 410. The via VM2 couples the conductive line 410 to the conductive segment 502. The via VM12 couples the conductive segment 502 to the conductive line 407. The via VD20 couples the conductive line 407 to the conductive pattern 221. Accordingly, the conductive pattern 204 is coupled to the conductive pattern 221.

Compared with the configurations of FIG. 3, the embodiments of FIG. 5 further save the routing resources of metal layers in the second layer by not implementing the conductive segments 501 and 504.

The configurations of FIG. 5 are given for illustrative purposes. Various implementations of FIG. 5 are within the contemplated scope of the present disclosure. For example, in some embodiments, another conductive line 404 is disposed between the vias VD23 and VM13.

Figure 6:
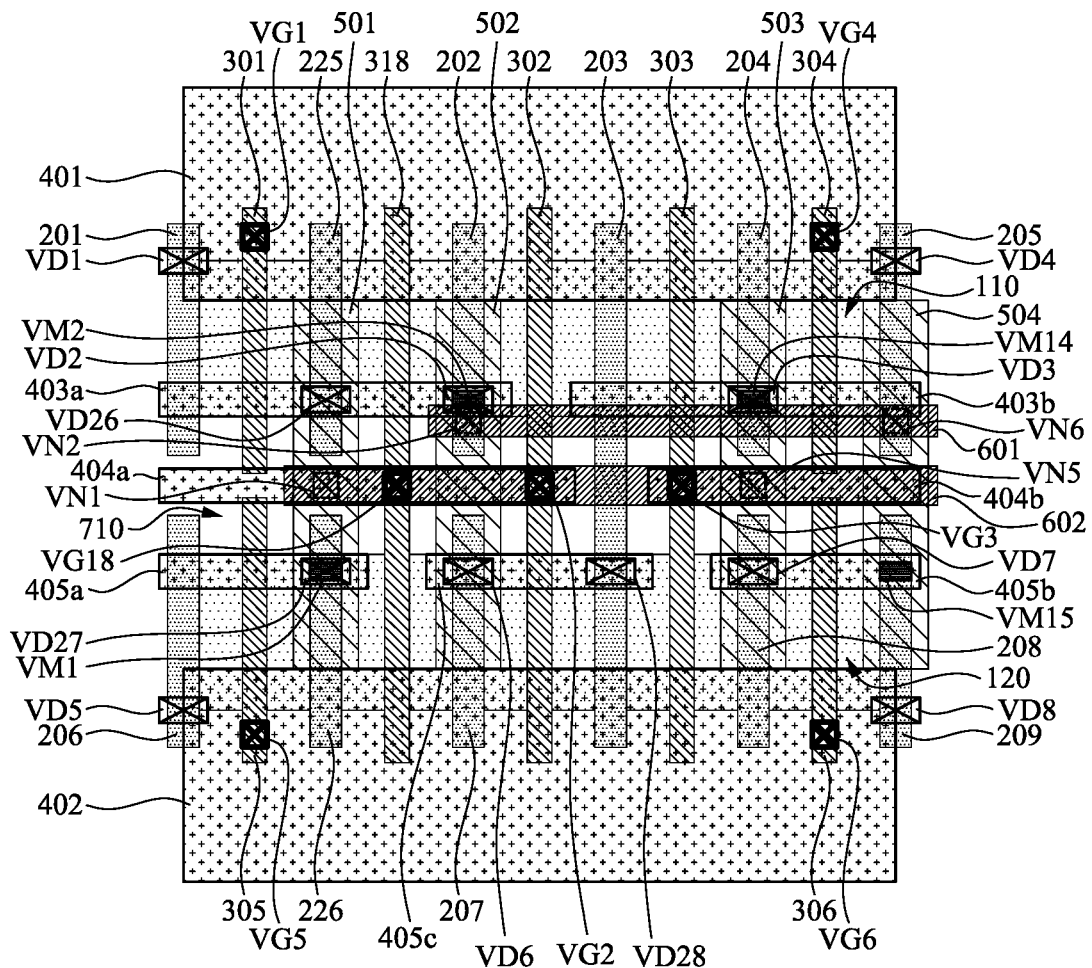
FIG. 6 is an another layout diagram in the plan view of part of the integrated circuit corresponding to part of FIG. 1, in accordance with various embodiments.
Figure 6:
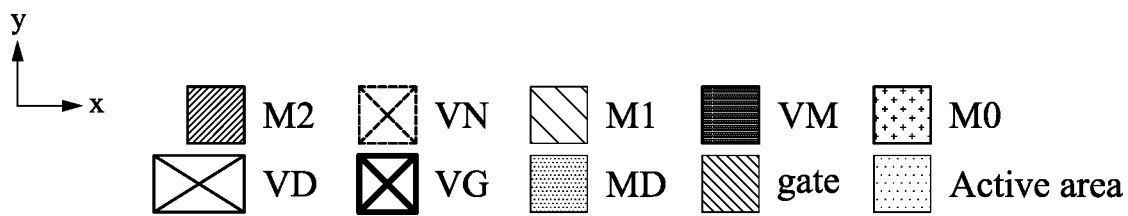

Reference is now made to FIG. 6. FIG. 6 is an another layout diagram in the plan view of part of the integrated circuit 100 corresponding to part of FIG. 1, in accordance with various embodiments. With respect to the embodiments of FIGS. 2A-5, like elements in FIG. 6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6.

Compared with the embodiments of FIG. 2A, the integrated circuit 100 further includes conductive patterns 225-226, a gate 318, a conductive line 405c, and vias VD26-VD28, VM14-VM15, VG18, and VN5-VN6. The conductive patterns 225-226 are configured with respect to, for example, the conductive pattern 202. The gate 318 is configured with respect to, for example, the gate 302. The conductive line 405c is configured with respect to, for example, the conductive line 405a. The vias VD26-VD28 are configured with respect to, for example, the via VD2. The vias VM14-VM15 are configured with respect to, for example, the via VM2. The vias VG18 is configured with respect to, for example, the via VG2. The vias VN5-VN6 are configured with respect to, for example, the via VN1.

Furthermore, in some embodiments, the gate 302 corresponds to the gate of the transistor M1 while a portion of the gate 302 arranged above the active area 120 is referred as a dummy gate. The gate 318 corresponds to the gate of the transistor M3 while a portion of the gate 318 arranged above the active area 110 is referred as a dummy gate. A portion of the gate 303 above the active area 110 corresponds to the gate of the transistor M2, and another portion of the gate 303 above the active area 120 corresponds to the gate of the transistor M4. The conductive pattern 202 corresponds to the drain/source of the transistor M1. The conductive pattern 203 corresponds to the sources/drains of the transistors M1 and M4 and the drain/source of the transistor M2. The conductive pattern 204 corresponds to the source/drain of the transistor M2. The conductive pattern 207 corresponds to the source/drain of the transistor M3. The conductive pattern 226 corresponds to the drain/source of the transistor M3.

For illustration, the conductive patterns 225-226 extend in y direction and are separate from each other in y direction. The conductive patterns 225-226 are arranged interposed between the gates 301, 305, and 318. The conductive patterns 225-226 cross the active areas 110-120 respectively.

The gate 318 elongates in y direction and crosses the active areas 110-120. The gate 318 is arranged interposed between the gates 301-302.

The conductive line 403a further crosses the conductive patterns 225 and the gate 318, and the conductive line 403a further crosses the gate 303. The conductive line 404a further crosses the gate 318, and the conductive line 404b further crosses the conductive pattern 203. The conductive line 405a further crosses the conductive pattern 226. The conductive line 405c is arranged between the conductive lines 405a-405b and crosses the conductive patterns 203 and 226, and the gate 302.

The conductive segment 501, instead of overlapping the conductive patterns 201 and 206, overlaps the conductive patterns 225 and 226. The conductive segment 502 further crosses the conductive line 405c.

As shown in FIG. 6, the conductive trace 601 further crosses the conductive pattern 205, and the conductive trace 602 further crosses the gate 318.

The via VG18 couples the gate 318 to the conductive line 404a while the via VG2 couples the gate 302 to the conductive line 404a. Accordingly, the gate 318 is coupled to the gate 302.

With continued reference to FIG. 6, the via VD2 couples the conductive pattern 202 to the conductive line 403a, and the via VM2 couples the conductive line 403a to the conductive segment 502. The via VN2 couples the conductive segment 502 to the conductive trace 601. The via VN6 couples the conductive trace 601 to the conductive segment 504. The via VM15 couples the conductive segment 504 to the conductive line 405b. The via VD7 couples the conductive line 405b to the conductive pattern 208. Accordingly, through the discussions as above, the conductive pattern 202 is coupled to the conductive pattern 208.

The via VD3 couples the conductive pattern 204 to the conductive line 403b, and the via VM14 couples the conductive line 403b to the conductive segment 503. The via VN5 couples the conductive segment 503 to the conductive trace 602. The via VN1 couples the conductive trace 602 to the conductive segment 501. The via VM1 couples the conductive segment 501 to the conductive line 405a. The via VD27 couples the conductive line 405a to the conductive pattern 226. Accordingly, through the discussions as above, the conductive pattern 204 is coupled to the conductive pattern 226.

The vias VD2 and VD26 couple the conductive patterns 202 and 225 to the conductive line 403a respectively. Accordingly, the conductive pattern 202 is coupled to the conductive pattern 225. The vias VD6 and VD28 couple the conductive patterns 207 and 203 to the conductive line 405c respectively. Accordingly, the conductive pattern 207 is coupled to the conductive pattern 203.

The configurations of FIG. 6 are given for illustrative purposes. Various implementations of FIG. 6 are within the contemplated scope of the present disclosure. For example, in some embodiments, the conductive line 403b does not cross the conductive pattern 203 and the gate 303.

Figure 7:
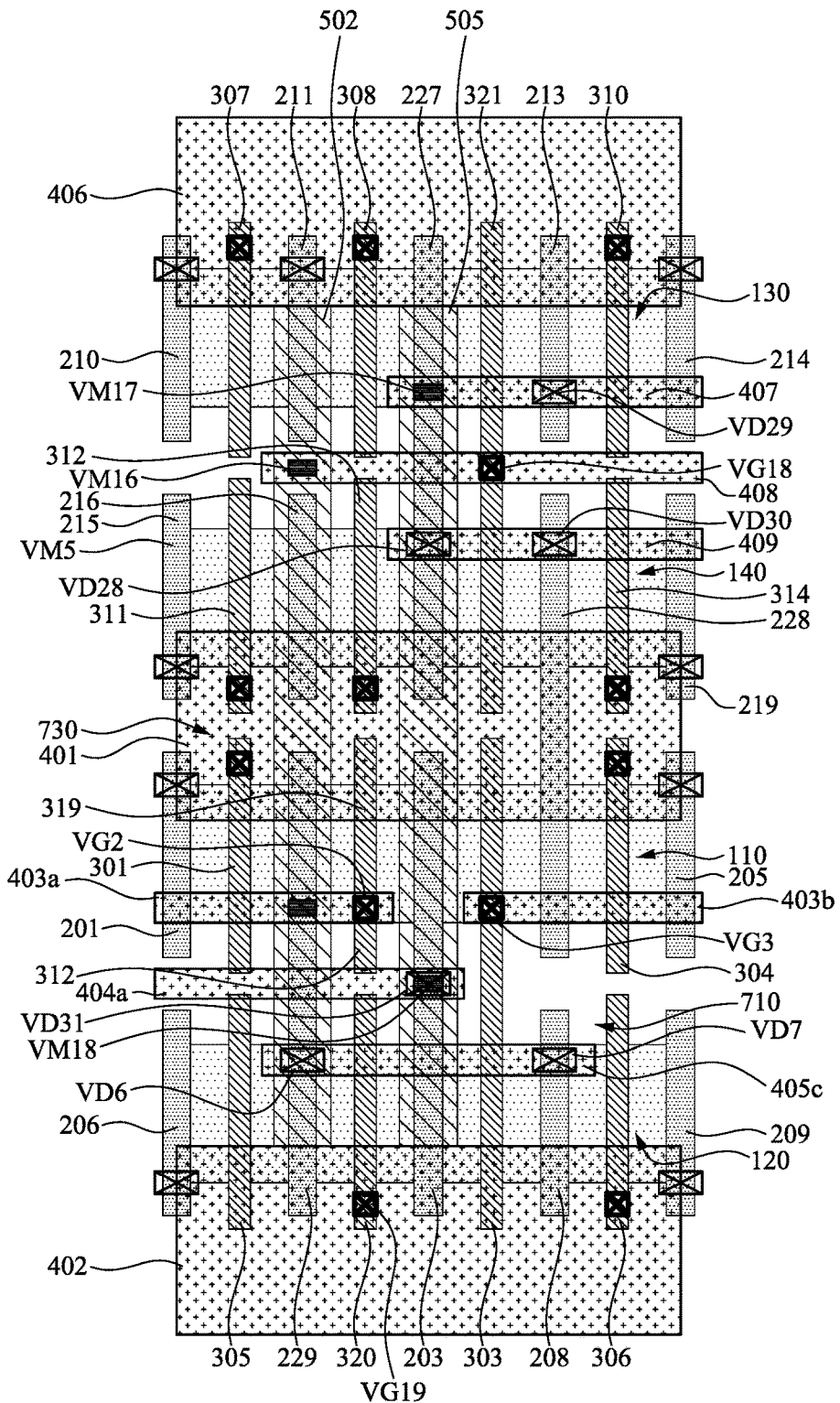
FIG. 7 is an another layout diagram in the plan view of part of the integrated circuit corresponding to part of FIG. 1, in accordance with various embodiments.
Figure 7:
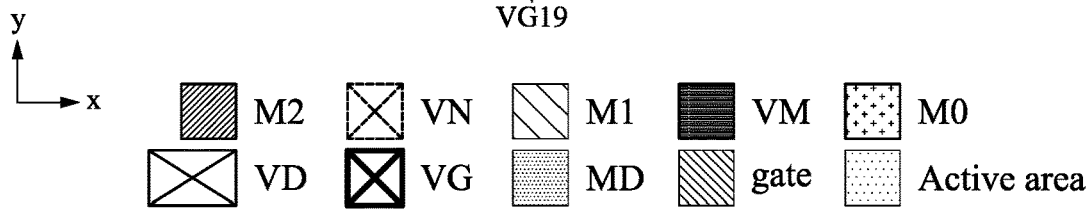

Reference is now made to FIG. 7. FIG. 7 is an another layout diagram in the plan view of part of the integrated circuit 100 corresponding to part of FIG. 1, in accordance with various embodiments. With respect to the embodiments of FIGS. 2A-6, like elements in FIG. 7 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7.

Compared with the embodiments of FIGS. 3 and 6, instead of having the conductive lines 405a-405b and some structures, such like the conductive line 404b, and the conductive segments 501 and 503-504, etc., the integrated circuit 100 further includes conductive patterns 227-229, gates 319-321, a conductive segment 505, and vias VD29-VD31, VG19, VM16-VM18. The conductive patterns 227-229 are configured with respect to, for example, the conductive pattern 203. The gates 319-321 are configured with respect to, for example, the gate 302, 305, and 318 separately. The conductive segment 505 is configured with respect to, for example, the conductive segment 502. The vias VD29-VD31 are configured with respect to, for example, the via VD28. The vias VM16-VM18 are configured with respect to, for example, the via VM2. The vias VG19 is configured with respect to, for example, the via VG6.

Furthermore, in some embodiments, the gate 319 corresponds to the gate of the transistor M1. The gate 321 corresponds to the gate of the transistor M3 while a portion of the gate 321 arranged above the active area 140 is referred as a dummy gate. The portion of the gate 303 above the active area 110 corresponds to the gate of the transistor M2, and another portion of the gate 303 above the active area 120 corresponds to the gate of the transistor M4. The conductive pattern 203 corresponds to the sources/drains of the transistors M1 and M4 and the drain/source of the transistor M2. The conductive pattern 208 corresponds to the drain/source of the transistor M4. The conductive pattern 213 corresponds to the source/drain of the transistor M3. The conductive pattern 227 corresponds to the drain/source of the transistor M3. The conductive pattern 228 corresponds to the source/drain of the transistor M2. The conductive pattern 229 corresponds to the drain/source of the transistor M1.

For illustration, the conductive patterns 227-229 extend in y direction. The conductive pattern 227 is arranged interposed between the gates 308, 312, and 321 and crosses the active areas 130-140. The conductive pattern 228 is arranged interposed between the gates 308, 312, and 321 and crosses the active areas 110 and 140. The conductive pattern 229 is arranged interposed between the gates 301, 305, and 319-320, and crosses the active areas 110-120.

The gates 319-321 elongate in y direction. The gates 319-320 cross the active areas 110 and 120 respectively. The gate 321 crosses the active areas 130-140.

The conductive line 403a, instead of crossing the conductive patterns 202 and 225 and the gate 318, further crosses the conductive pattern 229 and the gate 319. The conductive line 403b, instead of crossing the conductive patterns 203-204, further crosses the conductive pattern 228. The conductive line 404a, instead of crossing the gates 302 and 318, crosses the conductive patterns 203 and 229. The conductive line 405c, instead of crossing the conductive pattern 207, further crosses the conductive patterns 203, 208, and 229 and the gates 303 and 320.

The conductive segment 502, instead of overlapping the conductive patterns 202 and 207, overlaps the conductive patterns 211, 216, and 229, and further crosses the conductive lines 401 and 408. The conductive segment 505 overlaps the conductive patterns 203 and 227, and crosses the conductive lines 401, 404a, 405c, and 407-409.

For illustration, the vias VG2 and VG3 overlap the active area 110 while the via VG18 overlap the shallow trench isolation region 720. The via VG2 couples the gate 319 to the conductive line 403a. The via VM2 couples the conductive line 403a to the conductive segment 502. The via VM16 couples the conductive segment 502 to the conductive line 408. The via VG18 coupled the conductive line 408 to the gate 321. Accordingly, the gate 319 is coupled to the gate 321.

The vias VG19 couples the gate 320 to the conductive line 402. In some embodiments, the conductive line 402 also receives the supply voltage VSS for the gate 320.

With continued reference to FIG. 7, the via VD6 couples the conductive pattern 229 to the conductive line 405c, and the via VD7 couples the conductive line 405c to the conductive pattern 208. Accordingly, the conductive pattern 229 is coupled to the conductive pattern 208.

The via VD29 couples the conductive pattern 213 to the conductive line 407. The via VM17 couples the conductive line 407 to the conductive segment 505. The via VM18 couples the conductive segment 505 to the conductive line 404a. The via VD31 couples the conductive line 404a to the conductive pattern 203. Accordingly, the conductive pattern 213 is coupled to the conductive pattern 203.

The via VD28 couples the conductive pattern 227 to the conductive line 409, and the via VD29 couples the conductive pattern 228 to the conductive line 409. Accordingly, the conductive pattern 227 is coupled to the conductive pattern 228.

Compared with the configurations of FIG. 6, the embodiments of FIG. 7 further save the routing resources of metal layers in the second layer by not implementing the conductive segments 501 and 504.

The configurations of FIG. 7 are given for illustrative purposes. Various implementations of FIG. 7 are within the contemplated scope of the present disclosure. For example, in some embodiments, the conductive line 404a does not cross the conductive pattern 229.

Figure 8:
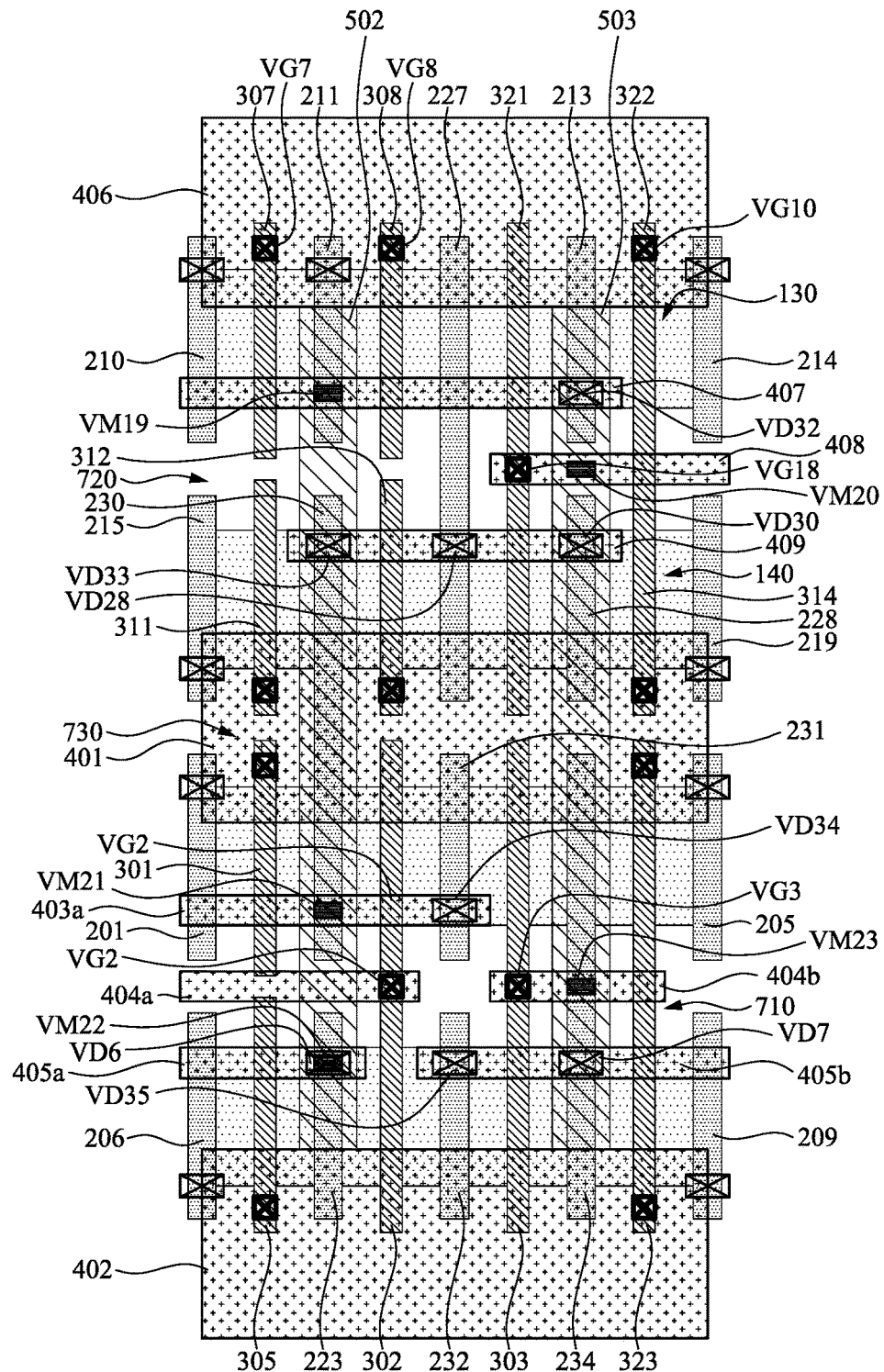
FIG. 8 is an another layout diagram in the plan view of part of the integrated circuit corresponding to part of FIG. 1, in accordance with various embodiments.

Reference is now made to FIG. 8. FIG. 8 is an another layout diagram in the plan view of part of the integrated circuit 100 corresponding to part of FIG. 1, in accordance with various embodiments. With respect to the embodiments of FIGS. 2A-7, like elements in FIG. 8 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8.

Compared with the embodiments of FIG. 7, instead of having the conductive patterns 203, 216, 218, 229, and 234, the gates 304, 306, 310, 314, 319-320, the conductive segment 505, the conductive line 403a, and corresponding structures for routing, the integrated circuit 100 further includes conductive patterns 230-234, gates 322-323, vias VD32-VD35, and VM19-VM23, the conductive lines 404b, 405a-405b, and the conductive segment 503. The conductive patterns 230-234 are configured with respect to, for example, the conductive pattern 227. The gates 322-323 are configured with respect to, for example, the gate 302. The vias VD32-VD35 are configured with respect to, for example, the via VD28. The vias VM19-VM23 are configured with respect to, for example, the via VM2 of FIG. 7.

Furthermore, in some embodiments, the portion of the gate 302 above the active area 110 corresponds to the gate of the transistor M1, and another portion of the gate 302 above the active area 120 corresponds to the gate of the transistor M4. The gate 303 corresponds to the gate of the transistor M2 while a portion of the gate 303 arranged above the active area 120 is referred as a dummy gate. The gate 321 corresponds to the gate of the transistor M4 while a portion of the gate 321 arranged above the active area 140 is referred as a dummy gate.

In some embodiments, the conductive pattern 213 corresponds to the source/drain of the transistor M4. The conductive pattern 227 corresponds to the drain/source of the transistor M4. The conductive pattern 230 corresponds to the drain/source of the transistors M1. The conductive pattern 231 corresponds to the source/drain of the transistors M1 and the drain/source of the transistor M2. The conductive pattern 232 corresponds to the source/drain of the transistors M3. The conductive pattern 233 corresponds to the drain/source of the transistors M3. The conductive pattern 234 corresponds to the source/drain of the transistors M2.

For illustration, the conductive patterns 230-234 extend in y direction. The conductive pattern 230 is arranged interposed between the gates 301-302, 311, and 312 and crosses the active areas 110 and 140. The conductive patterns 231-232 are arranged interposed between the gates 302-303 and crosses the active areas 110 and 120 respectively. The conductive pattern 233 is arranged interposed between the gates 302 and 305 and crosses the active area 120.

The gates 322-323 elongate in y direction and are separate from each other in y direction. The gates 322 cross the active areas 130-140, and the gate 323 crosses the active areas 110-120.

The conductive line 403a, instead of crossing the conductive pattern 229 and the gate 319, further crosses the conductive patterns 230-231 and the gate 302.

The conductive line 404a, instead of crossing the conductive pattern 229, crosses the gate 302. The conductive line 404b crosses the conductive pattern 234 and the gates 303 and 323. The conductive line 405a crosses the conductive patterns 206 and 233 and the gate 305, and the conductive line 405b crosses the conductive patterns 209, 232 and 234, and the gates 303 and 323.

The conductive segment 502, instead of overlapping the conductive patterns 216 and 229, further overlaps the conductive patterns 230 and 233, and, instead of crossing the conductive line 408, further crosses the conductive lines 405a, 407, and 409. The conductive segment 503 overlaps the conductive patterns 213, 218, and 234, and crosses the conductive lines 401, 404b, 405b, and 407-409.

For illustration, the vias VG2-VG3 overlap the shallow trench isolation region 710, and VG18 overlaps the shallow trench isolation region 720. The via VG2 couples the gate 302 to the conductive line 404a. The via VG3 couples the gate 303 to the conductive line 404b. The via VG18 coupled the conductive line 408 to the gate 321.

With continued reference to FIG. 8, the via VD32 couples the conductive pattern 213 to the conductive line 407. The via VM19 couples the conductive line 407 to the conductive segment 502. The via VM21 couples the conductive segment 502 to the conductive line 403a. The via VD34 couples the conductive line 403a to the conductive pattern 231. Furthermore, the via VM22 couples the conductive segment 502 to the conductive line 405a. The via VD6 couples the conductive line 405a to the conductive pattern 233. Accordingly, the conductive pattern 213 is coupled to the conductive patterns 231 and 233.

The vias VD28, VD30, and VD33 couple the conductive line 409 to the conductive patterns 227, 218, and 230 separately. Accordingly, the conductive pattern 227 is coupled to the conductive pattern 231.

The vias VD7 and VD35 couples the conductive patterns 234 and 232 to the conductive line 405b. Accordingly, the conductive patterns 232 and 234 are coupled with each other.

The configurations of FIG. 8 are given for illustrative purposes. Various implementations of FIG. 8 are within the contemplated scope of the present disclosure. For example, in some embodiments, the conductive line 405b does not overlap the gate 323.

Figure 9:
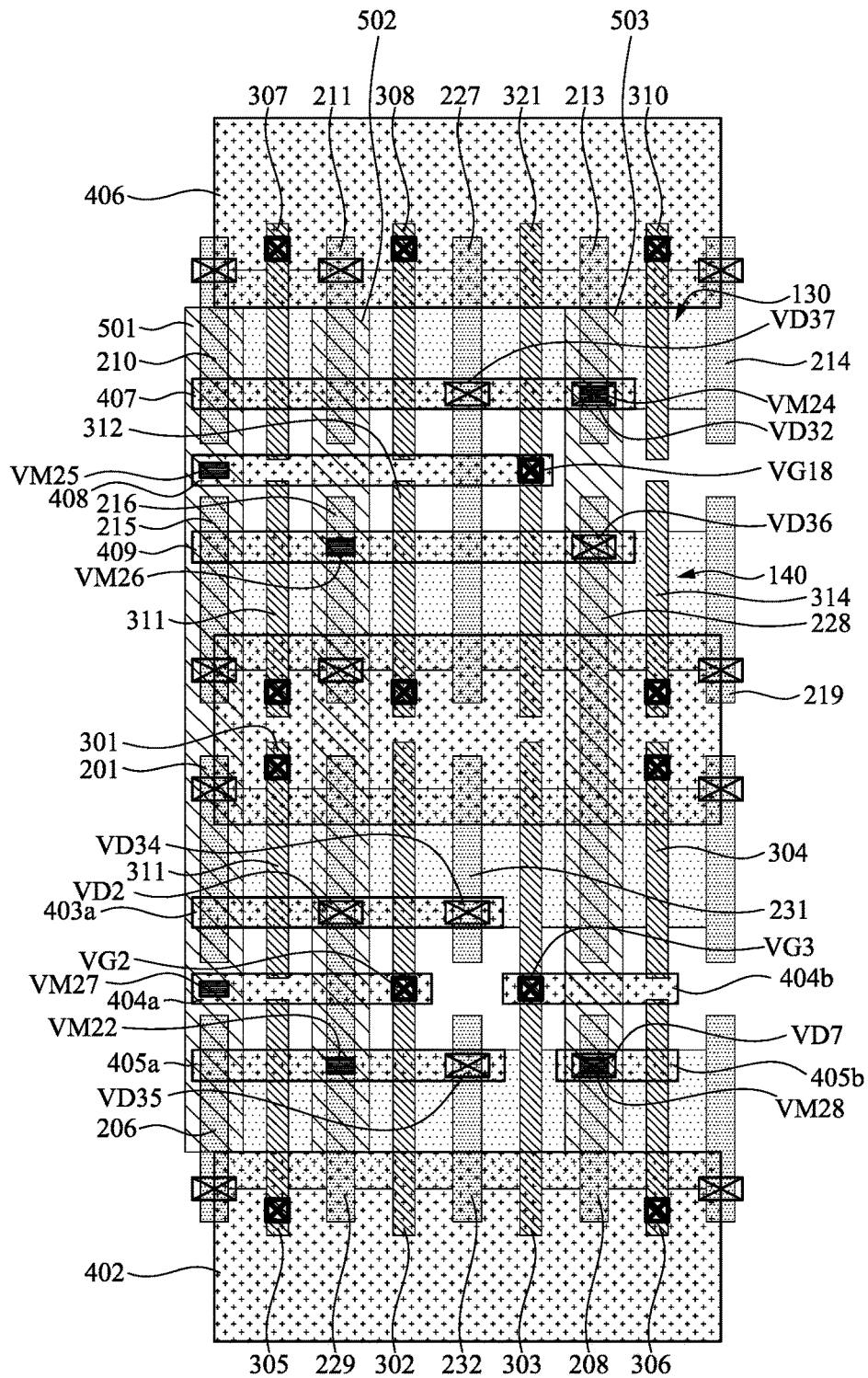
FIG. 9 is an another layout diagram in the plan view of part of the integrated circuit corresponding to part of FIG. 1, in accordance with various embodiments.

Reference is now made to FIG. 9. FIG. 9 is an another layout diagram in the plan view of part of the integrated circuit 100 corresponding to part of FIG. 1, in accordance with various embodiments. With respect to the embodiments of FIGS. 2A-8, like elements in FIG. 9 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 9.

Compared with the embodiments of FIG. 8, instead of having the conductive patterns 218, 230, and 233-234, the gates 322-323 and corresponding structures for routing, the integrated circuit 100 further includes the conductive patterns 208, 216, 228-229, the gates 304, 306, 310, and 314, vias VD36-VD37, and VM24-VM28. The vias VD36-VD37 are configured with respect to, for example, the via VD32. The vias VM24-VM28 are configured with respect to, for example, the via VM2.

In some embodiments, the gate 302 corresponds to the gate of the transistor M4 while a portion of the gate 302 arranged above the active area 110 is referred as a dummy gate. The portion of the gate 303 above the active area 110 corresponds to the gate of the transistor M1, and another portion of the gate 303 above the active area 120 corresponds to the gate of the transistor M3. A portion of the gate 321 arranged above the active area 140 corresponds to the gate of the transistor M2 while a portion of the gate 321 arranged above the active area 130 is referred as a dummy gate.

In some embodiments, the conductive pattern 227 corresponds to the source/drain of the transistor M2. The conductive pattern 228 corresponds to the source/drain of the transistor M1 and the drain/source of the transistor M2. The conductive pattern 229 corresponds to the drain/source of the transistor M4. The conductive pattern 231 corresponds to the drain/source of the transistor M1. The conductive pattern 232 corresponds to the sources/drains of the transistors M3 and M4. The conductive pattern 208 corresponds to the drain/source of the transistor M3.

The conductive pattern 208 is arranged between the gates 303 and 316. The conductive pattern 216 is arranged between the gates 311-312. The conductive pattern 228 is arranged between the gates 303-304, 314, and 321. The conductive pattern 229 is arranged between the gates 301-302 and 305.

The conductive line 403a, instead of crossing the conductive pattern 230, crosses the conductive pattern 229. The conductive line 404a further crosses the conductive pattern 229. The conductive line 404a does not cross the conductive pattern 234 and the gate 323. The conductive line 405a, instead of crossing the conductive pattern 233, further crosses the conductive patterns 229 and 232 and the gate 302. The conductive line 405b, instead of crossing the conductive patterns 232 and 234 and the gates 303 and 323, crosses the conductive pattern 208 and the gate 306.

The conductive segment 501 overlaps the conductive patterns 201, 206, 210, and 215. The conductive segment 502 overlaps the conductive patterns 211, 215 and 229. The conductive segments 501-502 cross the conductive lines 403a, 404a, 405a, and 407-409. The conductive segment 503 overlaps the conductive patterns 213, 218, 234, and crosses the conductive lines 404b, 405b, and 407-409.

For illustration, the via VG2 couples the gate 302 to the conductive line 404a. The via VM27 couples the conductive line 404a to the conductive segment 501. The via VM25 couples the conductive segment 501 to the conductive line 408. The via VG18 couples the conductive line 408 to the gate 321. Accordingly, the gate 302 is coupled to the gate 321. The via VG3 is coupled to the conductive line 404b.

With continued reference to FIG. 9, the vias VD2 and VD34 couple the conductive patterns 229 and 231 to the conductive line 403a respectively. Accordingly, the conductive patterns 229 and 231 are coupled to each other.

The via VD35 couples the conductive pattern 232 to the conductive line 405a. The via VM22 couples the conductive line 405a to the conductive segment 502. The via VM26 couples the conductive segment 502 to the conductive line 409. The via VD36 couples the conductive line 409 to the conductive pattern 228. Accordingly, the conductive pattern 232 is coupled to the conductive pattern 228.

The via VD7 couples the conductive pattern 208 to the conductive line 405b. The via VM28 couples the conductive line 405b to the conductive segment 503. The via VM24 couples the conductive segment 501 to the conductive line 407. The vias VD32 and VD37 couple the conductive line 407 to the conductive patterns 213 and 227 respectively. Accordingly, the conductive pattern 208 is coupled to the conductive patterns 213 and 227.

The configurations of FIG. 9 are given for illustrative purposes. Various implementations of FIG. 9 are within the contemplated scope of the present disclosure. For example, in some embodiments, the conductive line 407 does not overlap the gates 307-308.

Figure 10:
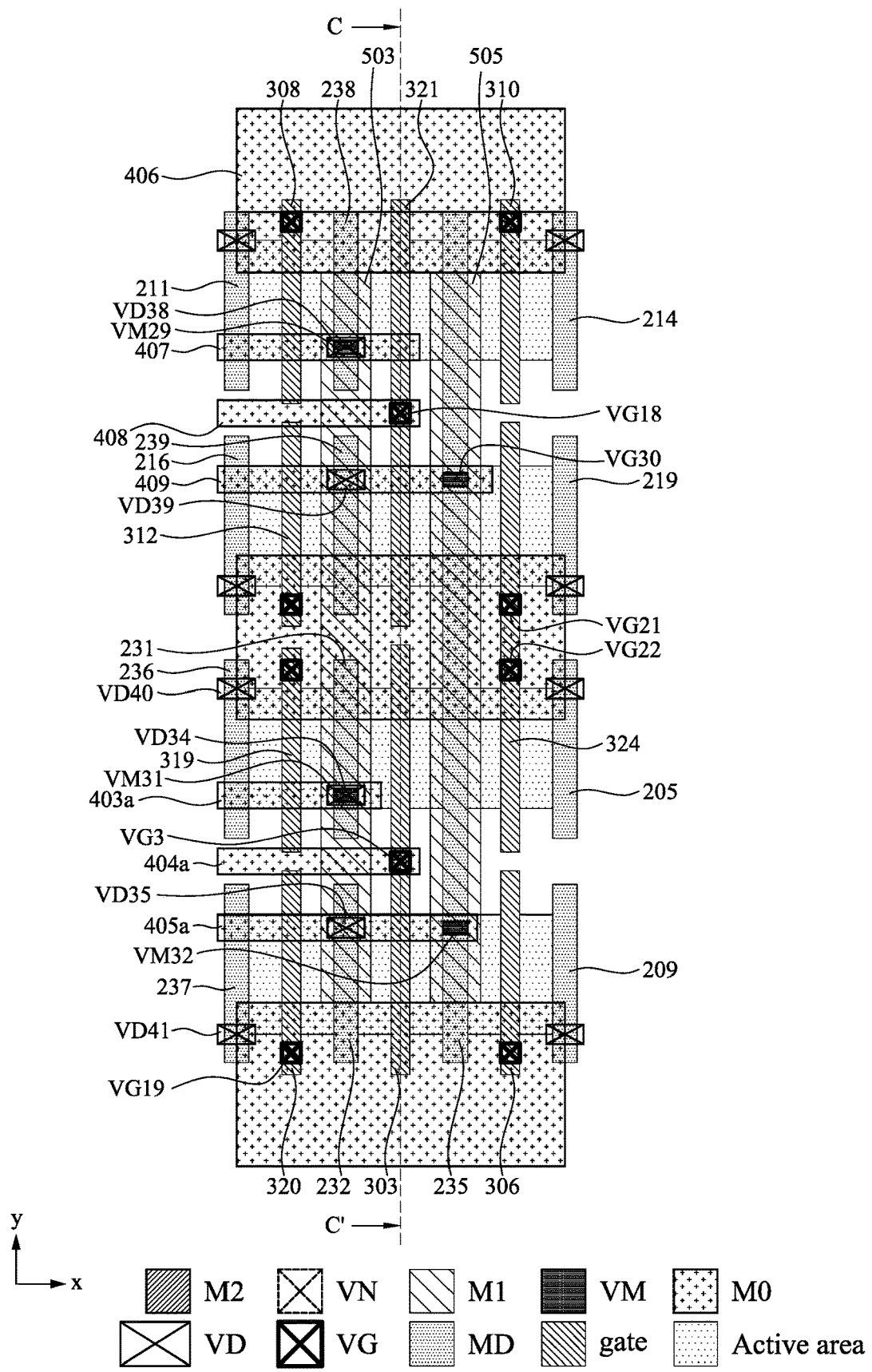
FIG. 10A is an another layout diagram in the plan view of part of the integrated circuit corresponding to part of FIG. 1, in accordance with various embodiments.
FIG. 10B is a cross-sectional diagram of the integrated circuit corresponding to part of FIG. 10A, in accordance with various embodiments.

Reference is now made to FIG. 10A. FIG. 10A is an another layout diagram in the plan view of part of the integrated circuit 100 corresponding to part of FIG. 1, in accordance with various embodiments. With respect to the embodiments of FIGS. 2A-9, like elements in FIG. 10A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 10A.

Compared with the embodiments of FIG. 9, instead of having the conductive patterns 201, 206, 208, 210, 213, 215, 227-229, the gates 301-302, 304-305, 307, 311-312, 314, the conductive lines 404b and 405b, the conductive segments 501-502, and corresponding structures for routing, the integrated circuit 100 further includes the conductive patterns 231-232, conductive patterns 235-239, the gates 319-320, vias VD38-VD41, and VM29-VM32, the via VG3, and VG18-VG19. The conductive patterns 235-239 are configured with respect to, for example, the conductive pattern 232. The vias VD38-VD41 are configured with respect to, for example, the via VD35. The vias VM29-VM32 are configured with respect to, for example, the via VM22 of FIG. 9.

In some embodiments, the portion of the gate 303 above the active area 110 corresponds to the gate of the transistor M1, and another portion of the gate 303 above the active area 120 corresponds to the gate of the transistor M3. The portion of the gate 321 above the active area 130 corresponds to the gate of the transistor M4, and another portion of the gate 321 above the active area 140 corresponds to the gate of the transistor M2.

In some embodiments, the conductive pattern 231 corresponds to the drain/source of the transistor M1. The conductive pattern 232 corresponds to the drain/source of the transistor M3. The conductive pattern 235 corresponds to the sources/drains of the transistors M1, M3 and M4, and the drain/source of the transistor M2. The conductive pattern 238 corresponds to the drain/source of the transistor M4. The conductive pattern 239 corresponds to the source/drain of the transistor M2.

The conductive pattern 231 is arranged between the gates 319 and 303, and the conductive pattern 232 is arranged between the gates 320 and 303. The conductive patterns 235-239 extend in y direction. The conductive pattern 235 is arranged between the gates 303, 306, 310, 321, and 324. The conductive pattern 236 is arranged next to the gate 319. The conductive pattern 237 is arranged next to the gate 320. The conductive pattern 238 is arranged between the gates 308 and 321. The conductive pattern 239 is arranged between the gates 312 and 321.

As shown in FIG. 10A, the conductive line 403a crosses the conductive patterns 231 and 236 and the gate 319. The conductive line 404a crosses the gate 303. The conductive line 405a crosses the conductive patterns 232, 235, and 237 and the gates 303 and 320. The conductive line 407 crosses the conductive patterns 211 and 238 and the gates 308 and 321. The conductive line 408 crosses the gate 321. The conductive line 409 crosses the conductive patterns 216, 239, and 235 and the gates 308 and 321.

The conductive segment 503 overlaps the conductive patterns 231-232 and 238-239 and crosses the conductive lines 403a, 404a, 405a, and 407-409. The conductive segment 505 overlaps the conductive pattern 235 and crosses the conductive lines 401, 405a and 409.

The via VG3 is coupled between the conductive line 404a and the gate 321. The via VG18 is coupled between the conductive line 408 and the gate 321.

The via VD40 couples the conductive pattern 236 to the conductive line 401, and the via VD41 couples the conductive pattern 237 to the conductive line 402. In some embodiments, the conductive line 401 outputs the supply voltage VDD to the conductive pattern 236, and the conductive line 402 receives the supply voltage VSS for the conductive pattern 237.

With continued reference to FIG. 10A, the via VD34 couples the conductive pattern 236 to the conductive line 403a. The via VM31 couples the conductive line 403a to the conductive segment 503. The via VM29 couples the conductive segment 503 to the conductive line 407. The via VD38 couples the conductive line 407 to the conductive pattern 238. Accordingly, the conductive pattern 236 is coupled to the conductive pattern 238.

The via VD35 couples the conductive pattern 232 to the conductive line 405a. The via VM32 couples the conductive line 405a to the conductive segment 505. The via VM30 couples the conductive segment 505 to the conductive line 409. The via VD39 couples the conductive line 409 to the conductive pattern 239. Accordingly, the conductive pattern 232 is coupled to the conductive pattern 239.

The embodiments of FIG. 10A further save the routing resources of metal layers in the second layer by not implementing the conductive segment 501, and also save the layout area in the integrated circuit 100 by implementing less elements, compared with the configurations of FIG. 9.

Figure 10B:
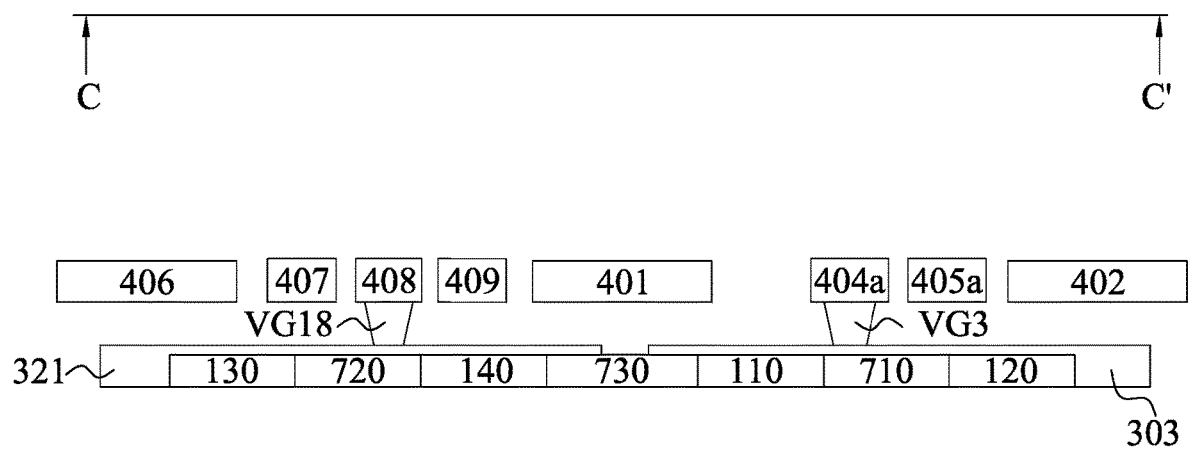

Reference is now to FIG. 10B. FIG. 10B is cross-sectional diagram of the integrated circuit 100 corresponding to part of FIG. 10A along line CC', in accordance with various embodiments. As shown in FIG. 10B, the STI 720 is interposed between the active areas 130-140, and the STI 730 is interposed between the active areas 110 and 140. The gate 321 overlaps the active areas 130-140 and the STI 720, and the gate 303 overlaps the active areas 110-120 and the STI 710. The conductive lines 401-402, 404a, 405a, and 406-407 are arranged in the layer above the gates 303 and 321. The conductive lines 404a and 408 are coupled to the gates 303 and 321 through the vias VG3 and VG18 respectively.

The configurations of FIGS. 10A-10B are given for illustrative purposes. Various implementations of FIGS. 10A-10B are within the contemplated scope of the present disclosure. For example, in some embodiments, the conductive lines 403a and 405a do not overlap the gates 319 and 320.

Figure 11A:
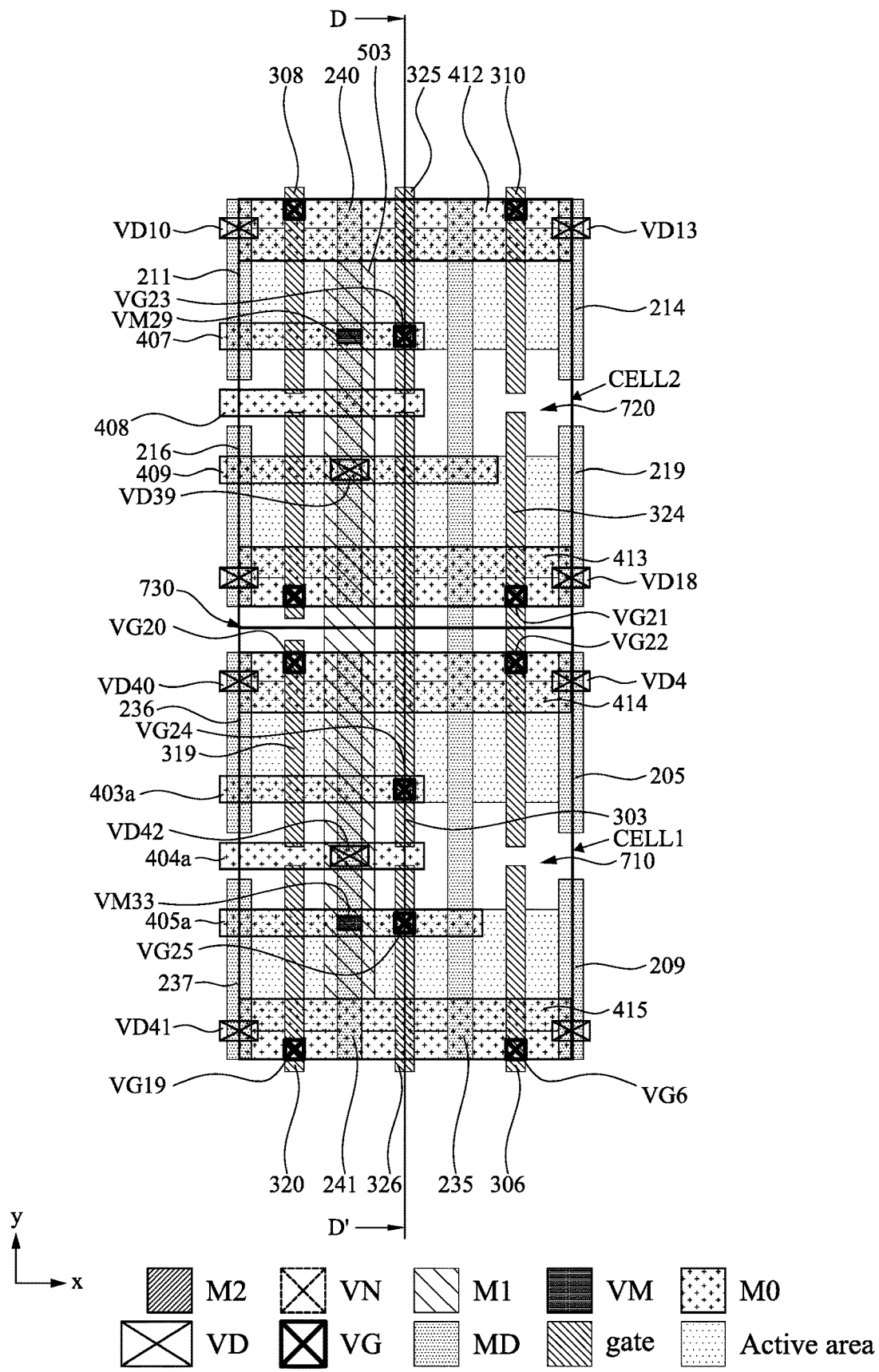
FIG. 11A is an another layout diagram in the plan view of part of the integrated circuit corresponding to part of FIG. 1, in accordance with various embodiments.

Reference is now made to FIG. 11A. FIG. 11A is an another layout diagram in the plan view of part of the integrated circuit 100 corresponding to part of FIG. 1, in accordance with various embodiments. With respect to the embodiments of FIGS. 2A-10B, like elements in FIG. 11A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 11A.

Compared with the embodiments of FIG. 10A, instead of having the conductive patterns 231-232, 238-239, the gate 321, the conductive lines 401-402, 406, the conductive segment 505 and corresponding structures for routing, the integrated circuit 100 further includes conductive patterns 240-241, gates 325-326, vias VD42, and VM33, and conductive lines 412-415. The conductive patterns 240-241 are configured with respect to, for example, the conductive pattern 227 of FIG. 9. The gates 325-326 are configured with respect to, for example, the gate 319 of FIG. 7. The via VD42 is configured with respect to, for example, the via VD39. The via VM33 is configured with respect to, for example, the via VM29. The conductive line 412 is configured with respect to, for example, the conductive line 406, the conductive lines 413-414 are configured with respect to, for example, the conductive line 401, and the conductive line 415 is configured with respect to, for example, the conductive line 402.

In some embodiments, the portion of the gate 303 above the active area 110 corresponds to the gate of the transistor M3, and another portion of the gate 303 above the active area 140 corresponds to the gate of the transistor M1. The gate 325 corresponds to the gate of the transistor M4. The gate 326 corresponds to the gate of the transistor M2.

In some embodiments, the conductive pattern 235 corresponds to the sources/drains of the transistors M1, M3 and M4, and the drain/source of the transistor M2. The conductive pattern 240 corresponds to the drains/sources of the transistors M1 and M4. The conductive pattern 241 corresponds to the drain/source of the transistor M3 and the source/drain of the transistor M2.

The conductive patterns 240-241 extend in y direction. The conductive pattern 240 is arranged between the gates 303, 308, 312 and 325. The conductive pattern 241 is arranged between the gates 303, 319-320 and 326.

As shown in FIG. 11A, the conductive line 403a crosses the conductive patterns 236 and 241 and the gate 303. The conductive line 404a crosses the conductive pattern 241. The conductive line 405a crosses the conductive patterns 235, 237 and 241 and the gate 326. The conductive line 407 crosses the conductive patterns 211 and 240 and the gates 308 and 325. The conductive line 408 crosses the conductive pattern 240. The conductive line 409 crosses the conductive patterns 216, 235, and 240 and the gates 303 and 312.

The conductive lines 412-415 extend in x direction and are separate from each other in y direction. As shown in FIG. 11A, the conductive line 412 couples to the conductive patterns 211 and 214 through the vias VD10 and VD13. The conductive line 412 further couples to the gates 308 and 310 through the vias VG8 and VG10. In some embodiments, the conductive line 412 receives the supply power VSS for the conductive patterns 211 and 214 and the gates 308 and 310. The configurations of the conductive lines 413-415 are similar to that of the conductive line 412. Thus, the repetitious descriptions are omitted herein. In some embodiments, the conductive lines 413-414 output the supply voltage VDD to the integrated circuit 100, and the conductive line 415 receives the supply voltage VSS for the integrated circuit 100.

The conductive segment 503 overlaps the conductive patterns 240-241 and crosses the conductive lines 403a, 404a, 405a, and 407-409.

For illustration, the vias VG23-VG24 overlap the active areas 130, and 110-120 separately. The via VG23 couples gate 325 to the conductive line 407. The via VM29 couples the conductive line 407 to the conductive segment 503. The via VM33 couples the conductive segment 503 to the conductive line 405a. The via VG25 couples the gate 326 to the conductive line 405a. Accordingly, the gate 325 is coupled to the gate 326. In addition, the via VG24 couples the gate 303 to the conductive line 403a.

The via VD39 couples the conductive pattern 240 to the conductive line 409. The via VD42 couples the conductive pattern 241 to the conductive line 404a.

Compared with the configurations of FIG. 10A, the embodiments of FIG. 11A further save the routing resources of metal layers in the second layer by not implementing the conductive segment 505.

Figure 11B:
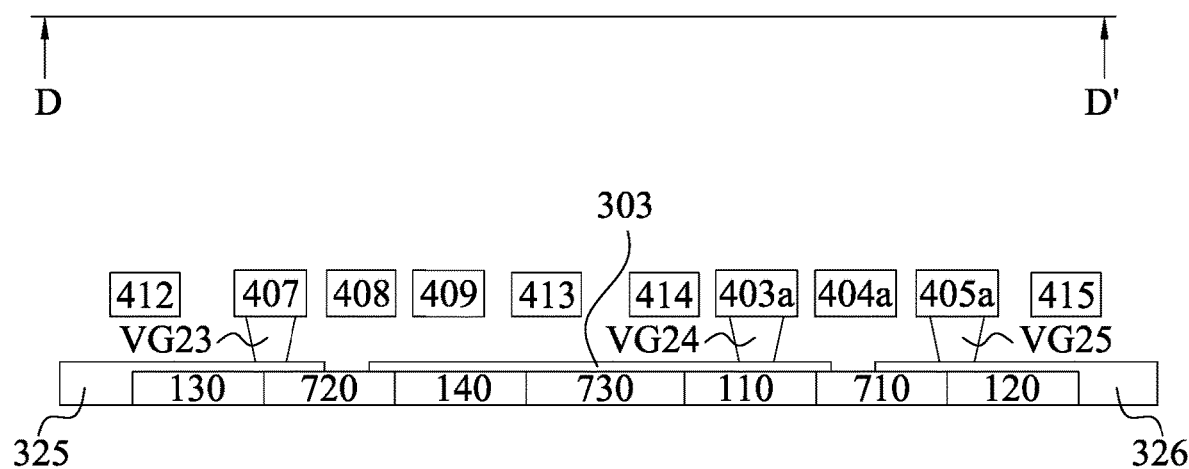
FIG. 11B is a cross-sectional diagram of the integrated circuit corresponding to part of FIG. 11A, in accordance with various embodiments.

Reference is now to FIG. 11B. FIG. 11B is cross-sectional diagram of the integrated circuit 100 corresponding to part of FIG. 11A along line DD', in accordance with various embodiments. As shown in FIG. 11B, the STI 720 is interposed between the active areas 130-140, the STI 730 is interposed between the active areas 110 and 140, and the STI 710 is interposed between the active areas 110-112. The gate 325 overlaps the active area 130 and the STI 720. The gate 303 overlaps the active areas 110 and 140 and the STIs 710 and 730. The conductive lines 403a, 404a, 405a, 407-409, and 412-415 are arranged in the layer above the gates 303, 325 and 326. The conductive lines 403a is coupled to the gate 303 through the via VG24. The conductive lines 405a is coupled to the gate 326 through the via VG25. The conductive lines 407 is coupled to the gate 325 through the via VG23.

The configurations of FIGS. 11A-11B are given for illustrative purposes. Various implementations of FIGS. 11A-11B are within the contemplated scope of the present disclosure. For example, in some embodiments, the conductive line 407 does not overlap the gates 307-308.

Figure 12:
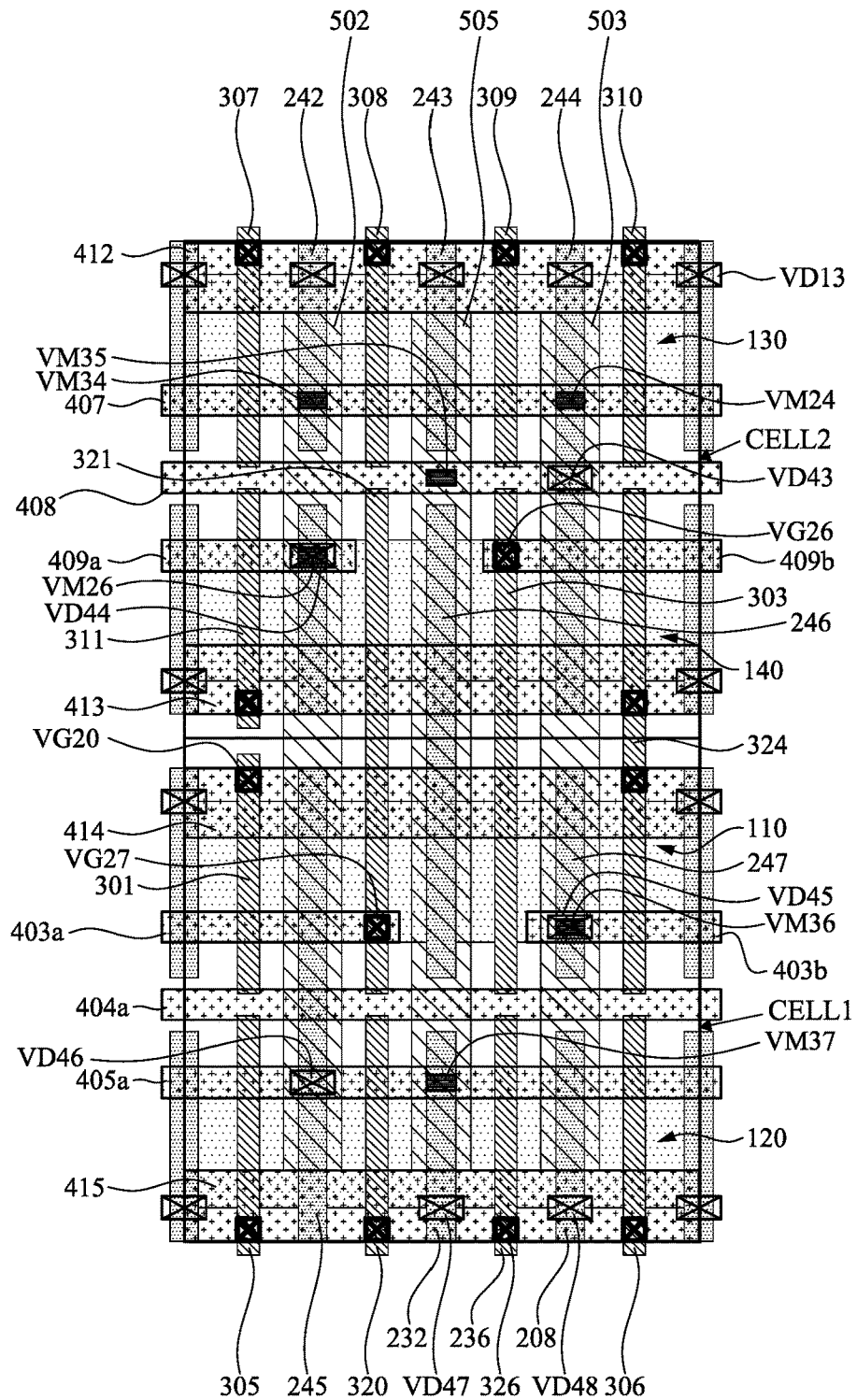
FIG. 12 is an another layout diagram in the plan view of part of the integrated circuit corresponding to part of FIG. 1, in accordance with various embodiments.

Reference is now made to FIG. 12. FIG. 12 is an another layout diagram in the plan view of part of the integrated circuit 100 corresponding to part of FIG. 1, in accordance with various embodiments. With respect to the embodiments of FIGS. 2A-11B, like elements in FIG. 12 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 12.

Compared with the embodiments of FIG. 11A, instead of having the conductive patterns 211, 235-237, 240-241 and the corresponding structures for routing, the integrated circuit 100 further includes conductive patterns 242-247, the conductive patterns 201, 206, 208, 210, 215, and 232, the gates 301, 305, 307, 311, 320-321, conductive lines 409a-409b, the conductive lines 403b, the conductive segments 502 and 505, vias VD43-VD48, VG26-VG28, VM34-VM37, and the vias VG7, VG9, VD1, VD5, VD9, and VD14. The conductive patterns 242-247 are configured with respect to, for example, the conductive pattern 240 of FIG. 11A. The conductive lines 409a-409b are configured with respect to, for example, the conductive line 409 of FIG. 11A. The vias VD43-VD48 are configured with respect to, for example, the via VD42 of FIG. 11A. The vias VG26-VG28 are configured with respect to, for example, the via VG24 of FIG. 11A. The vias VM34-VM37 are configured with respect to, for example, the via VM29 of FIG. 11A.

Furthermore, compared with the embodiments of FIGS. 2-11B, instead of having a conductivity of p type, the active area 110 has a conductivity of n type in the embodiments of FIG. 12.

In some embodiments, the portion of the gate 303 above the active area 140 corresponds to the gate of the transistor M1, and another portion of the gate 303 above the active area 140 corresponds to the gate of the transistor M1. The portion of the gate 321 above the active area 140 corresponds to the gate of the transistor M2, and another portion of the gate 321 above the active area 110 corresponds to the gate of the transistor M4.

In some embodiments, the conductive pattern 242 corresponds to the source/drain of the transistor M2. The conductive pattern 244 corresponds to the drain/source of the transistor M1. The conductive pattern 245 corresponds to the drain/source of the transistor M4. The conductive pattern 246 corresponds to the sources/drains of the transistors M1, M3 and M4, and the drain/source of the transistor M2. The conductive pattern 247 corresponds to the drain/source of the transistor M3.

The conductive patterns 242-247 extend in y direction. The conductive pattern 242 is arranged between the gates 307, 308, 311, and 321. The conductive pattern 243 is arranged between the gates 308-309. The conductive pattern 244 is between the gates 303, 309-310, and 324. The conductive pattern 245 is arranged between the gates 301, 305, 308 and 320. The conductive pattern 246 is arranged between the gates 303 and 321. The conductive pattern 247 is arranged between the gates 303 and 324.

As shown in FIG. 12, the conductive line 403a crosses the conductive patterns 201 and 245 and the gates 301 and 321, and the conductive line 403b crosses the conductive patterns 205 and 247 and the gate 324. The conductive line 404a crosses the conductive pattern 245. The conductive line 405a crosses the conductive patterns 206, 208-209, 232, and 245 and the gates 305-306, 320 and 326. The conductive line 407 crosses the conductive patterns 210, 214, and 242-244 and the gates 307-310. The conductive line 408 crosses the conductive pattern 244. The conductive line 409a crosses the conductive patterns 215 and 242 and the gate 311. The conductive line 409b crosses the conductive patterns 219 and 244 and the gates 303 and 324. The conductive line 412 crosses the conductive patterns 210, 214, and 242-244 and the gates 307-310. The conductive line 413 crosses the conductive patterns 215, 219, 242, 244, 246 and the gates 303, 311, 321, and 324. The conductive line 414 crosses the conductive patterns 201, 205, 219, and 245-247 and the gates 301, 303, 321, and 324. The conductive line 415 crosses the conductive patterns 206, 208-209, 232, and 245 and the gates 305-306, 320, and 326.

The conductive segment 502 overlaps the conductive patterns 242 and 245 and crosses the conductive lines 403a, 404a, 405a, 407-408, and 409a. The conductive segment 503 overlaps the conductive patterns 208, 244 and 247 and crosses the conductive lines 403b, 404a, 405a, 407-408, and 409b. The conductive segment 505 overlaps the conductive patterns 232, 243, and 246 and crosses the conductive lines 404a, 405a and 407-408.

The via VG26 is coupled between the conductive line 409b and the gate 303. The via VG27 is coupled between the conductive line 403a and the gate 321. In some embodiments, the via VG26 overlaps the active area 140. The via VG27 overlaps the active area 110.

The via VD47 couples the conductive pattern 232 to the conductive line 415. The via VD48 couples the conductive pattern 208 to the conductive line 415. In some embodiments, the conductive line 415 outputs the supply voltage VDD or the supply voltage VSS to the conductive patterns 208 and 232.

With continued reference to FIG. 11A, the via VD43 couples the conductive pattern 244 to the conductive line 408. The via VM35 couples the conductive line 408 to the conductive segment 505. The via VM37 couples the conductive segment 505 to the conductive line 405a. The via VD46 couples the conductive line 405a to the conductive pattern 245. Accordingly, the conductive pattern 244 is coupled to the conductive pattern 245.

The via VD44 couples the conductive pattern 242 to the conductive line 409a. The via VM26 couples the conductive line 409a to the conductive segment 502. The via VM34 couples the conductive segment 502 to the conductive line 407. The via VM24 couples the conductive line 407 to the conductive segment 503. The via VM36 couples the conductive segment 503 to the conductive line 403b. The via VD45 couples the conductive line 403b to the conductive pattern 247. Accordingly, the conductive pattern 242 is coupled to the conductive pattern 247.

The configurations of FIG. 12 are given for illustrative purposes. Various implementations of FIG. 12 are within the contemplated scope of the present disclosure. For example, in some embodiments, the conductive line 404a is not included in the embodiments of FIG. 12.

Figure 13:
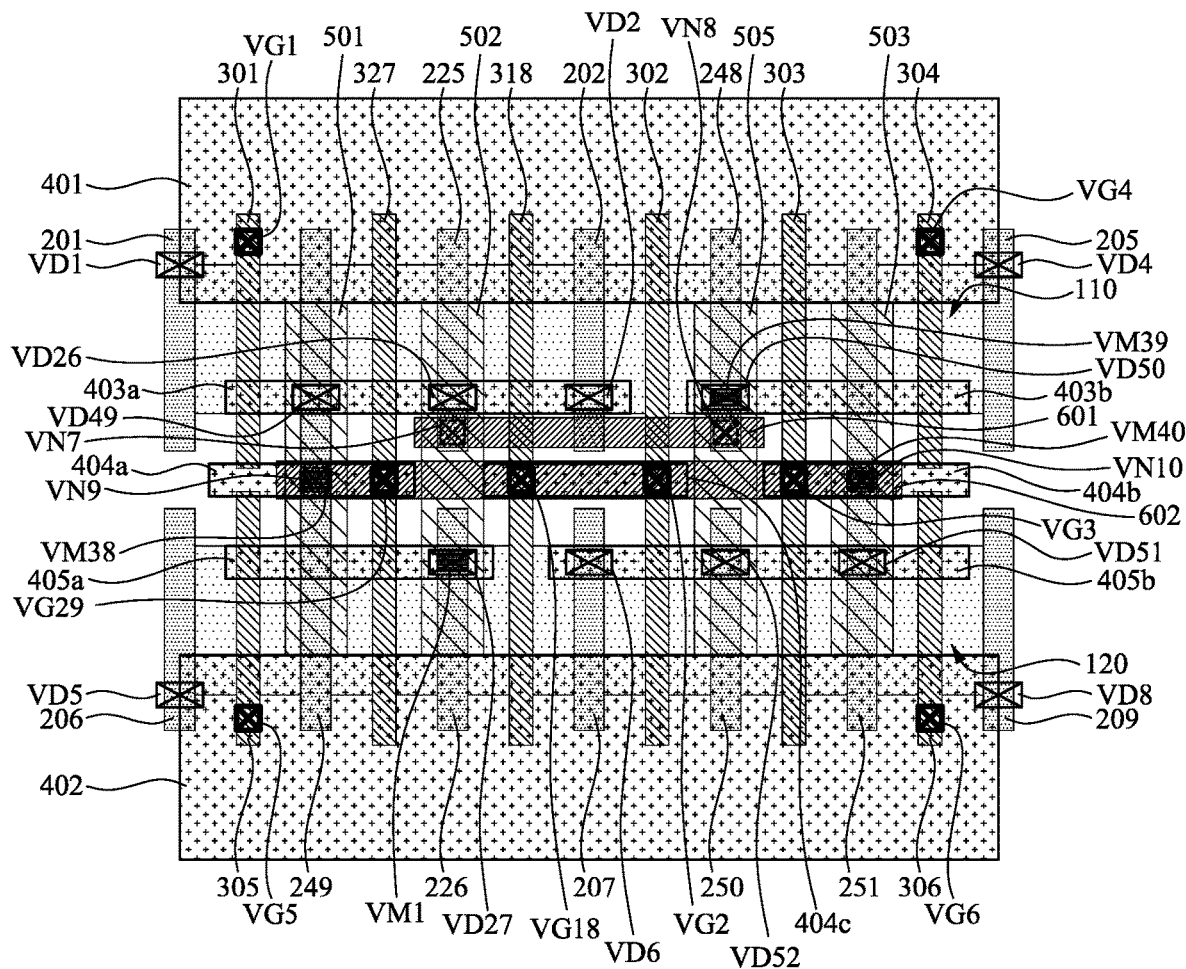
FIG. 13 is an another layout diagram in the plan view of part of the integrated circuit corresponding to part of FIG. 1, in accordance with various embodiments.

Reference is now made to FIG. 13. FIG. 13 is an another layout diagram in the plan view of part of the integrated circuit 100 corresponding to part of FIG. 1, in accordance with various embodiments. With respect to the embodiments of FIG. FIGS. 2A-12, like elements in FIG. 13 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 13.

Compared with the embodiments of FIG. 6, instead of having the conductive patterns 203 and 208, the conductive segment 504, and corresponding structures for routing, the integrated circuit 100 further includes conductive patterns 248-251, gate 327, the conductive segment 505, vias VD49-VD51, VG29, VM38-VM40, and VN7-VN10. The conductive patterns 248-251 are configured with respect to, for example, the conductive pattern 203 of FIG. 6. The gate 327 is configured with respect to, for example, the gate 318 of FIG. 6. The vias VD49-VD51 are configured with respect to, for example, the via VD3 of FIG. 6. The vias VM38-VM40 are configured with respect to, for example, the via VM14 of FIG. 6. The vias VN7-VN10 are configured with respect to, for example, the via VN6 of FIG. 6.

In some embodiments, the portion of the gate 302 arranged above the active area 110 corresponds to the gate of the transistor M1 while the portion of the gate 302 arranged above the active area 120 is referred as a dummy gate. The portion of the gate 303 arranged above the active area 110 corresponds to the gate of the transistor M2 while the portion of the gate 303 arranged above the active area 120 is referred as a dummy gate. The portion of the gate 318 arranged above the active area 120 corresponds to the gate of the transistor M3 while the portion of the gate 318 arranged above the active area 110 is referred as a dummy gate. A portion of the gate 327 arranged above the active area 120 corresponds to the gate of the transistor M4 while another portion of the gate 327 arranged above the active area 110 is referred as a dummy gate.

In some embodiments, the conductive pattern 202 corresponds to the drain/source of the transistor M1. The conductive pattern 207 corresponds to the drain/source of the transistor M3. The conductive pattern 226 corresponds to the sources/drains of the transistors M3-M4. The conductive pattern 248 corresponds to the source/drain of the transistor M1 and the drain/source of the transistor M2. The conductive pattern 249 corresponds to the drain/source of the transistor M4. The conductive pattern 251 corresponds to the source/drain of the transistor M2.

The conductive patterns 248-251 extend in y direction. The conductive pattern 248 is arranged between the gates 302-303. The conductive pattern 249 is arranged between the gates 301, 305, and 327. The conductive pattern 250 is arranged between the gates 302-303. The conductive pattern 251 is arranged between the gates 303-304 and 306.

The gate 327 extends in y direction and is arranged interposed between the conductive patterns 225-226, and 249.

Compared with FIG. 6, the conductive line 403a further crosses the conductive pattern 249 and the gate 327. The conductive line 403b crosses the conductive patterns 248 and 251 and the gates 303-304. The conductive line 404a crosses the conductive pattern 249 and the gates 318 and 327. The conductive line 404b crosses the conductive pattern 251 and the gate 303. The conductive line 404c crosses the gates 302 and 318. The conductive line 405a crosses the conductive patterns 226 and 249 and the gates 305, 318 and 327. The conductive line 405b crosses the conductive patterns 207 and 250-251 and the gates 302-304.

The conductive segment 501 overlaps the conductive pattern 249 and crosses the conductive lines 403a, 404a, and 405a. The conductive segment 502 overlaps the conductive patterns 225-226 and crosses the conductive lines 403a and 405a. The conductive segment 503 overlaps the conductive pattern 251 and crosses the conductive lines 403b, 404b, and 405b. The conductive segment 505 overlaps the conductive patterns 248 and 250 and crosses the conductive lines 403b and 405b.

The via VG18 couples the gate 318 to the conductive line 404c while the via VG2 couples the gate 302 to the conductive line 404c. Accordingly, the gate 318 is coupled to the gate 302.

The via VG3 couples the gate 303 to the conductive line 404b. The via VM40 couples the conductive line 404b to the conductive segment 503. The via VN10 couples the conductive segment 503 to the conductive trace 602. The via VN9 couples the conductive trace 602 to the conductive segment 501. The via VM38 couples the conductive segment 501 to the conductive line 404a. The via VG29 couples the conductive line 404a to the gate 327. Accordingly, the gate 303 is coupled to the gate 327.

In some embodiments, the vias VG2-VG3, VG18, and VG29 overlap the shallow trench isolation region 710.

With continued reference to FIG. 13, the vias VD2, VD26 and VD49 couple the conductive patterns 202, 225, and 249 to the conductive line 403a separately. Accordingly, the conductive pattern 202 is coupled to the conductive pattern 249.

The vias VD6, and VD51-VD52 couple the conductive patterns 249, 251, and 250 to the conductive line 405b separately. Accordingly, the conductive pattern 251 is coupled to the conductive pattern 207.

The via VD50 couples the conductive pattern 248 to the conductive line 403b. The via VM39 couples the conductive line 403b to the conductive segment 505. The via VN8 couples the conductive segment 505 to the conductive trace 601. The via VN7 couples the conductive trace 601 to the conductive segment 502. The via VM1 couples the conductive segment 502 to the conductive line 405a. The via VD27 couples the conductive line 405a to the conductive pattern 226. Accordingly, the conductive pattern 248 is coupled to the conductive pattern 226.

The configurations of FIG. 13 are given for illustrative purposes. Various implementations of FIG. 13 are within the contemplated scope of the present disclosure. For example, in some embodiments, the conductive line 401 and/or conductive line 402 are coupled to another cell abutting the cell shown in the embodiments of FIG. 13.

Figure 14:
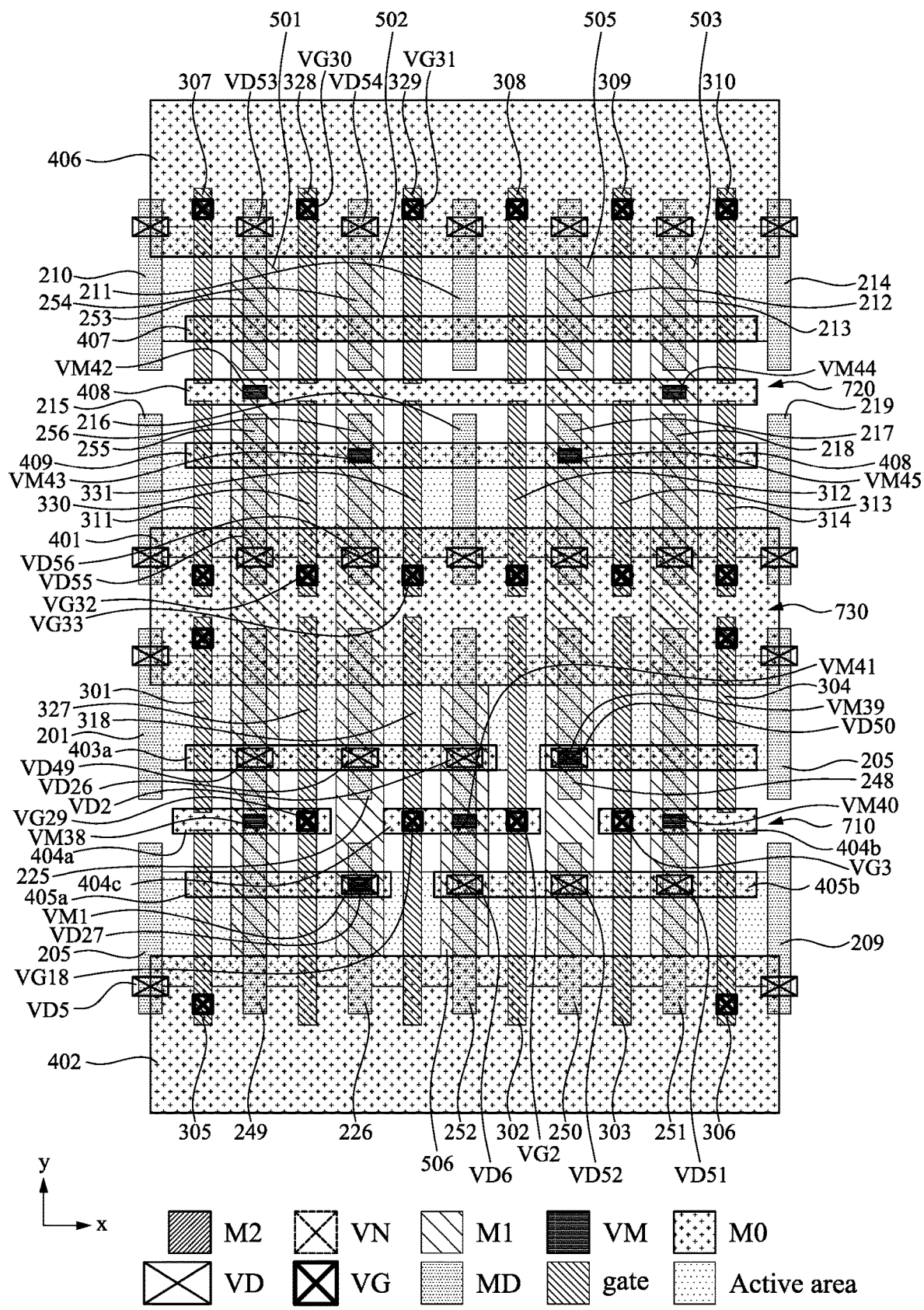
FIG. 14 is an another layout diagram in the plan view of part of the integrated circuit corresponding to part of FIG. 1, in accordance with various embodiments.

Reference is now made to FIG. 14. FIG. 14 is an another layout diagram in the plan view of part of the integrated circuit 100 corresponding to part of FIG. 1, in accordance with various embodiments. With respect to the embodiments of FIGS. 2A-13, like elements in FIG. 14 are designated with the same reference numbers for ease of understanding. The specific operations of similar elements, which are already discussed in detail in above paragraphs are omitted herein for the sake of brevity, unless there is a need to introduce the co-operation relationship with the elements shown in FIG. 14.

Compared with the embodiments of FIG. 3, instead of having the structures corresponding to the embodiments of FIG. 2A, the integrated circuit 100 includes structures corresponding to the embodiments of FIG. 13. Furthermore, compared with the embodiments of FIG. 13, instead of having the conductive traces 601-602 and the structures corresponding to the routing, the integrated circuit 100 further includes the structures included in the second cell, conductive patterns 252-256, gates 328-331, and vias VM42-VM45. The conductive patterns 252-256 are configured with respect to, for example, the conductive pattern 211 of FIG. 3. The gates 328-331 are configured with respect to, for example, the gate 307 of FIG. 3. The vias VM42-VM45 are configured with respect to, for example, the via VM1.

The corresponding relationships of the conductive patterns and the gates to the transistors M1-M4 in the embodiments of FIG. 14 are similar to that of the embodiments of FIG. 13. Thus, the repetitious discussions are omitted herein.

As shown in FIG. 14, the conductive patterns 252-256 extend in y direction and are separate from each other in both x and y directions. The conductive pattern 252 crosses the active areas 110-120. The conductive patterns 253-254 cross the active area 130, and the conductive patterns 255-256 cross the active area 140. The conductive pattern 253 is arranged interposed between the gates 307 and 328. The conductive pattern 254 is arranged interposed between the gates 328 and 329. The conductive pattern 255 is arranged interposed between the gates 311 and 330. The conductive pattern 256 is arranged interposed between the gates 330 and 331.

The gates 328-331 extend in y direction and are separate from each other in both x and y directions. The gates 328-329 cross the active area 130, and the gates 330-331 cross the active area 140. In some embodiments, as shown in FIG. 3, the gates 328 and 330 align with the gate 327, and the gates 329 and 331 align with the gate 318.

Compared with the embodiments of FIG. 3, the conductive line 407 further crosses the conductive patterns 253-254 and the gates 328-329. The conductive line 409 further crosses the conductive patterns 255-256 and the gates 330-331.

The conductive segment 501 overlaps the conductive patterns 249, 253 and 255 and crosses the conductive lines 401, 403a, 404a, 405a, 407-409. The conductive segment 502 overlaps the conductive patterns 225-226, 254 and 256 and crosses the conductive lines 401, 403a, 405a, and 407-409. The conductive segment 503 overlaps the conductive patterns 214, 218, and 251 and crosses the conductive lines 401, 403b, 404b, 405b, and 407-409. The conductive segment 505 overlaps the conductive patterns 212, 217, 248 and 250 and crosses the conductive lines 401, 403b, 405b, and 407-409. The conductive segment 506 overlaps the conductive pattern 252 and crosses the conductive lines 403a, 404c, and 405b.

The via VG2 couples the gate 302 to the conductive line 404c, and the via VG18 couples the gate 318 to the conductive line 404c. Accordingly, the gate 302 is coupled to the gate 318. In some embodiments, the via VM41 couples the conductive line 404c to the conductive segment 506. In such arrangements, the conductive segment 506 receives a signal for the gates 302 and 318.

The via VG3 couples the gate 303 to the conductive line 404b. The via VM40 couples the conductive line 404b to the conductive segment 503. The via VM44 couples the conductive segment 503 to the conductive line 408. The via VM 42 couples the conductive line 408 to the conductive segment 501. The via VM38 couples the conductive segment 501 to the conductive line 404a. The via VG29 couples the conductive line 404a to the gate 327. Accordingly. The gate 303 is coupled to the gate 327.

The vias VG30-VG31 couple the gates 328-329 to the conductive line 406. In some embodiments, the conductive line 406 also receives the supply voltage VSS for the gates 328-329. The vias VG32-33 couple the gates 330-331 to the conductive line 401. In some embodiments, the conductive line 401 also outputs the supply voltage VDD to the gates 330-331.

The vias VD53-VD54 couple the conductive patterns 253-254 to the conductive line 406. In some embodiments, the conductive line 406 also receives the supply voltage VSS for the conductive patterns 253-254. The vias VD55-VD56 couple the conductive patterns 255-256 to the conductive line 401. In some embodiments, the conductive line 401 also outputs the supply voltage VDD to the conductive patterns 255-256.

As shown in FIG. 14, the vias VD6, and VD51-VD52 couple the conductive patterns 252, 251, and 250 to the conductive line 405b separately. Accordingly, the conductive pattern 251 is coupled to the conductive pattern 252. Meanwhile, the vias VD2, VD26, and VD49 couple the conductive patterns 252, 225, and 249 to the conductive line 403b separately. Accordingly, the conductive pattern 252 is coupled to the conductive pattern 249.

The via VD50 couples the conductive pattern 248 to the conductive line 403b. The via VM39 couples the conductive line 403b to the conductive segment 505. The via VM45 couples the conductive segment 505 to the conductive line 409. The via VM43 couples the conductive line 409 to the conductive segment 502. The via VM1 couples the conductive segment 502 to the conductive line 405a. The via VD27 couples the conductive line 405a to the conductive pattern 226. Accordingly, the conductive pattern 248 is coupled to the conductive pattern 226.

Compared with the configurations of FIG. 13, the embodiments of FIG. 14 further save the routing resources of metal layers in the third layer by not implementing the conductive traces 601-602.

The configurations of FIG. 14 are given for illustrative purposes. Various implementations of FIG. 14 are within the contemplated scope of the present disclosure. For example, in some embodiments, the conductive line 401 of FIG. 14 is implemented by the conductive lines 413-414 of FIG. 12.

Figure 15:
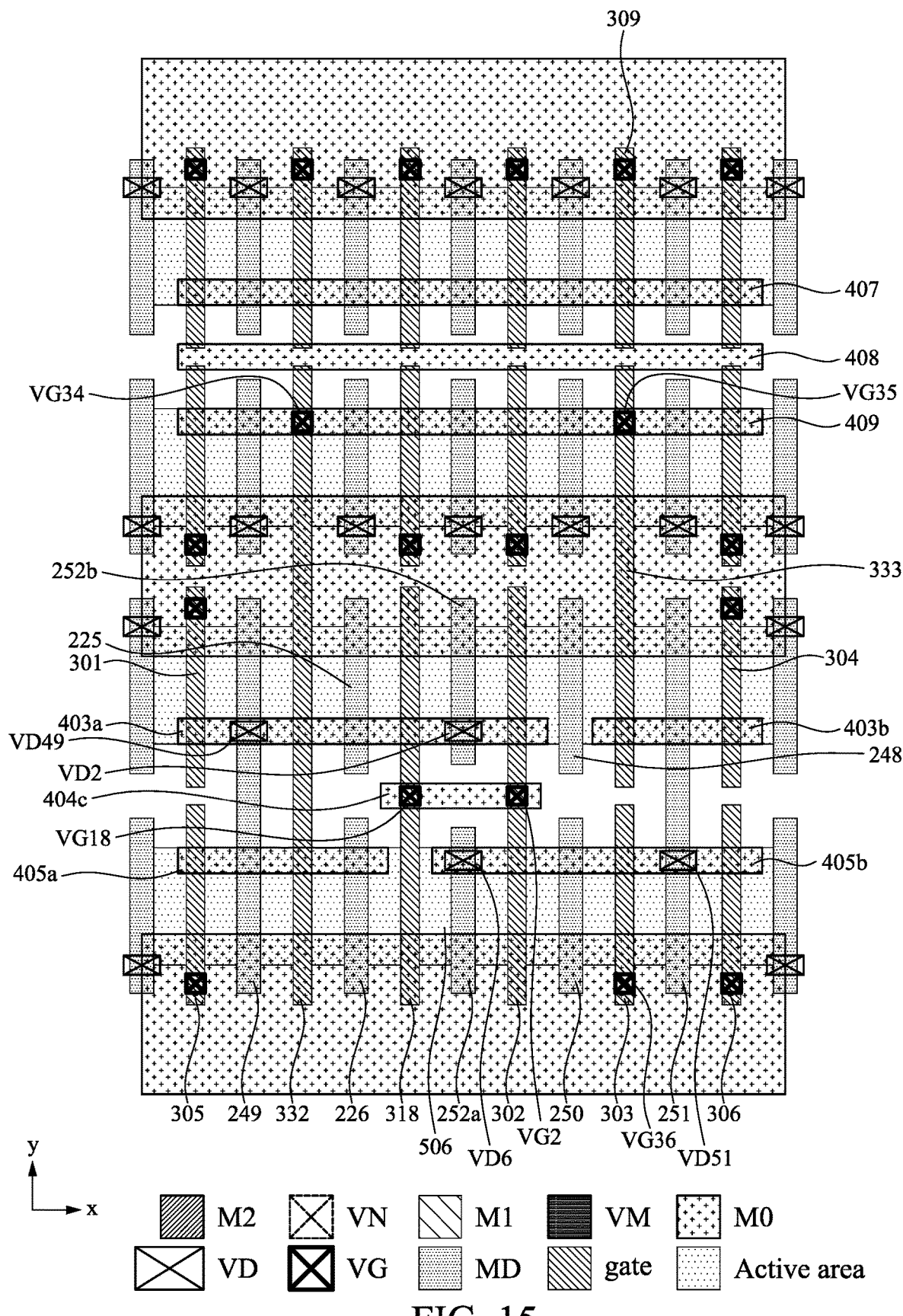
FIG. 15 is an another layout diagram in the plan view of part of the integrated circuit corresponding to part of FIG. 1, in accordance with various embodiments.

Reference is now made to FIG. 15. FIG. 15 is an another layout diagram in the plan view of part of the integrated circuit 100 corresponding to part of FIG. 1, in accordance with various embodiments. With respect to the embodiments of FIGS. 2A-14, like elements in FIG. 15 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 15.

Compared with the embodiments of FIG. 14, instead of having the gate 313, 327, and 330, the conductive lines 404a-404b, the conductive segments 501-503, and 505-506 and the corresponding structures, the integrated circuit 100 further includes conductive patterns 252a-252b, gates 332-333, and vias VG34-VG36. The gates 322-333 are configured with respect to, for example, the gate 327 of FIG. 14. The vias VG34-VG36 are configured with respect to, for example, the via VG2 of FIG. 3.

The conductive pattern 252a corresponds to the source/drain of the transistor M1. The conductive pattern 252b corresponds to the drain/source of the transistor M3. A portion of the gate 332 arranged above the active area 120 corresponds to the gate of the transistor M4 while another portion of the gate 332 arranged above the active areas 110 and 140 are configured as dummy gate portions. A portion of the gate 333 arranged above the active area 110 corresponds to the gate of the transistor M2 while another portion of the gate 333 arranged above the active area 140 is configured as dummy gate portions. The corresponding relationships between the other conductive patterns and the other gates and the transistors M1-M4 in the embodiments of FIG. 15 are similar to that of the embodiments of FIG. 14. Thus, the repetitious discussions are omitted herein.

The gates 332-333 extend in y direction and are separate from each other in both x and y directions. The gate 332 crosses the active area 110-120, and 140, and the gate 333 crosses the active areas 110 and 140. In some embodiments, as shown in FIG. 3, the gate 332 aligns with the gate 328, and the gate 333 aligns with the gate 309.

As shown in FIG. 15, the conductive line 401 further crosses the gates 332-333. The conductive line 403a crosses the conductive patterns 225 and 252a and the gates 301-302, 318 and 332. The conductive line 403b crosses the conductive pattern 251 and the gates 304 and 333. The conductive line 404c crosses the gates 302 and 318. The conductive line 405a crosses the conductive patterns 226 and 249 and the gates 305 and 332. The conductive line 405b crosses the conductive patterns 250-251, and 252a and the gates 302-303 and 306. The conductive line 409 further crosses the gates 332-333.

The gates 318 and 302 are coupled to each other through the vias VG2, VG18 and the conductive line 404c. The via VG34 couples the gate 332 to the conductive line 409, and the via VG35 couples the gate 333 to the conductive line 409. Accordingly, the gate 332 is coupled to the gate 333.

The via VG36 couples the gate 303 to the conductive line 402. In some embodiments, the conductive line 402 receives the supply voltage VSS for the gate 303.

In some embodiments, the via VG34-VG35 overlap the active area 140, while the vias VG2 and VG18 overlap the shallow trench isolation region 710.

The conductive patterns 251 and 252a are coupled to each other through the vias VD6 and VD51 and the conductive line 405b. The conductive patterns 249 and 252b are coupled to each other through the vias VD2 and VD49 and the conductive line 403a.

Compared with the configurations of FIG. 14, the embodiments of FIG. 15 further save the routing resources of metal layers in the second layer by not implementing the conductive segments 501-503 and 505-506.

The configurations of FIG. 15 are given for illustrative purposes. Various implementations of FIG. 15 are within the contemplated scope of the present disclosure. For example, in some embodiments, the conductive line 401 of FIG. 15 is implemented by the conductive lines 413-414 of FIG. 12.

Figure 16:
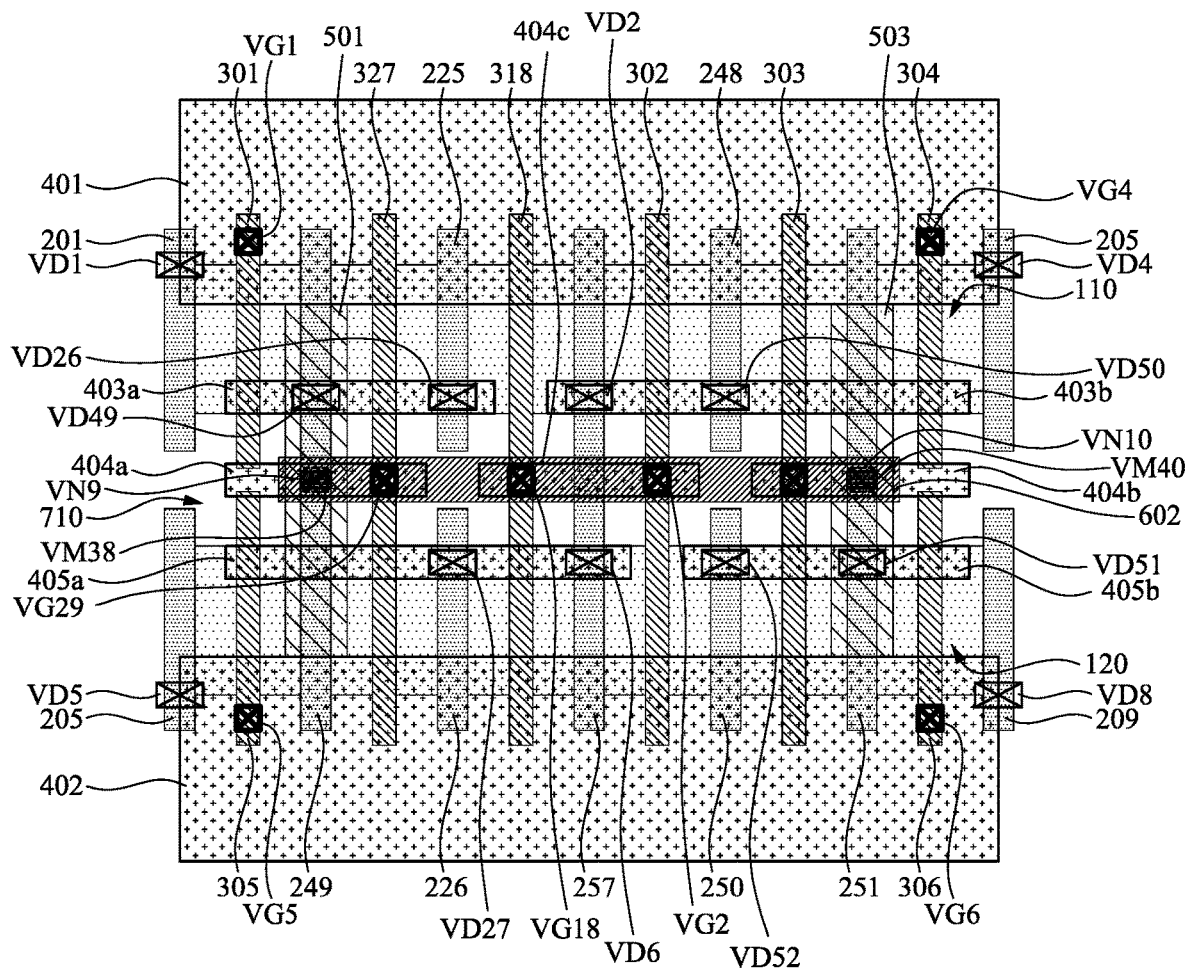
FIG. 16 is an another layout diagram in the plan view of part of the integrated circuit corresponding to part of FIG. 1, in accordance with various embodiments.

Reference is now made to FIG. 16. FIG. 16 is an another layout diagram in the plan view of part of the integrated circuit 100 corresponding to part of FIG. 1, in accordance with various embodiments. With respect to the embodiments of FIGS. 2A-15, like elements in FIG. 16 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 16.

Compared with FIG. 13, instead of having the conductive patterns 202 and 207, the conductive segments 502 and 505, the conductive trace 601 and the corresponding structures for routing, the integrated circuit 100 further includes a conductive pattern 257. In some embodiments, the conductive pattern 257 is configured with respect to, for example, the conductive pattern 252 of FIG. 15.

In some embodiments, the portion of the gate 303 arranged above the active area 110 corresponds to the gate of the transistor M2 while the portion of the gate 303 arranged above the active area 120 is referred as a dummy gate. The portion of the gate 302 arranged above the active area 120 corresponds to the gate of the transistor M3 while the portion of the gate 302 arranged above the active area 110 is referred as a dummy gate. The portion of the gate 318 arranged above the active area 110 corresponds to the gate of the transistor M1 while the portion of the gate 302 arranged above the active area 120 is referred as a dummy gate. The portion of the gate 327 arranged above the active area 120 corresponds to the gate of the transistor M4 while the portion of the gate 327 arranged above the active area 110 is referred as a dummy gate.

In some embodiments, the conductive pattern 225 corresponds to the drain/source of the transistor M1. The conductive pattern 257 corresponds to the sources/drains of the transistors M1 and M3. The conductive pattern 250 corresponds to the drain/source of the transistor M3. The conductive pattern 248 corresponds to the drain/source of the transistor M2. The conductive pattern 251 corresponds to the source/drain of the transistor M2. The conductive pattern 226 corresponds to the source/drain of the transistor M4. The conductive pattern 249 corresponds to the drain/source of the transistor M4.

As shown in FIG. 16, the conductive pattern 257 extends in in y direction. The conductive pattern 257 is arranged interposed between the gates 302 and 318.

The configurations of the metal routing between the gates 302-303, 318, and 327 are similar to that of the embodiments shown in FIG. 13. Thus, the repetitious discussions are omitted herein.

The conductive patterns 251 and 250 are coupled to each other through the vias VD51-VD52 and the conductive line 405b. The conductive patterns 248 and 257 are coupled to each other through the vias VD2 and VD50 and the conductive line 403b. The conductive patterns 226 and 257 are coupled to each other through the vias VD6 and VD27 and the conductive line 405a. The conductive patterns 225 and 249 are coupled to each other through the vias VD26 and VD49 and the conductive line 403a.

Compared with the configurations of FIG. 13, the embodiments of FIG. 16 further save the routing resources of metal layers in both the second and third layers by not implementing the conductive segments 502 and 505 and the conductive trace 601.

The configurations of FIG. 16 are given for illustrative purposes. Various implementations of FIG. 16 are within the contemplated scope of the present disclosure. For example, in some embodiments, the conductive line 401 and/or conductive line 402 are coupled to another cell abutting the cell shown in the embodiments of FIG. 16.

Figure 17:
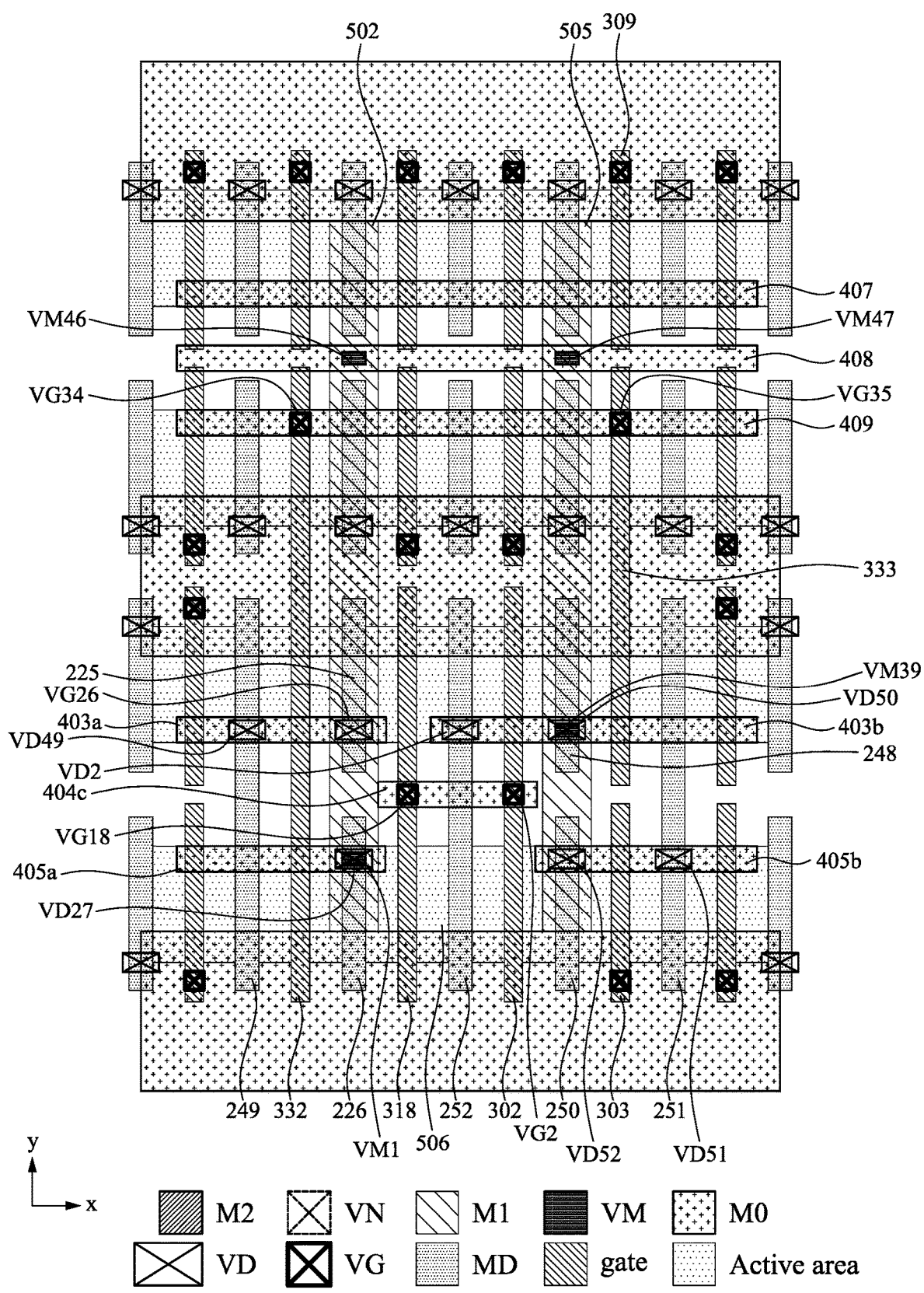
FIG. 17 is an another layout diagram in the plan view of part of the integrated circuit corresponding to part of FIG. 1, in accordance with various embodiments.

Reference is now made to FIG. 17. FIG. 17 is an another layout diagram in the plan view of part of the integrated circuit 100 corresponding to part of FIG. 1, in accordance with various embodiments. With respect to the embodiments of FIGS. 2A-16, like elements in FIG. 17 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 17.

Compared with the embodiments of FIG. 15, the integrated circuit 100 further includes via VM46-VM47 and the conductive segments 502 and 505. In some embodiments, the vias VM46-VM47 are configured with respect to, for example, the via VM1.

In some embodiments, the portion of the gate 333 arranged above the active area 110 corresponds to the gate of the transistor M2 while the portion of the gate 333 arranged above the active area 140 is referred as a dummy gate. The portion of the gate 302 arranged above the active area 120 corresponds to the gate of the transistor M3 while the portion of the gate 302 arranged above the active area 110 is referred as a dummy gate. The portion of the gate 318 arranged above the active area 110 corresponds to the gate of the transistor M1 while the portion of the gate 318 arranged above the active area 120 is referred as a dummy gate. The portion of the gate 332 arranged above the active area 120 corresponds to the gate of the transistor M4 while another portion of the gate 332 arranged above the active areas 110 and 140 is referred as a dummy gate portion.

In some embodiments, the conductive pattern 225 corresponds to the drain/source of the transistor M1. The conductive pattern 252 corresponds to the sources/drains of the transistors M1 and M3. The conductive pattern 250 corresponds to the drain/source of the transistor M3. The conductive pattern 226 corresponds to the source/drain of the transistor M4. The conductive pattern 249 corresponds to the drain/source of the transistor M4. The conductive pattern 248 corresponds to the drain/source of the transistor M2. The conductive pattern 251 corresponds to the source/drain of the transistor M2.

As shown in FIG. 17, compared with FIG. 15, the conductive line 403a crosses the conductive pattern 225 and the gate 332. The conductive line 403b further crosses the conductive pattern 252 and the gate 302. The conductive line 405b does not cross the conductive pattern 252a or the gate 302.

For illustration, the via VD2 couples the conductive pattern 252 to the conductive line 404b, and the via VD50 couples the conductive pattern 248 to the conductive line 403b. The via VM39 couples the conductive line 403b to the conductive segment 505. The via VM47 couples the conductive segment 505 to the conductive line 408. The via VM46 couples the conductive line 408 to the conductive segment 502. The via VM1 couples the conductive segment 502 to the conductive line 405a. The via VD27 couples the conductive line 405a to the conductive pattern 226. Accordingly, the conductive patterns 248 and 252 are coupled to the conductive pattern 226.

The conductive patterns 250-251 are coupled to each other through the vias VD51-VD52 and the conductive line 405b. The conductive patterns 225 and 249 are coupled to each other through the vias VD26 and VD49 and the conductive line 403a.

The configurations of FIG. 17 are given for illustrative purposes. Various implementations of FIG. 17 are within the contemplated scope of the present disclosure. For example, in some embodiments, the conductive line 401 of FIG. 17 is implemented by the conductive lines 413-414 of FIG. 12.

Figure 18:
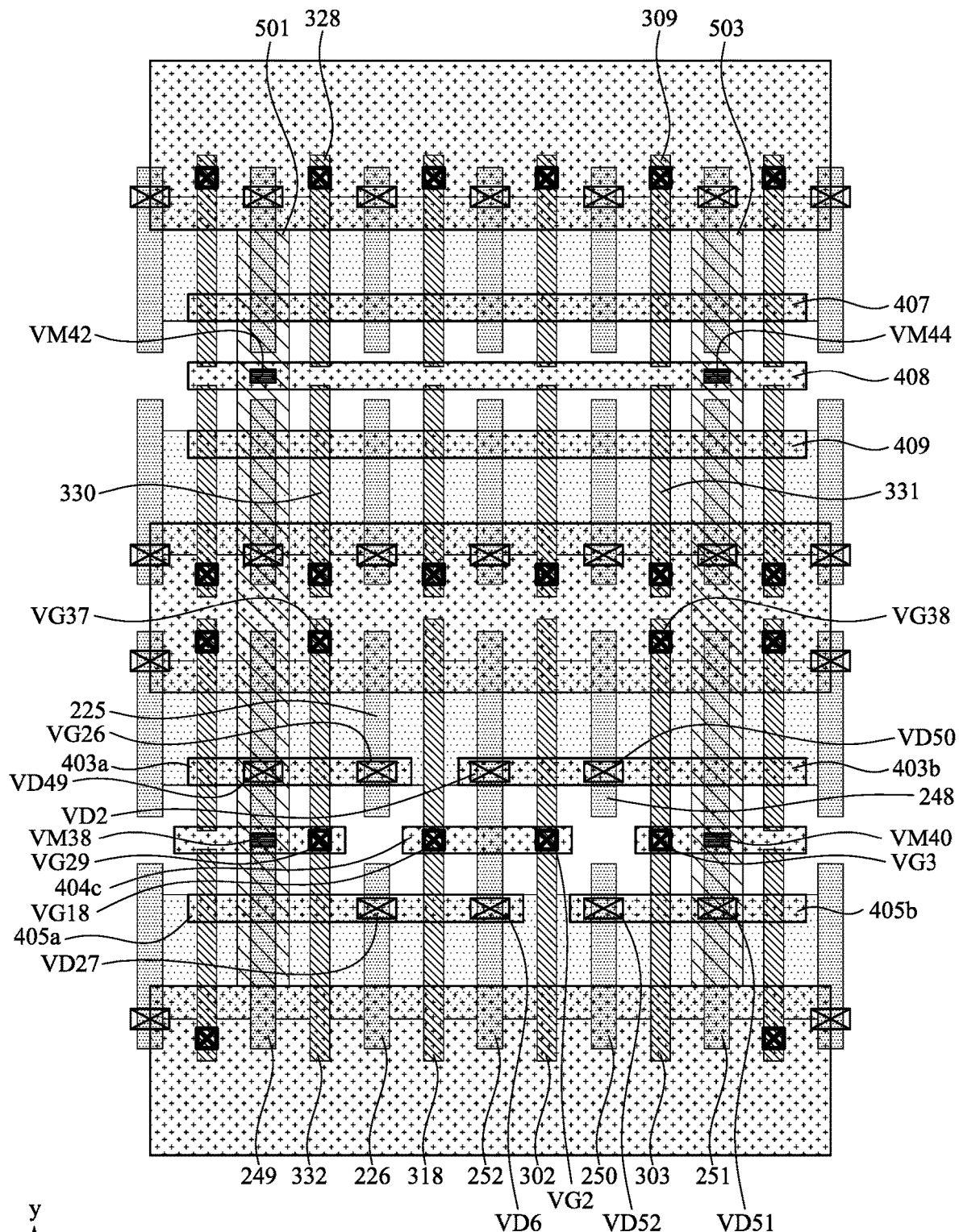
FIG. 18 is an another layout diagram in the plan view of part of the integrated circuit corresponding to part of FIG. 1, in accordance with various embodiments.

Reference is now made to FIG. 18. FIG. 18 is an another layout diagram in the plan view of part of the integrated circuit 100 corresponding to part of FIG. 1, in accordance with various embodiments. With respect to the embodiments of FIGS. 2A-17, like elements in FIG. 18 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 18.

Compared with the embodiments of FIG. 17, instead of having the gate 333, the conductive segments 502 and 505 and the corresponding structures, the integrated circuit 100 further includes the gates 313 and 330, the conductive lines 404a-404b, the conductive segments 501 and 503, and vias VG37-VG38. The vias VG37-VG38 are configured with respect to, for example, the via VG1 of FIG. 16.

In some embodiments, the portion of the gate 303 arranged above the active area 110 corresponds to the gate of the transistor M1 while another portion of the gate 303 arranged above the active area 120 is configured as dummy gate portions. The portion of the gate 302 arranged above the active area 120 corresponds to the gate of the transistor M3 while another portion of the gate 302 arranged above the active area 110 is configured as dummy gate portions. The portion of the gate 318 arranged above the active area 110 corresponds to the gate of the transistor M1 while another portion of the gate 318 arranged above the active area 120 is configured as dummy gate portions. The portion of the gate 332 arranged above the active area 120 corresponds to the gate of the transistor M4 while another portion of the gate 332 arranged above the active area 110 is configured as dummy gate portions.

The corresponding relationships of the conductive patterns to the terminals of the transistors M1-M4 in the embodiments of FIG. 18 are similar to that of the embodiments of FIG. 17. Thus, the repetitious discussions are omitted herein.

For illustration, the gate 332 is shortened and does not overlap the active area 140. The gate 303 extends in y direction and overlaps the active area 110.

As shown in FIG. 18, compared with FIG. 17, the conductive line 403a does not cross the conductive pattern 252 or the gate 318. The conductive line 403b further crosses the conductive pattern 252 and the gate 302. The conductive line 404a crosses the gate 332. The conductive line 404c crosses the conductive pattern 251 and the gate 303. The conductive line 405a further crosses the conductive pattern 252 and the gate 318. The conductive line 405b does not cross the conductive pattern 252 and the gate 302.

The conductive segment 501 overlaps the conductive patterns 253, 255, and 249 and crosses the conductive lines 401, 403a, 404a, 405a, and 407-409. The conductive segment 503 overlaps the conductive patterns 212, 217, and 251 and crosses the conductive lines 401, 403b, 404b, 405b, and 407-409.

For illustration, the vias VG37-VG38 couple the gates 332 and 303 to the conductive line 401 respectively. In some embodiments, the conductive line 401 also outputs the supply voltage VDD to the gates 332 and 303.

The via VG3 couples the gate 303 to the conductive line 404b. The via VM40 couples the conductive line 404b to the conductive segment 503. The via VM44 couples the conductive segment 503 to the conductive line 408. The via VM42 couples the conductive line 408 to the conductive segment 501. The via VM38 couples the conductive segment 501 to the conductive line 404b. The via VG3 couples the conductive line 404b to the gate 332. Accordingly, the gate 303 is coupled to the gate 332.

The vias VD26 and VD49 couple the conductive patterns 225 and 249 to the conductive line 403a respectively. Accordingly, the conductive pattern 225 is coupled to the conductive pattern 249. The vias VD2 and VD50 couple the conductive patterns 248 and 252 to the conductive line 403b respectively. Accordingly, the conductive pattern 248 is coupled to the conductive pattern 252. The vias VD27 and VD6 couple the conductive patterns 226 and 252 to the conductive line 405a respectively. Accordingly, the conductive pattern 226 is coupled to the conductive pattern 252. The vias VD51 and VD52 couple the conductive patterns 251 and 250 to the conductive line 405b respectively. Accordingly, the conductive pattern 250 is coupled to the conductive pattern 251.

The configurations of FIG. 18 are given for illustrative purposes. Various implementations of FIG. 18 are within the contemplated scope of the present disclosure. For example, in some embodiments, the conductive line 401 of FIG. 18 is implemented by the conductive lines 413-414 of FIG. 12.

Figure 19:
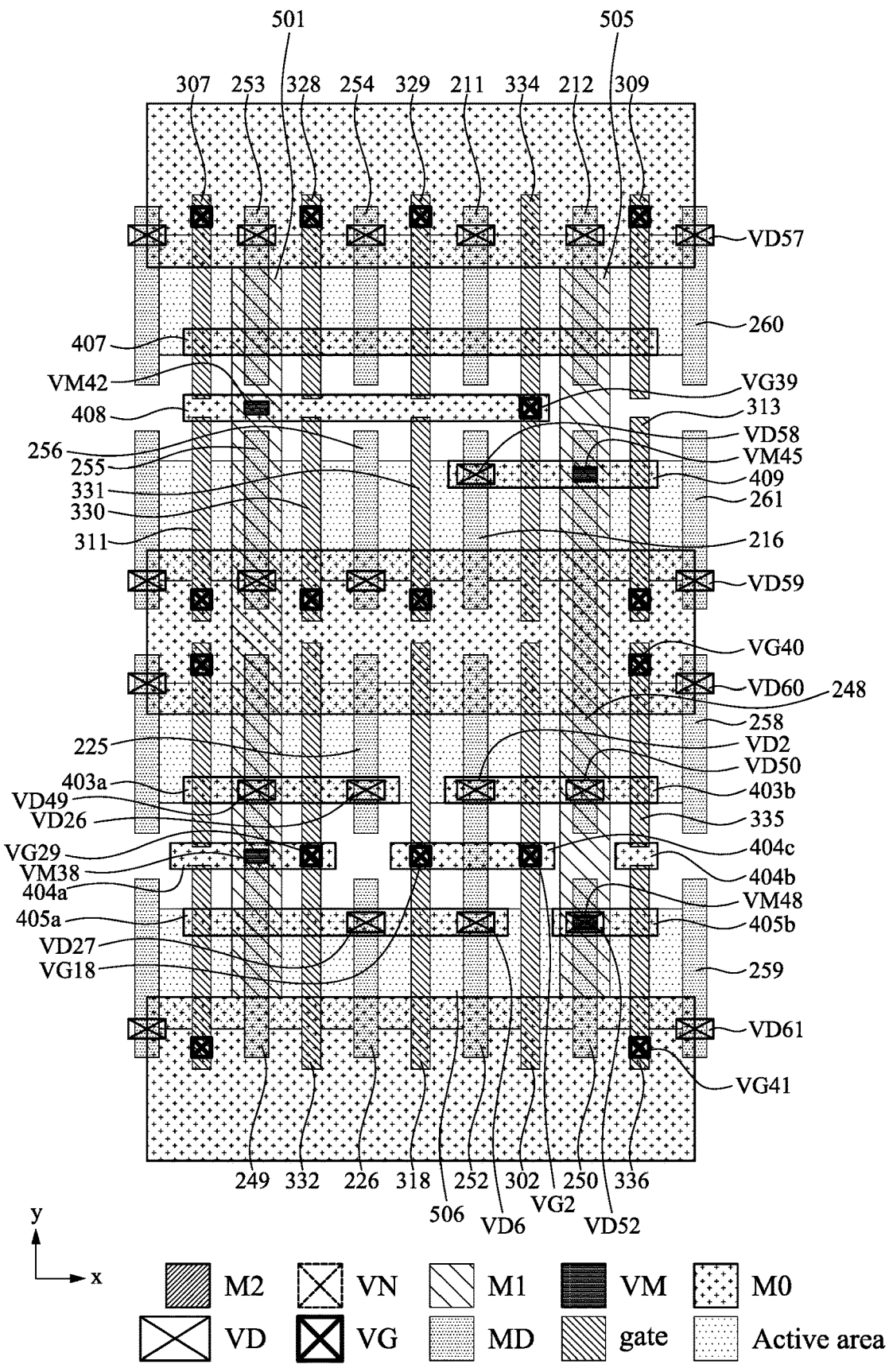
FIG. 19 is an another layout diagram in the plan view of part of the integrated circuit corresponding to part of FIG. 1, in accordance with various embodiments.

Reference is now made to FIG. 19. FIG. 19 is an another layout diagram in the plan view of part of the integrated circuit 100 corresponding to part of FIG. 1, in accordance with various embodiments. With respect to the embodiments of FIGS. 2A-18, like elements in FIG. 19 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 19.

Compared with the embodiments of FIG. 18, instead of having the conductive patterns 205, 209, 214, 218, 251, the gates 304, 306, 310, 314, the conductive segment 503 and corresponding vias for routing, the integrated circuit 100 further includes conductive patterns 258-261, gates 334-336, vias VD57-VD61, VG39-VG41, and VM48. The conductive patterns 258-261 are configured with respect to, for example, the conductive pattern 205 of FIG. 14. The gates 334-336 are configured with respect to, for example, the gate 302. The vias VD57-VD61 are configured with respect to, for example, the via VD5 of FIG. 16.

In some embodiments, the portion of the gate 302 arranged above the active area 120 corresponds to the gate of the transistor M3 while the portion of the gate 302 arranged above the active area 110 is referred as a dummy gate. The portion of the gate 318 arranged above the active area 110 corresponds to the gate of the transistor M1 while the portion of the gate 318 arranged above the active area 120 is referred as a dummy gate. The portion of the gate 332 arranged above the active area 120 corresponds to the gate of the transistor M4 while the portion of the gate 332 arranged above the active area 110 is referred as a dummy gate. The portion of the gate 334 arranged above the active area 140 corresponds to the gate of the transistor M2 while another portion of the gate 334 arranged above the active areas 130 is referred as a dummy gate portion.

In some embodiments, the conductive pattern 225 corresponds to the drain/source of the transistor M1. The conductive pattern 252 corresponds to the sources/drains of the transistors M1 and M3. The conductive pattern 250 corresponds to the drain/source of the transistor M3. The conductive pattern 226 corresponds to the source/drain of the transistor M4. The conductive pattern 249 corresponds to the drain/source of the transistor M4. The conductive pattern 248 corresponds to the drain/source of the transistor M2. The conductive pattern 216 corresponds to the source/drain of the transistor M2.

For illustration, compared with FIG. 18, the conductive pattern 248 extends in y direction and overlaps the active areas 110 and 140. The conductive patterns 258-261 extend in y direction. The conductive pattern 258 crosses the active area 110 and is arranged next to the gate 335. The conductive pattern 259 crosses the active area 120 and is arranged next to the gate 336. The conductive pattern 260 crosses the active area 130 and is arranged next to the gate 309. The conductive pattern 261 crosses the active area 140 and is arranged next to the gate 313.

The gates 334-336 extend in y direction. The gate 334 crosses the active areas 130-140 and is arranged interposed between the conductive patterns 211-212, and 216-217. In some embodiments, the gate 334 aligns with the gate 302 in y direction. The gate 335 is arranged next to the conductive pattern 248 and crosses the active area 110. The gate 336 is arranged next to the conductive pattern 250 and crosses the active area 120.

Compared with FIG. 18, the conductive line 401 further crosses the conductive pattern 248 and further overlaps the conductive patterns 258 and 261, and the gate 335. The conductive line 402 further overlaps the conductive pattern 259 and the gate 336. The conductive line 403b crosses the conductive patterns 248 and 252 and the gates 302 and 336. The conductive line 404b does not cross any conductive pattern or gate. The conductive line 405b crosses the conductive pattern 250 and the gate 336. The conductive lines 407-408 further cross the gate 334. The conductive line 409 crosses the conductive patterns 216-217 and the gates 313 and 334.

The via VG39 couples the gate 334 to the conductive line 408. The via VM42 couples the conductive line 408 to the conductive segment 501. The via VM38 couples the conductive segment 501 to the conductive line 404a. The via VG29 couples the conductive line 404a to the gate 332. Accordingly, the gate 334 is coupled to the gate 332.

For illustration, the via VG40 couples the gate 335 to the conductive line 401. In some embodiments, the conductive line 401 also outputs the supply voltage VDD to the gate 335. The via VG41 couples the gate 336 to the conductive line 402. In some embodiments, the conductive line 402 also receives the supply voltage VSS for the gate 336.

The via VD57 couples the conductive pattern 260 to the conductive line 406. The via VD59 couples the conductive pattern 261 to the conductive line 401. The via VD60 couples the conductive pattern 258 to the conductive line 401. The via VD61 couples the conductive pattern 259 to the conductive line 402. In some embodiments, the conductive line 401 also outputs the supply voltage VDD to the conductive patterns 258 and 261. The conductive lines 402 and 406 also receive the supply voltage VSS for the conductive patterns 259-260 respectively.

For illustration, the via VD58 couples the conductive pattern 216 to the conductive line 409. The via VM45 couples the conductive line 409 to the conductive segment 505. The via VM48 couples the conductive segment 505 to the conductive line 405b. The via VD52 couples the conductive line 405b to the conductive pattern 250. Accordingly, the conductive pattern 216 is coupled to the conductive pattern 250.

The conductive patterns 225 and 249 are coupled to each other through the vias VD26 and VD49 and the conductive line 403a. The conductive patterns 248 and 252 are coupled to each other through the vias VD50 and VD2 and the conductive line 403b. The conductive patterns 226 and 252 are coupled to each other through the vias VD27 and VD6 and the conductive line 405a.

Compared with the embodiments of FIG. 18, the embodiments of FIG. 19 further save the layout area in the integrated circuit 100 by implementing less elements.

The configurations of FIG. 19 are given for illustrative purposes. Various implementations of FIG. 19 are within the contemplated scope of the present disclosure. For example, in some embodiments, the conductive line 401 of FIG. 19 is implemented by the conductive lines 413-414 of FIG. 12.

Figure 20:
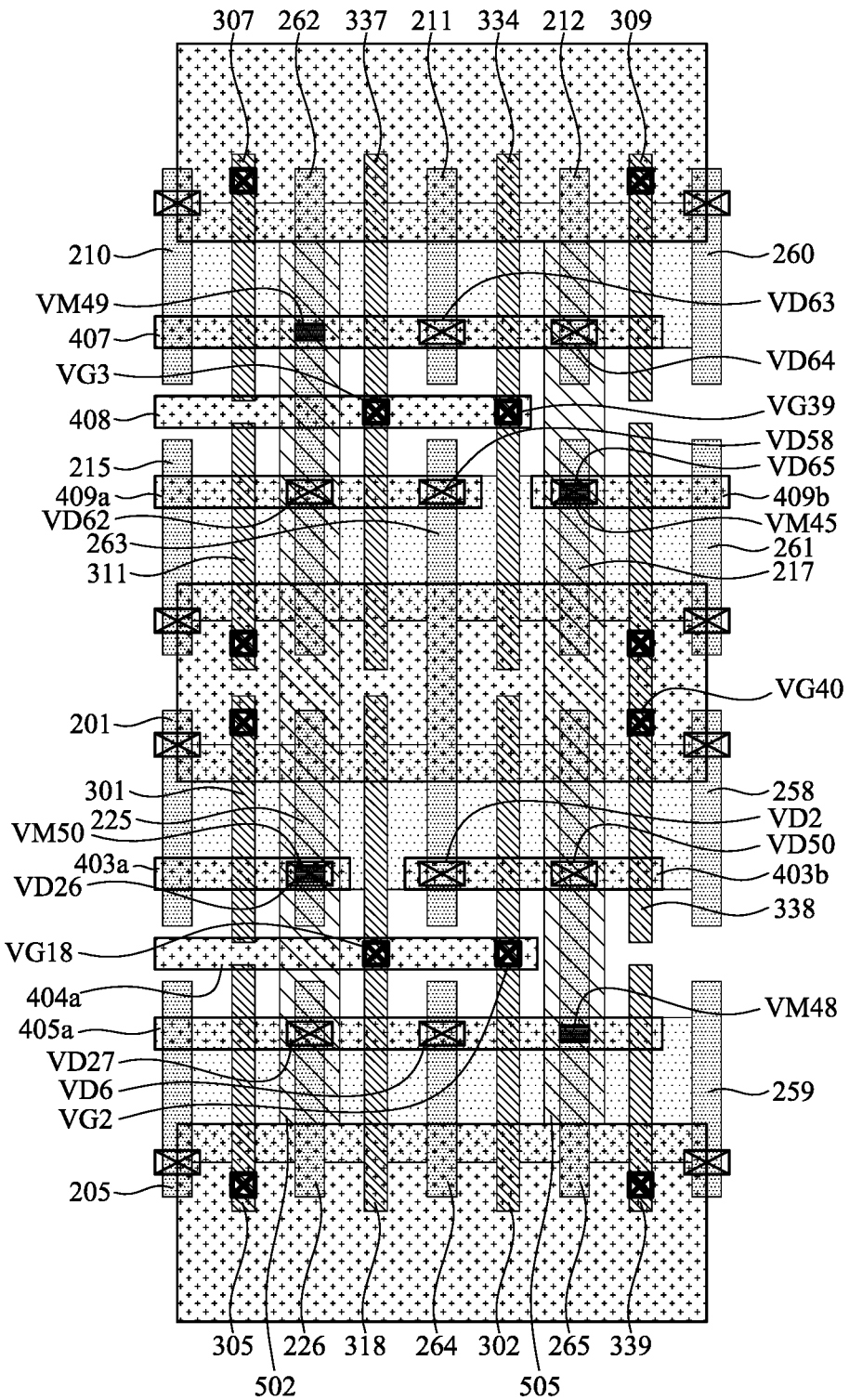
FIG. 20 is an another layout diagram in the plan view of part of the integrated circuit corresponding to part of FIG. 1, in accordance with various embodiments.

Reference is now made to FIG. 20. FIG. 20 is an another layout diagram in the plan view of part of the integrated circuit 100 corresponding to part of FIG. 1, in accordance with various embodiments. With respect to the embodiments of FIGS. 2A-19, like elements in FIG. 20 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 20.

Compared with the embodiments of FIG. 20, instead of having the conductive patterns 216, 249, 250, and 252-256, the gates 313, 328-331, 332, and 335-336, the conductive lines 404b-404c, 405b and 409, the conductive segment 501, and the corresponding vias for routing, the integrated circuit 100 further includes conductive patterns 262-265, gates 337-339, the conductive lines 409a-409b, the conductive segment 502, vias VD62-VD65, and VM49-VM50, and VG3. The conductive patterns 262-265 are configured with respect to, for example, the conductive pattern 205 of FIG. 14. The gates 337-339 are configured with respect to, for example, the gate 302. The vias VD62-VD65 are configured with respect to, for example, the via VD5 of FIG. 16. The vias VM49-VM50 are configured with respect to, for example, the via VM48 of FIG. 19.

In some embodiments, the portion of the gate 302 arranged above the active area 120 corresponds to the gate of the transistor M3 while the portion of the gate 302 arranged above the active area 110 is referred as a dummy gate. The portion of the gate 318 arranged above the active area 110 corresponds to the gate of the transistor M1 while the portion of the gate 318 arranged above the active area 120 is referred as a dummy gate. The portion of the gate 334 arranged above the active area 140 corresponds to the gate of the transistor M2 while the portion of the gate 334 arranged above the active area 130 is referred as a dummy gate. The portion of the gate 337 arranged above the active area 130 corresponds to the gate of the transistor M4 while another portion of the gate 337 arranged above the active areas 140 is referred as a dummy gate portion.

In some embodiments, the conductive pattern 225 corresponds to the drain/source of the transistor M1. The conductive pattern 263 corresponds to the source/drain of the transistor M1 and the drain/source of the transistor M2. The conductive pattern 217 corresponds to the source/drain of the transistor M2. The conductive pattern 264 corresponds to the drain/source of the transistor M3. The conductive pattern 265 corresponds to the source/drain of the transistor M3. The conductive pattern 211 corresponds to the drain/source of the transistor M4. The conductive pattern 262 corresponds to the source/drain of the transistor M4.

For illustration, compared with FIG. 20, the conductive patterns 262-265 extend in y direction. The conductive pattern 262 overlaps the active areas 130-140 and is arranged interposed between the gates 307, 311 and 337. The conductive pattern 263 crosses the active areas 110 and 140 and is arranged interposed between the gates 302, 318, 334 and 337. The conductive pattern 264 crosses the active area 120 and is arranged interposed between the gates 302 and 318. The conductive pattern 265 crosses the active areas 110-120 and is arranged interposed between the gates 302, and 338-339.

The gates 337-339 extend in y direction. The gate 337 crosses the active areas 130-140 and is arranged interposed between the conductive patterns 211 and 262-263. In some embodiments, the gate 337 aligns with the gate 318 in y direction. The gate 338 is arranged interposed between the conductive patterns 217, 258, 261 and 265 and crosses the active areas 110 and 140. The gate 339 is arranged interposed between the conductive patterns 259 and 265 and crosses the active area 120.

The conductive line 401 further crosses the conductive pattern 263 and the gate 338, and further overlaps the conductive patterns 217, 262-263 and 265 and the gates 318 and 337. The conductive line 402 further overlaps the conductive patterns 264-265 and the gates 318 and 339. The conductive line 403a crosses the conductive patterns 201 and 225 and the gate 301. The conductive line 403b crosses the conductive patterns 263 and 265 and the gates 302 and 338. The conductive line 404a crosses the gates 302 and 318. The conductive line 405a crosses the conductive patterns 205, 226, and 264-265 and the gates 302, 305, 318 and 339. The conductive line 406 further overlaps the conductive patterns 262-263 and the gates 337. The conductive line 407 further crosses the conductive patterns 262-263 and the gate 337. The conductive line 408 further crosses the gates 334. The conductive line 409a crosses the conductive patterns 215, and 262-263 and the gates 311 and 337. The conductive line 409b crosses the conductive patterns 217 and 261 and the gate 338.

The conductive segment 502 overlaps the conductive patterns 225-226 and 262 and crosses the conductive lines 401, 403a, 404a, 405a, 407-408, and 409a. The conductive segment 505 overlaps the conductive patterns 212, 217, and 265 and crosses the conductive lines 401, 403b, 405a, 407-408, and 409b.

The via VG41 couples the gate 339 to the conductive line 402. In some embodiments, the conductive line 402 also receives the supply voltage VSS for the gate 339.

The via VG2 couples the gate 302 to the conductive line 404a, and the via VG18 couples the gate 318 to the conductive line 404a. Accordingly, the gate 302 is coupled to the gate 318. The via VG3 couples the gate 337 to the conductive line 408, and the via VG39 couples the gate 334 to the conductive line 408. Accordingly, the gate 337 is coupled to the gate 334.

The via VD26 couples the conductive pattern 225 to the conductive line 403a. The via VM50 couples the conductive line 403a to the conductive segment 502. The via VM49 couples the conductive segment 502 to the conductive line 407. The via VD63 couples the conductive line 407 to the conductive pattern 211. Accordingly, the conductive pattern 225 is coupled to the conductive pattern 211.

The vias VD27 and VD6 couple the conductive line 405a to the conductive patterns 226 and 264 respectively. The via VM48 couples the conductive line 405a to the conductive segment 505. The via VM45 couples the conductive segment 505 to the conductive line 409b. The via VD65 couples the conductive line 409b to the conductive pattern 217. Accordingly, the conductive patterns 226 and 264 are coupled to the conductive pattern 217.

The vias and VD2 and VD50 couple the conductive patterns 263 and 265 to the conductive line 403b respectively. Meanwhile, the vias and VD58 and VD62 couple the conductive patterns 263 and 262 to the conductive line 409a respectively. Accordingly, the conductive patterns 262-263 and 265 are coupled together.

Compared with the embodiments of FIG. 19, the embodiments of FIG. 20 further save the layout area in the integrated circuit 100 by implementing less elements.

The configurations of FIG. 20 are given for illustrative purposes. Various implementations of FIG. 20 are within the contemplated scope of the present disclosure. For example, in some embodiments, the conductive line 401 of FIG. 20 is implemented by the conductive lines 413-414 of FIG. 12.

Figure 21:
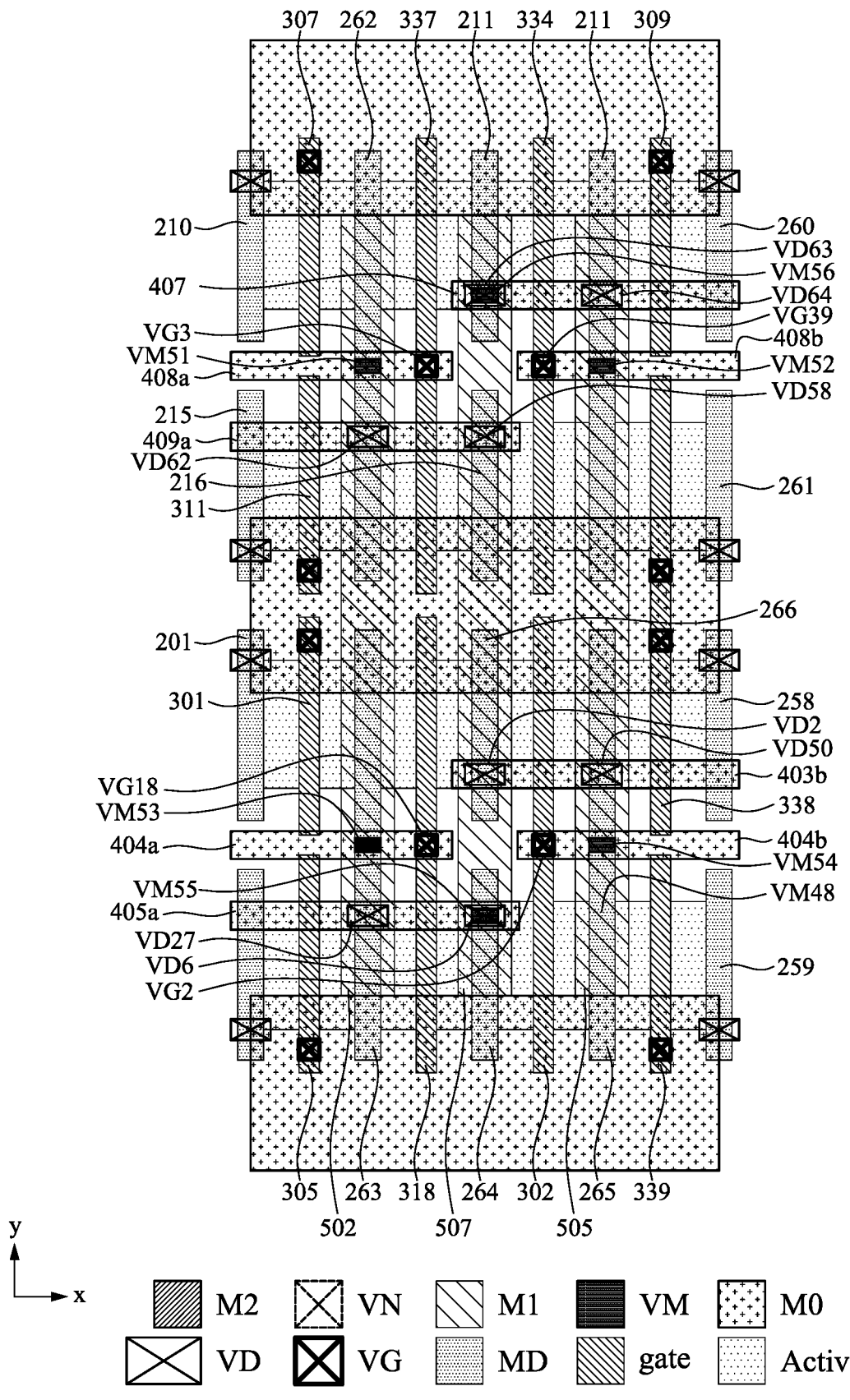
FIG. 21 is an another layout diagram in the plan view of part of the integrated circuit corresponding to part of FIG. 1, in accordance with various embodiments.

Reference is now made to FIG. 21. FIG. 21 is an another layout diagram in the plan view of part of the integrated circuit 100 corresponding to part of FIG. 1, in accordance with various embodiments. With respect to the embodiments of FIGS. 2A-20, like elements in FIG. 21 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 21.

Compared with the embodiments of FIG. 21, instead of having the conductive lines 403a and 409b and corresponding structures for routing, the integrated circuit 100 further includes conductive lines 408a-408b and a conductive segment 507. The conductive lines 408a-408b are configured with respect to, for example, the conductive line 408 of FIG. 21. The conductive segment 507 is configured with respect to, for example, the conductive segment 502.

In some embodiments, the portion of the gate 302 arranged above the active area 120 corresponds to the gate of the transistor M3 while the portion of the gate 302 arranged above the active area 110 is referred as a dummy gate. The portion of the gate 318 arranged above the active area 110 corresponds to the gate of the transistor M2 while the portion of the gate 318 arranged above the active area 120 is referred as a dummy gate. The portion of the gate 334 arranged above the active area 140 corresponds to the gate of the transistor M1 while the portion of the gate 334 arranged above the active area 130 is referred as a dummy gate. The portion of the gate 337 arranged above the active area 130 corresponds to the gate of the transistor M4 while another portion of the gate 337 arranged above the active areas 140 is referred as a dummy gate portion.

In some embodiments, the conductive pattern 225 corresponds to the drain/source of the transistor M2. The conductive pattern 263 corresponds to the drain/source of the transistor M1 and the source/drain of the transistor M2. The conductive pattern 217 corresponds to the source/drain of the transistor M1. The conductive pattern 264 corresponds to the source/drain of the transistor M3. The conductive pattern 265 corresponds to the drain/source of the transistor M3. The conductive pattern 262 corresponds to the drain/source of the transistor M4. The conductive pattern 211 corresponds to the source/drain of the transistor M4.

For illustration, the conductive segment 507 extends in y direction, overlaps the conductive patterns 211, and 263-264, and crosses the conductive lines 401, 403b, 405a, 407 and 409a.

The via VG2 couples the gate 302 to the conductive line 404b. The via VM54 couples to conductive line 404b to the conductive segment 505. The via VM52 couples the conductive segment 505 to the conductive line 408b. The via VG39 couples the conductive line 408b to the gate 334. Accordingly, the gate 302 is coupled to the gate 334.

The via VG18 couples the gate 318 to the conductive line 404a. The via VM53 couples to conductive line 404a to the conductive segment 502. The via VM51 couples the conductive segment 502 to the conductive line 408a. The via VG3 couples the conductive line 408a to the gate 337. Accordingly, the gate 318 is coupled to the gate 337.

The via VD6 couples the conductive pattern 264 to the conductive line 405a. The via VM55 couples the conductive line 405a to the conductive segment 507. The via VM56 couples the conductive segment 507 to the conductive line 407. The via VD64 couples the conductive line 407 to the conductive pattern 211. Accordingly, the conductive pattern 264 is coupled to the conductive pattern 211.

The conductive patterns 263 and 265 are coupled to each other through the vias VD2 and VD50 and the conductive line 403b. The conductive patterns 226 and 264 are coupled to each other through the vias VD27 and VD6 and the conductive line 405a. The conductive patterns 262-263 are coupled to each other through the vias VD62 and VD58 and the conductive line 409a. The conductive patterns 211-212 are coupled to each other through the vias VD63-VD64 and the conductive line 407.

The configurations of FIG. 21 are given for illustrative purposes. Various implementations of FIG. 21 are within the contemplated scope of the present disclosure. For example, in some embodiments, the conductive line 401 of FIG. 21 is implemented by the conductive lines 413-414 of FIG. 12.

Figure 22:
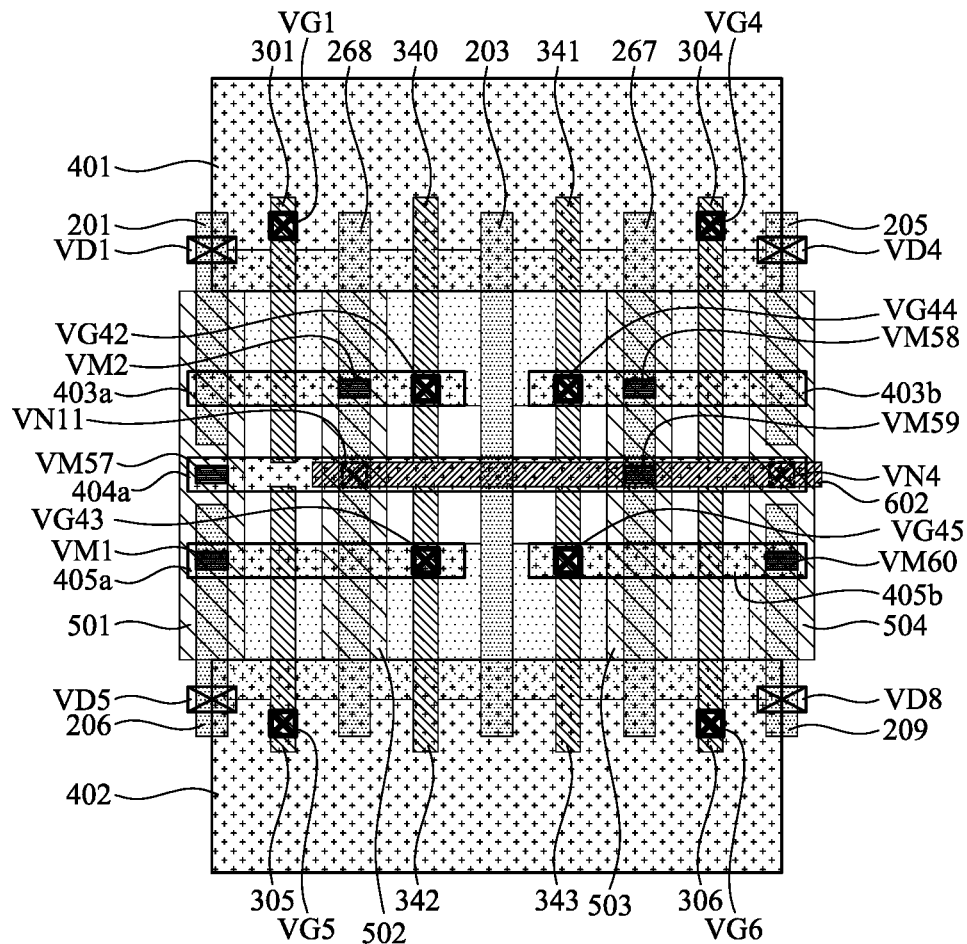
FIG. 22 is an another layout diagram in the plan view of part of the integrated circuit corresponding to part of FIG. 1, in accordance with various embodiments.
Figure 22:
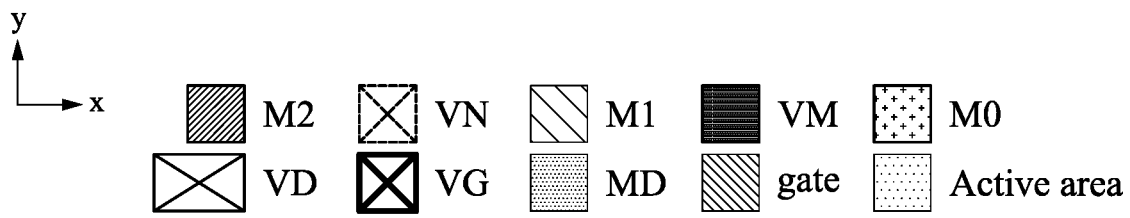

Reference is now made to FIG. 22. FIG. 22 is an another layout diagram in the plan view of part of the integrated circuit 100 corresponding to part of FIG. 1, in accordance with various embodiments. With respect to the embodiments of FIGS. 2A-21, like elements in FIG. 22 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 22.

Compared with the embodiments of FIG. 2A, instead of having the conductive patterns 202, 204, 207, and 208, the gates 302-303, the conductive trace 601, and the corresponding structures for routing, the integrated circuit 100 further includes conductive patterns 267-268, gates 340-343, vias VG42-VG45, VM57-VM60, and VN11. The conductive patterns 267-268 are configured with respect to, for example, the conductive pattern 203. The gates 340-343 are configured with respect to, for example, the gate 304. The vias VG42-VG45 are configured with respect to, for example, the via VG2. The vias VM57-VM60 are configured with respect to, for example, the via VM1. The via VN11 is configured with respect to, for example, the via VN4.

The conductive patterns 267-268 extend in y direction and are separate from each other in x direction. For illustration, the conductive pattern 267 is arranged interposed between the gates 304, 306, 341, and 343. The conductive pattern 268 is arranged interposed between the gates 301, 305, 340, and 342.

The gates 340-343 extend in y direction and are separate from each other in x direction. The gates 340-341 cross the active area 110. The gates 342-343 cross the active area 120. The gates 340 and 342 are arranged interposed between the conductive patterns 203 and 268. The gates 341 and 343 are arranged interposed between the conductive patterns 203 and 267.

The conductive line 403a further crosses the conductive pattern 268 and the gate 340. The conductive line 403b further crosses the conductive pattern 267 and the gate 341. The conductive line 404a crosses the conductive patterns 268 and 267. The conductive line 405a further crosses the conductive pattern 268 and the gate 342. The conductive line 405*b* further crosses the conductive pattern 267 and the gate 343.

The conductive segment 502 overlaps the conductive pattern 268 and crosses the conductive lines 403*a*, 404, and 405*a*. The conductive pattern 503 overlaps the conductive pattern 267 and crosses the conductive lines 403*b* and 404.

The conductive trace 602 overlaps the conductive line 404*a* and crosses the conductive patterns 203 and 266-267.

For illustration, the vias VG42 and VG44 overlap the active area 110. The vias VG43 and VG45 overlap the active area 120.

The via VG42 couples the gate 340 to the conductive line 403*a*. The via VM2 couples the conductive line 403*a* to the conductive segment 502. The via VN11 couples the conductive segment 502 to the conductive trace 602. The via VN4 couples the conductive trace 602 to the conductive segment 504. The via VM 60 couples the conductive segment 504 to the conductive line 405*b*. The via VG45 couples the conductive line 405*b* to the gate 343. Accordingly, the gate 340 is coupled to the gate 343.

The via VG44 couples the gate 341 to the conductive line 403*b*. The via VM58 couples the conductive line 403*b* to the conductive segment 503. The via VM59 couples the conductive segment 503 to the conductive line 404*a*. The via VM57 couples the conductive line 404*a* to the conductive segment 501. The via VM1 couples the conductive segment 501 to the conductive line 405*a*. The via VG43 couples the conductive line 405*a* to the gate 342. Accordingly, the gate 341 is coupled to the gate 342.

Compared with the embodiments of FIG. 2A, the embodiments of FIG. 22 further save the routing resources of metal layers in the third layer by not implementing the conductive trace 601.

The configurations of FIG. 22 are given for illustrative purposes. Various implementations of FIG. 22 are within the contemplated scope of the present disclosure. For example, in some embodiments, the conductive line 401 and/or conductive line 402 are coupled to another cell abutting the cell shown in the embodiments of FIG. 22.

Figure 23:
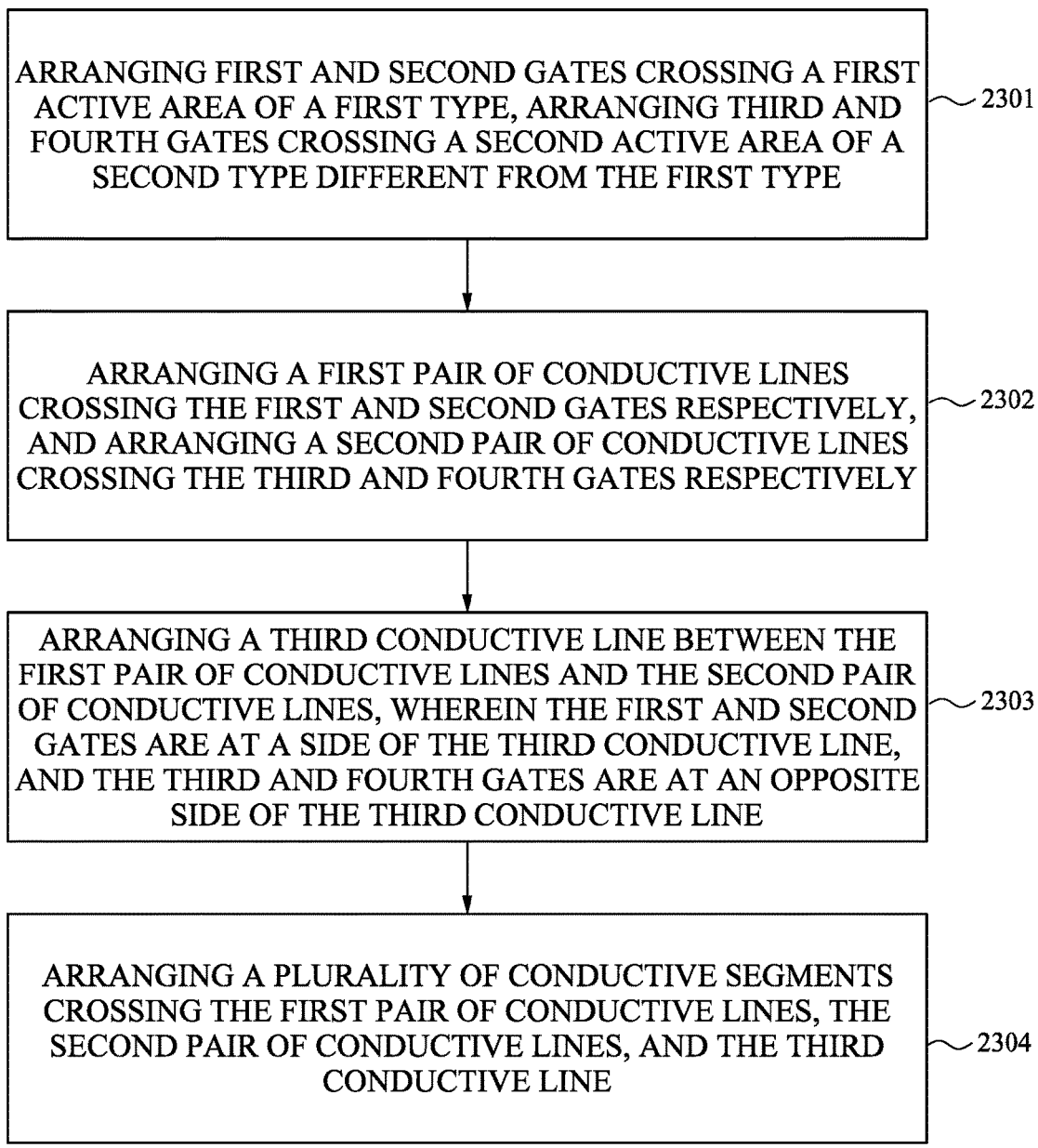
FIG. 23 is a flow chart of a method of generating a layout design for fabricating the integrated circuit, in accordance with some embodiments of the present disclosure.

Reference is now made to FIG. 23. FIG. 23 is a flow chart of a method 2300 of generating a layout design for fabricating the integrated circuit 100, in accordance with some embodiments of the present disclosure. It is understood that additional operations can be provided before, during, and after the processes shown by FIG. 23, and some of the operations described below can be replaced or eliminated, for additional embodiments of the method 2300. The method 2300 includes operations 2301-2304 that are described below with reference to the integrated circuit 100 of FIG. 22.

In operation 2301, the gate 340 and the gate 341 are arranged crossing the active area 110 of P type, and the gate 342 and the gate 343 are arranged crossing the active area 120 of N type.

In operation 2302, the conductive lines 403*a*-403*b* are arranged crossing the gate 340 and the gate 341 respectively, and the conductive lines 405*a*-405*b* are arranged crossing the gate 342 and the gate 343 respectively.

In operation 2303, the conductive line 404*a* is arranged between the conductive lines 403*a*-403*b* and the conductive lines 405*a*-405*b* along a y direction. In some embodiments, the gate 340 and the gate 341 are at a side of the conductive line 404*a*, and the gate 342 and the gate 343 are at an opposite side of the conductive line 404*a*.

In operation 2304, the conductive segments 501-504 are arranged crossing the conductive line 403*a*-403*b*, 404*a*, and 405*a*-405*b* separately as shown in FIG. 22.

In some embodiments, the gate 341 is coupled to the gate 342 through the conductive line 403*b*, the conductive segments 501 and 503, the conductive line 404*a*, and the conductive lines 405*a*.

In some embodiments, the vias VG42 and VG44 are arranged coupled between the conductive lines 403*a*-403*b* and the gates 340-341, and the vias VG42 and VG44 overlap the active area 110. The vias VG43 and VG45 are arranged coupled between the conductive lines 405*a*-405*b* and the gates 342-343, and the vias VG43 and VG45 overlap the active area 120.

In some embodiments, the conductive pattern 203 is arranged between the gates 340-343. The conductive line 404*a* crosses the conductive pattern 203. In some embodiments, the conductive pattern 203 corresponds to the sources/drains of the transistors M1 and M3-M4 and the drain/source of the transistor M2. The transistors M1-M4 include the gates 340, 341, 343, and 342 separately.

Figure 24:
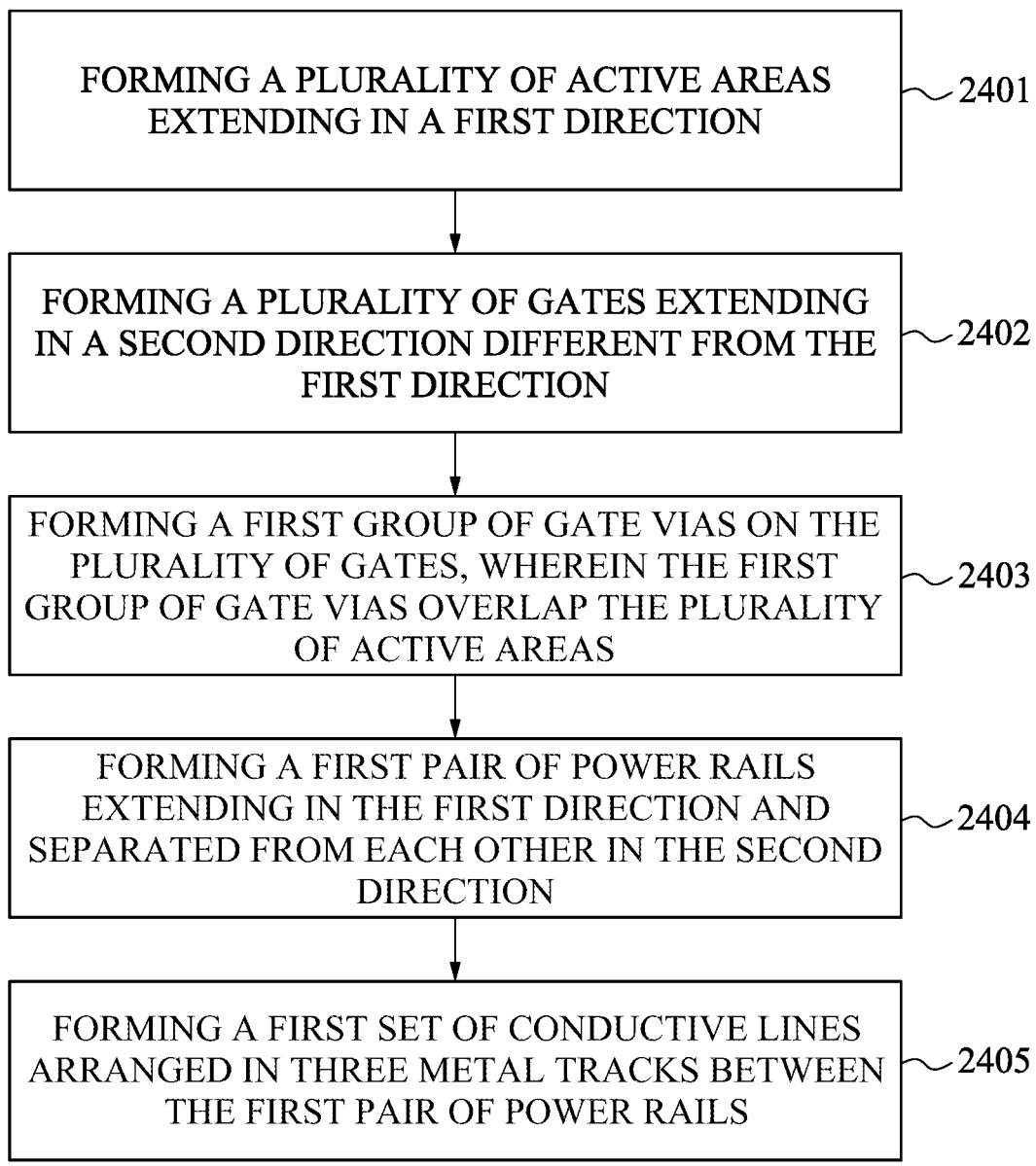
FIG. 24 is a flow chart of a method of fabricating the integrated circuit, in accordance with some embodiments of the present disclosure.

Reference is now made to FIG. 24. FIG. 24 is a flow chart of a method 2400 of generating a layout design for fabricating the integrated circuit 100, in accordance with some embodiments of the present disclosure. It is understood that additional operations can be provided before, during, and after the processes shown by FIG. 24, and some of the operations described below can be replaced or eliminated, for additional embodiments of the method 2400. The method 2400 includes operations 2401-2405 that are described below with reference to the integrated circuit 100 of FIG. 11A.

In operation 2401, as shown in FIG. 11A, the active areas 110-140 extending in x direction are formed. In some embodiments, the active areas 110-120 are included in the cell CELL1, and the active areas 130-140 are included in the cell CELL2.

In operation 2402, as shown in FIG. 11A, the gates, including, for example, the gates 303, 306, 308, 310, 319-320, 324-326, extending in y direction are formed. In some embodiments, the conductive patterns, including, for example, the conductive patterns 240-241, extending in y direction are formed.

In operation 2403, the via VG23 is formed on the gate 325, the via VG24 is formed on the gate 303, and the via VG25 is formed on the gate 326. The vias VG23-VG25 overlap the active areas 130, 110, and 120 separately, as shown in FIG. 11A.

In some embodiments, as shown in FIG. 10A, the method 2400 further includes operations of forming STI regions 710-730 which extend in x direction and are arranged between the active areas 110-140. The method 2400 also includes operations of forming the vias, for example, the via VG18 on the gate 321 and the via VG3 on the gate 303. The vias VG18 and VG3 overlap the STI regions 710 and 720 respectively.

In operation 2404, the power rails 414 and 415 extending in x direction are formed. As shown in FIG. 11A, the power rails 414 and 415 overlap the active areas 110 and 120 respectively and are separated from each other in y direction.

In operation 2405, as shown in FIG. 11A, the conductive lines 403*a*, 404*a*, and 405*a* extending in x direction and separated from each other in y direction are formed. The conductive lines 403*a*, 404*a*, and 405*a* are arranged between the power rails 414 and 415.

In some embodiments, the method 2400 further includes operations of forming the power rails 412 and 413 which extend in x direction and are separated from each other in y direction. Alternatively stated, the power rails 412-415 are separated from each other in y direction. The method 2400 further includes operations of forming the conductive lines 407-409 arranged between the power rails 412 and 413.

In some embodiments, as shown in FIG. 12, for example, the method 2400 further includes forming the conductive lines 403a-403b that are in one metal track and separated from each other, without using a mask. In various embodiments, the conductive lines 403a-403b are formed without a cut layer, and the formation of the conductive lines 403a-403b is referred to as a technique called "metal nature end".

Figure 25:
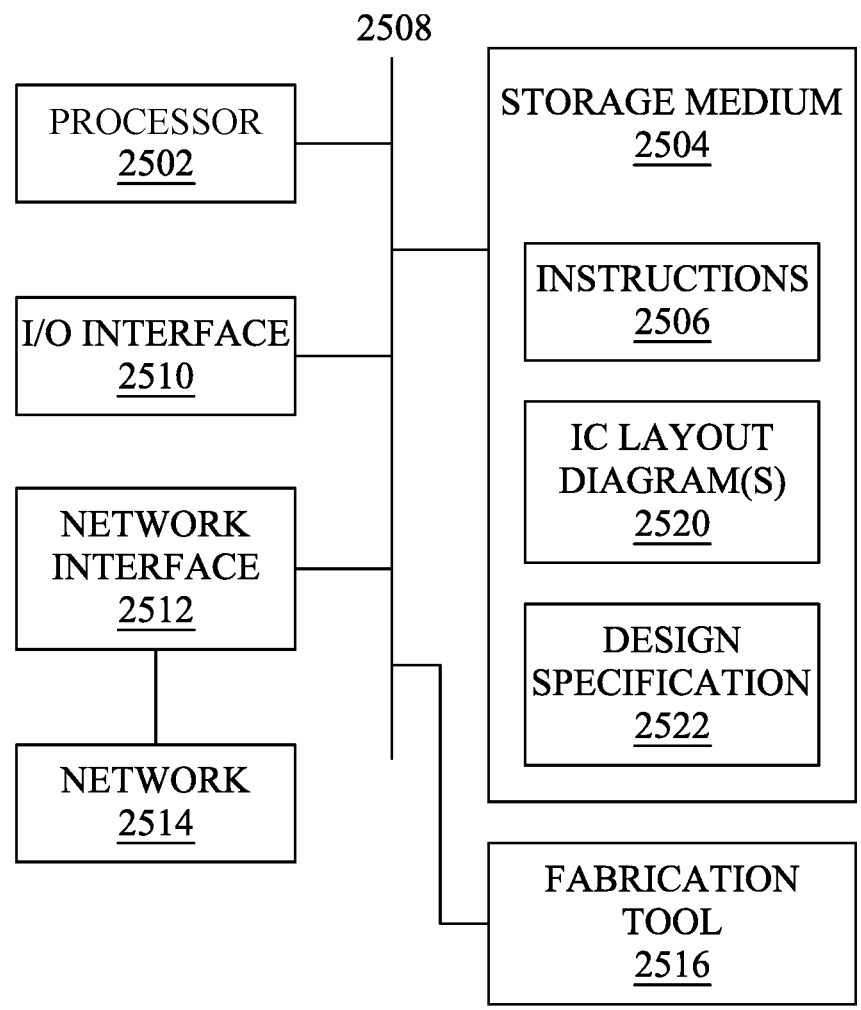
FIG. 25 is a block diagram of a system for designing the integrated circuit layout design, in accordance with some embodiments of the present disclosure.

Reference is now made to FIG. 25. FIG. 25 is a block diagram of an electronic design automation (EDA) system 2500 for designing the integrated circuit layout design, in accordance with some embodiments of the present disclosure. EDA system 2500 is configured to implement one or more operations of the methods 2300-2400 disclosed in FIGS. 23-24, and further explained in conjunction with FIGS. 1-22. In some embodiments, EDA system 2500 includes an APR system.

In some embodiments, EDA system 2500 is a general purpose computing device including a hardware processor 2502 and a non-transitory, computer-readable storage medium 2504. Storage medium 2504, amongst other things, is encoded with, i.e., stores, computer program code (instructions) 2506, i.e., a set of executable instructions. Execution of instructions 2506 by hardware processor 2502 represents (at least in part) an EDA tool which implements a portion or all of, e.g., the methods 2300 and 2400.

The processor 2502 is electrically coupled to computer-readable storage medium 2504 via a bus 2508. The processor 2502 is also electrically coupled to an I/O interface 2510 and a fabrication tool 2516 by bus 2508. A network interface 2512 is also electrically connected to processor 2502 via bus 2508. Network interface 2512 is connected to a network 2514, so that processor 2502 and computer-readable storage medium 2504 are capable of connecting to external elements via network 2514. The processor 2502 is configured to execute computer program code 2506 encoded in computer-readable storage medium 2504 in order to cause EDA system 2500 to be usable for performing a portion or all of the noted processes and/or methods. In one or more embodiments, processor 2502 is a central processing unit (CPU), a multi-processor, a distributed processing system, an application specific integrated circuit (ASIC), and/or a suitable processing unit.

In one or more embodiments, computer-readable storage medium 2504 is an electronic, magnetic, optical, electromagnetic, infrared, and/or a semiconductor system (or apparatus or device). For example, computer-readable storage medium 2504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2504 includes a compact disk-read only memory (CD-ROM), a compact disk-read/write (CD-R/W), and/or a digital video disc (DVD).

In one or more embodiments, storage medium 2504 stores computer program code 2506 configured to cause EDA system 2500 (where such execution represents (at least in part) the EDA tool) to be usable for performing a portion or all of the noted processes and/or methods. In one or more embodiments, storage medium 2504 also stores information which facilitates performing a portion or all of the noted processes and/or methods. In one or more embodiments, storage medium 2504 stores IC layout diagram 2520 of standard cells including such standard cells as disclosed herein, for example, a cell including in the integrated circuit 100 discussed above with respect to FIGS. 1-22.

EDA system 2500 includes I/O interface 2510. I/O interface 2510 is coupled to external circuitry. In one or more embodiments, I/O interface 2510 includes a keyboard, keypad, mouse, trackball, trackpad, touchscreen, and/or cursor direction keys for communicating information and commands to processor 2502.

EDA system 2500 also includes network interface 2512 coupled to processor 2502. Network interface 2512 allows EDA system 2500 to communicate with network 2514, to which one or more other computer systems are connected. Network interface 2512 includes wireless network interfaces such as BLUETOOTH, WIFI, WIMAX, GPRS, or WCDMA; or wired network interfaces such as ETHERNET, USB, or IEEE-2564. In one or more embodiments, a portion or all of noted processes and/or methods, is implemented in two or more systems 2500.

EDA system 2500 also includes the fabrication tool 2516 coupled to processor 2502. The fabrication tool 2516 is configured to fabricate integrated circuits, e.g., the integrated circuit 100 illustrated in FIGS. 1-22, according to the design files processed by the processor 2502.

EDA system 2500 is configured to receive information through I/O interface 2510. The information received through I/O interface 2510 includes one or more of instructions, data, design rules, libraries of standard cells, and/or other parameters for processing by processor 2502. The information is transferred to processor 2502 via bus 2508. EDA system 2500 is configured to receive information related to a UI through I/O interface 2510. The information is stored in computer-readable medium 2504 as design specification 2522.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 2500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 26:
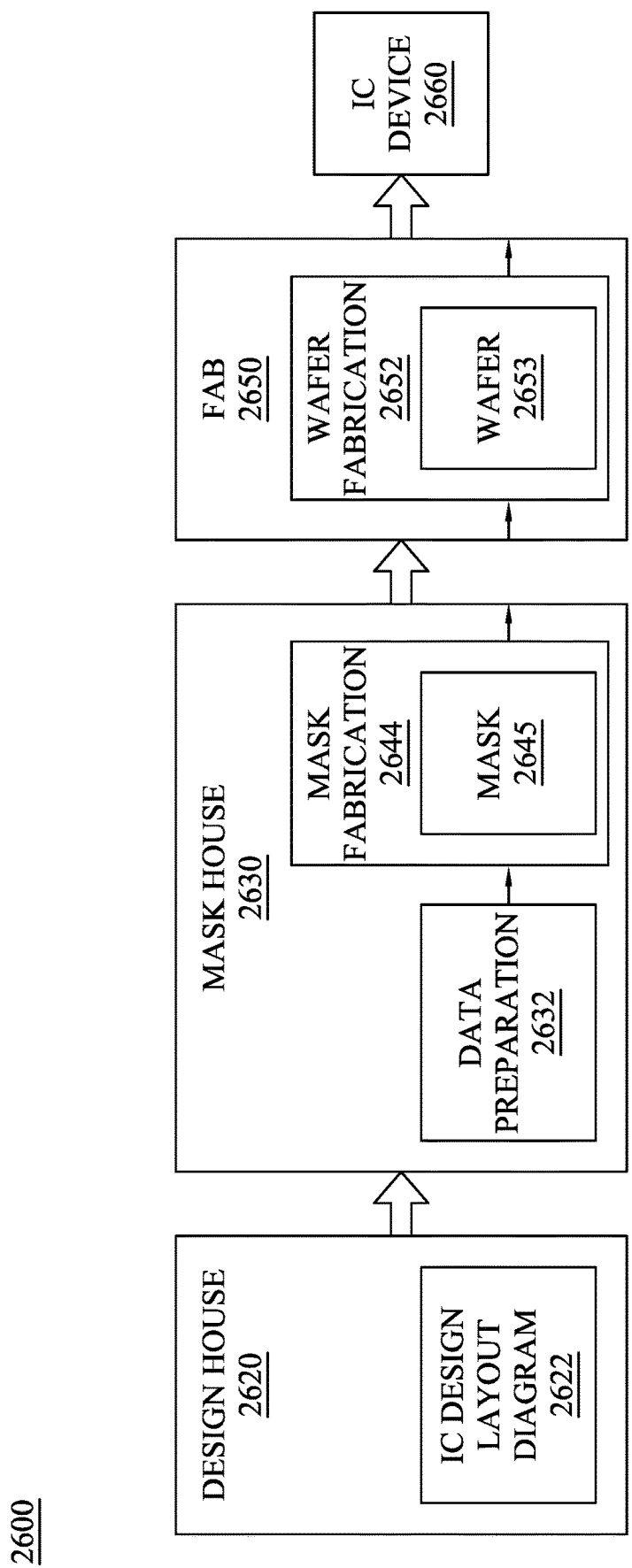
FIG. 26 is a block diagram of an integrated circuit manufacturing system, and an integrated circuit manufacturing flow associated therewith, in accordance with some embodiments.

FIG. 26 is a block diagram of IC manufacturing system 2600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 2600.

In FIG. 26, IC manufacturing system 2600 includes entities, such as a design house 2620, a mask house 2630, and an IC manufacturer/fabricator ("fab") 2650, that interact with one another in the design, development, and manufacturing cycles and/or services related to manufacturing an IC device 2660. The entities in IC manufacturing system 2600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2620, mask house 2630, and IC fab 2650 is owned by a single larger company. In some embodiments, two or more of design house 2620, mask house 2630, and IC fab 2650 coexist in a common facility and use common resources.

Design house (or design team) 2620 generates an IC design layout diagram 2622. IC design layout diagram 2622 includes various geometrical patterns, for example, an IC layout design depicted in FIGS. 1-22, designed for an IC device 2660, for example, integrated circuit 100 discussed above with respect to FIGS. 1-22. The geometrical patterns correspond to patterns of metal, oxide, or semiconductor layers that make up the various components of IC device 2660 to be fabricated. The various layers combine to form various IC features. For example, a portion of IC design layout diagram 2622 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 2620 implements a proper design procedure to form IC design layout diagram 2622. The design procedure includes one or more of logic design, physical design or place and route. IC design layout diagram 2622 is presented in one or more data files having information of the geometrical patterns. For example, IC design layout diagram 2622 can be expressed in a GDSII file format or DFII file format.

Mask house 2630 includes data preparation 2632 and mask fabrication 2644. Mask house 2630 uses IC design layout diagram 2622 to manufacture one or more masks 2645 to be used for fabricating the various layers of IC device 2660 according to IC design layout diagram 2622. Mask house 2630 performs mask data preparation 2632, where IC design layout diagram 2622 is translated into a representative data file ("RDF"). Mask data preparation 2632 provides the RDF to mask fabrication 2644. Mask fabrication 2644 includes a mask writer. A mask writer converts the RDF to an image on a substrate, such as a mask (reticle) 2645 or a semiconductor wafer 2653. The IC design layout diagram 2622 is manipulated by mask data preparation 2632 to comply with particular characteristics of the mask writer and/or requirements of IC fab 2650. In FIG. 26, data preparation 2632 and mask fabrication 2644 are illustrated as separate elements. In some embodiments, data preparation 2632 and mask fabrication 2644 can be collectively referred to as mask data preparation.

In some embodiments, data preparation 2632 includes optical proximity correction (OPC) which uses lithography enhancement techniques to compensate for image errors, such as those that can arise from diffraction, interference, other process effects and the like. OPC adjusts IC design layout diagram 2622. In some embodiments, data preparation 2632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 2632 includes a mask rule checker (MRC) that checks the IC design layout diagram 2622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2622 to compensate for limitations during mask fabrication 2644, which may undo part of the modifications performed by OPC in order to meet mask creation rules.

In some embodiments, data preparation 2632 includes lithography process checking (LPC) that simulates processing that will be implemented by IC fab 2650 to fabricate IC device 2660. LPC simulates this processing based on IC design layout diagram 2622 to create a simulated manufactured device, such as IC device 2660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2622.

It should be understood that the above description of data preparation 2632 has been simplified for the purposes of clarity. In some embodiments, data preparation 2632 includes additional features such as a logic operation (LOP) to modify the IC design layout diagram 2622 according to manufacturing rules. Additionally, the processes applied to IC design layout diagram 2622 during data preparation 2632 may be executed in a variety of different orders.

After data preparation 2632 and during mask fabrication 2644, a mask 2645 or a group of masks 2645 are fabricated based on the modified IC design layout diagram 2622. In some embodiments, mask fabrication 2644 includes performing one or more lithographic exposures based on IC design layout diagram 2622. In some embodiments, an electron-beam (e-beam) or a mechanism of multiple e-beams is used to form a pattern on a mask (photomask or reticle) 2645 based on the modified IC design layout diagram 2622. Mask 2645 can be formed in various technologies. In some embodiments, mask 2645 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 2645 includes a transparent substrate (for example, fused quartz) and an opaque material (for example, chromium) coated in the opaque regions of the binary mask. In another example, mask 2645 is formed using a phase shift technology. In a phase shift mask (PSM) version of mask 2645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2644 is used in a variety of processes. For example, such a mask(s) is used in an ion implantation process to form various doped regions in semiconductor wafer 2653, in an etching process to form various etching regions in semiconductor wafer 2653, and/or in other suitable processes.

IC fab 2650 includes wafer fabrication 2652. IC fab 2650 is an IC fabrication business that includes one or more manufacturing facilities for the fabrication of a variety of different IC products. In some embodiments, IC Fab 2650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2650 uses mask(s) 2645 fabricated by mask house 2630 to fabricate IC device 2660. Thus, IC fab 2650 at least indirectly uses IC design layout diagram 2622 to fabricate IC device 2660. In some embodiments, semiconductor wafer 2653 is fabricated by IC fab 2650 using mask(s) 2645 to form IC device 2660. In some embodiments, the IC fabrication includes performing one or more lithographic exposures based at least indirectly on IC design layout diagram 2622. Semiconductor wafer 2653 includes a silicon substrate or other proper substrate having material layers formed thereon. Semiconductor wafer 2653 further includes one or more of various doped regions, dielectric features, multi-level interconnects, and the like (formed at subsequent manufacturing steps).

As described above, an integrated circuit in the present disclosure provides condense layout arrangement by including three parallel conductive lines between two power rails, and further includes a reduced layout area compared with some approaches.

In some embodiments, a method is provided, and including operations as below: forming multiple active areas extending in a first direction; forming multiple conductive patterns extending in a second direction different from the first direction and arranged in a first layer above the active areas; forming multiple gates extending parallel to the conductive patterns; and forming a first set of conductive lines extending in the first direction and arranged in three first metal tracks that are in a second layer above the first layer, wherein one of the first set of conductive lines is arranged in a middle track of the three first metal tracks, coupled to one of the gates and overlap a first shallow trench region between two of the active areas. In some embodiments, forming the first set of conductive lines includes: forming two conductive lines that are separate from each other in the first direction by a space, without using a mask. A first pattern of the conductive patterns extends through the space and overlap at least two of the active areas. The first pattern corresponds to terminals of four transistors, coupled with each other, in a transmission gate circuit. In some embodiments, the method further includes operations of forming a pair of power rails extending in the second direction and overlapping with the conductive patterns; and forming a second set of conductive lines extending parallel to the first set of conductive lines and arranged in three second metal tracks between the pair of power rails. One of the second set of conductive lines is arranged in a middle track of the three second metal tracks, coupled to one of the gates and overlap a second shallow trench region between two of the active areas. In some embodiments, a pattern of the conductive patterns overlaps the first and second shallow trench regions and the pair of power rails. In some embodiments, a pattern in the conductive patterns corresponds to terminals of three transistors, coupled with each other, in a transmission gate circuit. In some embodiments, the gates are separated from each other in the first direction. A pattern in the conductive patterns is interposed between the gates and correspond to coupled terminals of two transistors in a transmission gate circuit. In some embodiments, the method further includes operations of forming a conductive segment overlapping the pattern in the conductive patterns to transmit a control signal to two of the gates by the one of the first set of conductive lines.

Also disclosed is a method including the following operations: forming multiple first active areas extending in a first direction; forming multiple conductive patterns extending in a second direction perpendicular to the first direction in a first layer, wherein a first pattern in the conductive patterns corresponds to first terminals of first and second transistors in a transmission gate circuit, and a second pattern in the conductive patterns corresponds to second terminals of the first and second transistors; and forming a first set of conductive lines in a standard cell, wherein the standard cell has only three metal tracks for the first set of conductive lines between a first pair of power rails. First and second lines in the first set of conductive lines are arranged in first and second tracks of the three metal tracks and overlap with the first active areas. In some embodiments, the method further includes operations of forming a first gate of the first transistor and a second gate of the second transistor. The first and second lines in the first set of conductive lines are coupled to the first gate and the second gate respectively. In some embodiments, a third line in the first set of conductive lines is arranged in a third track of the three metal tracks, wherein the third track of the three metal tracks is interposed between the first and second tracks of the three metal tracks. In some embodiments, the method further includes operations of forming a second set of conductive lines in the standard cell, wherein the standard cell has only three metal tracks for the second set of conductive lines between a second pair of power rails; and forming a first gate of a third transistor in the transmission gate circuit and a second gate shared by the first transistor and a fourth transistor in the transmission gate circuit. A first line in the second set of conductive lines is coupled to the first gate and overlap a first area of multiple second active areas, and a second line in the second set of conductive lines overlaps the second gate and a second area of the second active areas. In some embodiments, a third pattern in the conductive patterns corresponds to the third and fourth transistors and overlaps the second active areas. In some embodiments, forming the first set of conductive lines includes forming, in one of the three metal tracks, two conductive lines that are separate from each other, without using a mask.

Also disclosed is a method including the following operations: forming multiple active areas extending in a first direction; forming multiple gates extending in a second direction different from the first direction; forming a first group of gate vias on the gates, wherein the first group of gate vias overlap the active areas; forming a first pair of power rails extending in the first direction, overlapping the gates, and separated from each other in the second direction; and forming a first set of conductive lines arranged in three metal tracks between the first pair of power rails. In some embodiments, the method further includes operations of forming multiple shallow trench isolation regions extending in the first direction and arranged between the active areas; and forming a second group of gate vias on the gates. The second group of gate vias overlap the shallow trench isolation regions. In some embodiments, the method further includes operations of forming a second pair of power rails adjacent the first pair of power rails; and forming a second set of conductive lines arranged in three metal tracks between the second pair of power rails. The first and second pairs of power rails are included in different cells in an integrated circuit. In some embodiments, forming the second set of conductive lines includes forming, in one of the three metal tracks, two conductive lines that are separate from each other, without using a mask. In some embodiments, forming the first set of conductive lines includes forming, in one of the three metal tracks, two conductive lines that are separate from each other, without using a mask. In some embodiments, a first gate of the gates is shared by first and second transistors. The method further includes operations of forming a conductive pattern extending from a first active area to and a second active area that are in the active areas. The conductive pattern corresponds to coupled terminals of the first and second transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of active areas extending in a first direction;
    forming a plurality of conductive patterns extending in a second direction different from the first direction and arranged in a first layer above the plurality of active areas;
    forming a plurality of gates extending parallel to the plurality of conductive patterns;
    forming a first set of conductive lines extending in the first direction and arranged in three first metal tracks that are in a second layer above the first layer, wherein one of the first set of conductive lines is arranged in a middle track of the three first metal tracks, coupled to one of the plurality of gates and overlap a first shallow trench region between two of the plurality of active areas,
    wherein two conductive lines in the first set of conductive lines overlap corresponding two active areas in the plurality of active areas in a plan view; and
    forming a first via connected between one conductive line in the first set of conductive lines and one conductive pattern in the plurality of conductive patterns that is connected to one active area in the plurality of active areas,
    wherein the first via, the one active area in the plurality of active areas, and the one conductive pattern in the plurality of conductive patterns overlap each other in the plan view.

2. The method of claim 1, wherein the two conductive lines are separate from each other in the first direction by a space, without using a mask,
    wherein a first pattern of the plurality of conductive patterns extends through the space and overlap at least two of the plurality of active areas,
    wherein the method further comprises:
        forming a conductive segment in a third layer above the second layer; and
        forming a second via coupled between the conductive segment and the one conductive line in the first set of conductive lines, wherein the conductive segment and the second via overlap the first via, the one active area in the plurality of active areas, and the one conductive pattern in the plurality of conductive patterns in the plan view.

3. The method of claim 2, wherein the first pattern corresponds to terminals of four transistors, coupled with each other, in a transmission gate circuit.

4. The method of claim 1, further comprising:
    forming a pair of power rails extending in the second direction and overlapping with the plurality of conductive patterns; and
    forming a second set of conductive lines extending parallel to the first set of conductive lines and arranged in three second metal tracks between the pair of power rails, wherein one of the second set of conductive lines is arranged in a middle track of the three second metal tracks, coupled to one of the plurality of gates and overlap a second shallow trench region between two of the plurality of active areas.

5. The method of claim 4, wherein a pattern of the plurality of conductive patterns overlaps the first and second shallow trench regions and the pair of power rails.

6. The method of claim 1, wherein a pattern in the plurality of conductive patterns corresponds to terminals of three transistors, coupled with each other, in a transmission gate circuit.

7. The method of claim 1, wherein the plurality of gates are separated from each other in the first direction,
    wherein a pattern in the plurality of conductive patterns is interposed between the plurality of gates and correspond to coupled terminals of two transistors in a transmission gate circuit.

8. The method of claim 7, further comprising:
    forming a conductive segment overlapping the pattern in the plurality of conductive patterns to transmit a control signal to two of the plurality of gates by the one of the first set of conductive lines.

9. A method, comprising:
    forming a plurality of first active areas extending in a first direction;
    forming a plurality of conductive patterns extending in a second direction perpendicular to the first direction in a first layer,
    wherein a first pattern in the plurality of conductive patterns corresponds to first terminals of first and second transistors in a transmission gate circuit, and a second pattern in the plurality of conductive patterns corresponds to second terminals of the first and second transistors;
    forming a first set of conductive lines in a standard cell, wherein the standard cell has only three metal tracks for the first set of conductive lines between a first pair of power rails,
    wherein first and second lines in the first set of conductive lines are arranged in first and second tracks of the three metal tracks and overlap with the plurality of first active areas in a plan view; and forming a first via connected between one conductive line in the first set of conductive lines and the first pattern in the plurality of conductive patterns that is connected to one active area in the plurality of first active areas, wherein the first via, the one active area in the plurality of first active areas, and the first pattern in the plurality of conductive patterns overlap each other in the plan view.

10. The method of claim 9, further comprising:

forming a first gate of the first transistor and a second gate of the second transistor, wherein the first and second lines in the first set of conductive lines are coupled to the first gate and the second gate respectively.

11. The method of claim 9, wherein a third line in the first set of conductive lines is arranged in a third track of the three metal tracks, wherein the third track of the three metal tracks is interposed between the first and second tracks of the three metal tracks.

12. The method of claim 9, further comprising:

forming a second set of conductive lines in the standard cell, wherein the standard cell has only three metal tracks for the second set of conductive lines between a second pair of power rails; and forming a first gate of a third transistor in the transmission gate circuit and a second gate shared by the first transistor and a fourth transistor in the transmission gate circuit, wherein a first line in the second set of conductive lines is coupled to the first gate and overlap a first area of a plurality of second active areas, and a second line in the second set of conductive lines overlaps the second gate and a second area of the plurality of second active areas.

13. The method of claim 12, wherein a third pattern in the plurality of conductive patterns corresponds to the third and fourth transistors and overlaps the plurality of second active areas.

14. The method of claim 9, wherein forming the first set of conductive lines comprises:

forming, in one of the three metal tracks, two conductive lines that are separate from each other, without using a mask.

15. A method, comprising:

forming a plurality of active areas extending in a first direction;

forming a plurality of gates extending in a second direction different from the first direction;

forming a first group of gate vias on the plurality of gates, wherein the first group of gate vias overlap the plurality of active areas;

forming a first pair of power rails extending in the first direction, overlapping the plurality of gates, and separated from each other in the second direction;

forming a first set of conductive lines arranged in three metal tracks between the first pair of power rails; and forming a conductive pattern extending in the second direction and disposed on a corresponding active area in the plurality of active areas; and forming a via coupled between a first conductive line in the first set of conductive lines and the conductive pattern, wherein the via, the first conductive line, the conductive pattern, and the corresponding active area overlap with each other in a plan view.

16. The method of claim 15, further comprising:

forming a plurality of shallow trench isolation regions extending in the first direction and arranged between the plurality of active areas; and forming a second group of gate vias on the plurality of gates, wherein the second group of gate vias overlap the plurality of shallow trench isolation regions.

17. The method of claim 15, further comprising:

forming a second pair of power rails adjacent the first pair of power rails; and forming a second set of conductive lines arranged in three metal tracks between the second pair of power rails, wherein the first and second pairs of power rails are included in different cells in an integrated circuit.

18. The method of claim 17, wherein forming the second set of conductive lines comprises:

forming, in one of the three metal tracks, two conductive lines that are separate from each other, without using a mask.

19. The method of claim 15, wherein forming the first set of conductive lines comprises:

forming, in one of the three metal tracks, two conductive lines that are separate from each other, without using a mask.

20. The method of claim 15, wherein a first gate of the plurality of gates is shared by first and second transistors, wherein the conductive pattern extends from a first active area to and a second active area that are in the plurality of active areas and corresponds to coupled terminals of the first and second transistors.

* * * * *